United States Patent
Uno et al.

(10) Patent No.: US 7,969,021 B2
(45) Date of Patent: Jun. 28, 2011

(54) BONDING WIRE FOR SEMICONDUCTOR DEVICE AND METHOD FOR PRODUCING THE SAME

(75) Inventors: Tomohiro Uno, Futtsu (JP); Shinichi Terashima, Futtsu (JP); Kohei Tatsumi, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 147 days.

(21) Appl. No.: 10/380,749

(22) PCT Filed: Sep. 18, 2001

(86) PCT No.: PCT/JP01/08110
§ 371 (c)(1),
(2), (4) Date: Mar. 17, 2003

(87) PCT Pub. No.: WO02/23618
PCT Pub. Date: Mar. 21, 2002

(65) Prior Publication Data
US 2004/0014266 A1 Jan. 22, 2004

(30) Foreign Application Priority Data

Sep. 18, 2000 (JP) .................................. 2000-281531
Dec. 19, 2000 (JP) .................................. 2000-385337
Apr. 17, 2001 (JP) .................................. 2001-117753

(51) Int. Cl.
*H01L 23/48* (2006.01)
*H01L 23/52* (2006.01)
*H01L 29/40* (2006.01)
*H01B 5/00* (2006.01)
*H01B 5/14* (2006.01)
*H01B 7/29* (2006.01)

(52) U.S. Cl. .......... 257/784; 257/734; 257/782; 174/36; 174/126.1; 174/126.4

(58) Field of Classification Search .................. 438/123, 438/617; 257/784; 174/36, 126.1, 126.4
See application file for complete search history.

(56) References Cited

U.S. PATENT DOCUMENTS
4,439,269 A * 3/1984 Cukauskas ........................ 216/3
(Continued)

FOREIGN PATENT DOCUMENTS
EP 0 523 730 A1 1/1993
(Continued)

OTHER PUBLICATIONS

ULSI Technology, Chang and Sze (eds.), McGraw-Hill, 1996, Singapore, pp. 532-533 and 546-549.

(Continued)

*Primary Examiner* — Angel Roman
(74) *Attorney, Agent, or Firm* — Kenyon & Kenyon LLP

(57) ABSTRACT

A bonding wire for a semiconductor device has a core wire and a periphery comprising a conductive metal mainly composed of an element common to both and/or an alloy or alloys of said metal and, between the core wire and the periphery, a diffusion layer or an intermetallic compound layer composed of the elements constituting the core wire and the periphery and a bonding wire for a semiconductor device characterized by having a core wire comprising a first conductive metal or an alloy mainly composed of the first conductive metal, a periphery comprising a second conductive metal different from the first conductive metal of the core wire or an alloy mainly composed of the second conductive metal, and, between the core wire and the periphery, a diffusion layer or an intermetallic compound layer and a method of producing the same.

35 Claims, 12 Drawing Sheets

U.S. PATENT DOCUMENTS

| | | | | |
|---|---|---|---|---|
| 4,935,594 | A * | 6/1990 | Groos et al. | 219/69.12 |
| 4,968,867 | A * | 11/1990 | Banzai et al. | 219/69.12 |
| 4,990,411 | A * | 2/1991 | Nakayama et al. | 428/614 |
| 5,097,100 | A * | 3/1992 | Jackson | 174/94 R |
| 5,231,270 | A * | 7/1993 | Groos et al. | 219/69.12 |
| 5,232,908 | A * | 8/1993 | Shiga et al. | 505/433 |
| 5,364,706 | A * | 11/1994 | Toyofuku et al. | 428/607 |
| 5,829,128 | A * | 11/1998 | Eldridge et al. | 29/855 |
| 6,103,025 | A * | 8/2000 | Herklotz et al. | 148/430 |
| 6,110,823 | A * | 8/2000 | Eldridge et al. | 438/660 |
| 6,215,196 | B1 * | 4/2001 | Eldridge et al. | 257/784 |
| 6,242,803 | B1 * | 6/2001 | Khandros et al. | 257/750 |
| 6,279,227 | B1 * | 8/2001 | Khandros et al. | 29/885 |
| 6,336,269 | B1 * | 1/2002 | Eldridge et al. | 29/885 |
| 6,515,218 | B1 * | 2/2003 | Shimizu et al. | 136/256 |
| 6,515,373 | B2 * | 2/2003 | Barth | 257/781 |
| 6,525,551 | B1 * | 2/2003 | Beaman et al. | 324/754 |
| 6,610,930 | B1 * | 8/2003 | Seuntjens | 174/94 R |
| 6,727,579 | B1 * | 4/2004 | Eldridge et al. | 257/692 |
| 6,778,406 | B2 * | 8/2004 | Eldridge et al. | 361/776 |
| 6,835,898 | B2 * | 12/2004 | Eldridge et al. | 174/267 |
| 2002/0117330 | A1 * | 8/2002 | Eldridge et al. | 174/260 |
| 2002/0142512 | A1 * | 10/2002 | Ma et al. | 438/100 |

FOREIGN PATENT DOCUMENTS

| | | |
|---|---|---|
| JP | 56-21354 A | 2/1981 |
| JP | 59-155161 A | 9/1984 |
| JP | 61-160958 | 7/1986 |
| JP | 62-097360 | 5/1987 |
| JP | 01-255236 | 10/1989 |
| JP | 1-259541 | 10/1989 |
| JP | 02-52118 | 2/1990 |
| JP | 03-004030 | 2/1991 |
| JP | 3-135040 A | 6/1991 |
| JP | 04-079237 | 3/1992 |
| JP | 4-79246 A | 3/1992 |
| JP | 05-030524 | 5/1993 |
| JP | 6-252196 A | 9/1994 |
| JP | 11-186314 | 7/1999 |

OTHER PUBLICATIONS

Japanese Office Action, dated Dec. 21, 2010, from corresponding Japanese Patent Application No. 2002-527565.

* cited by examiner

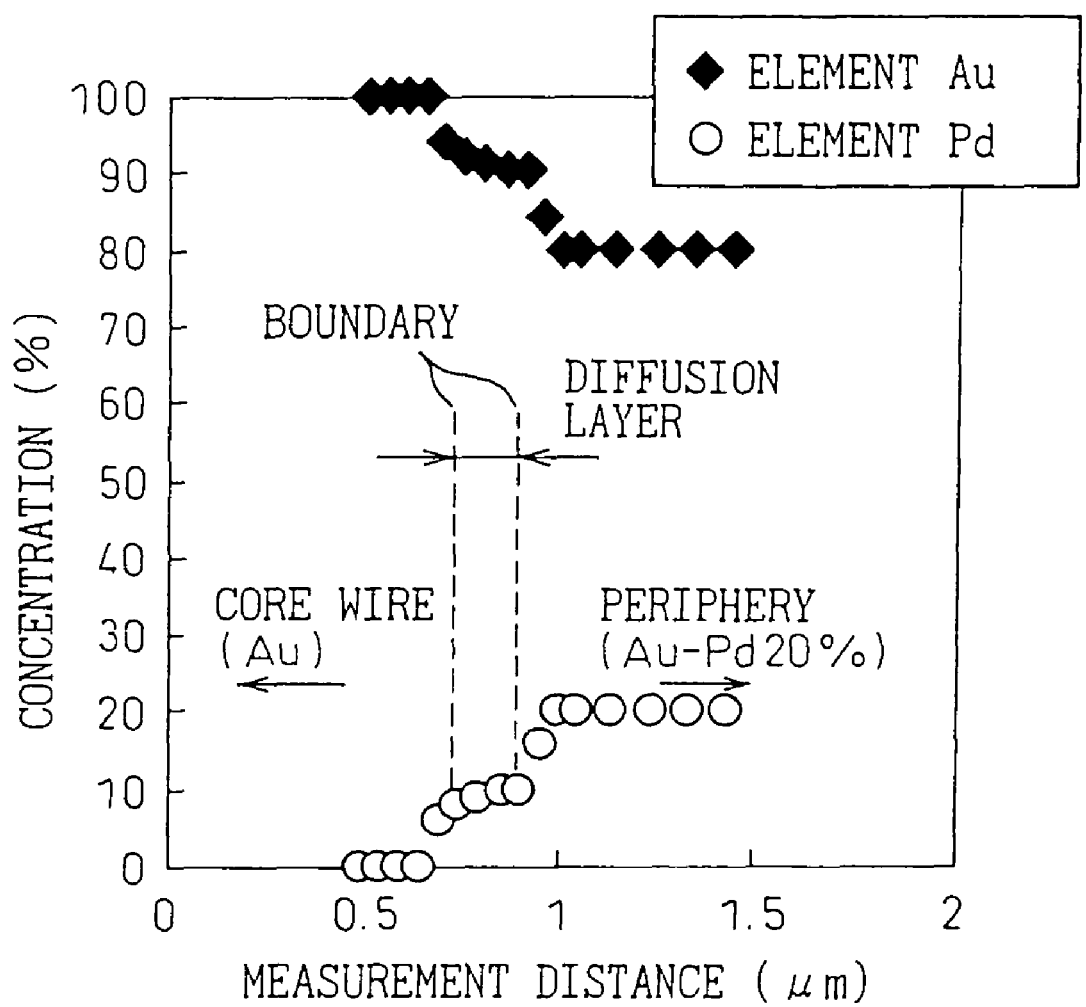

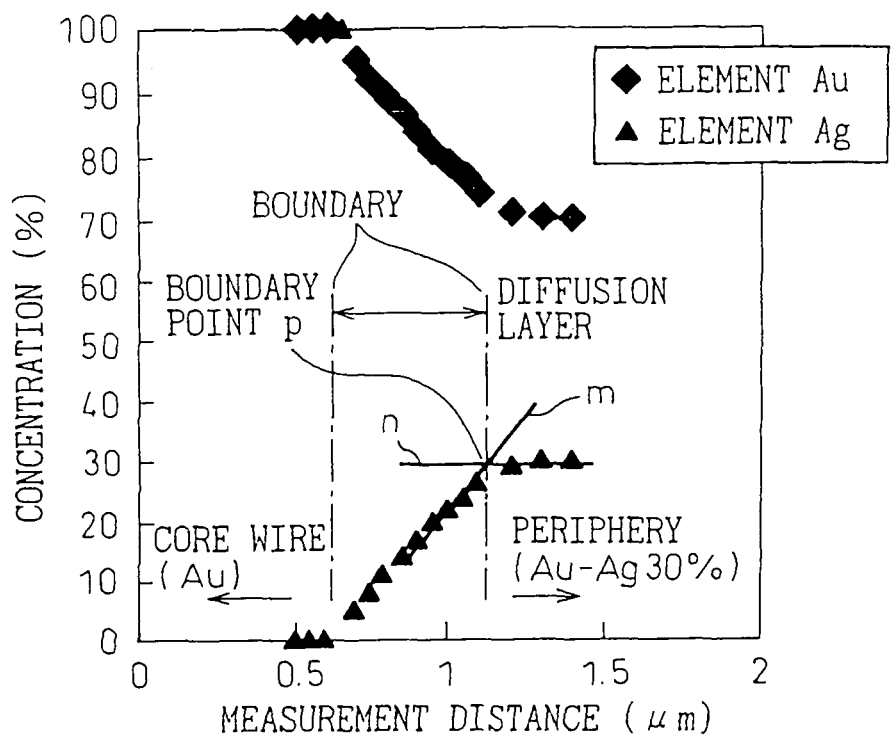
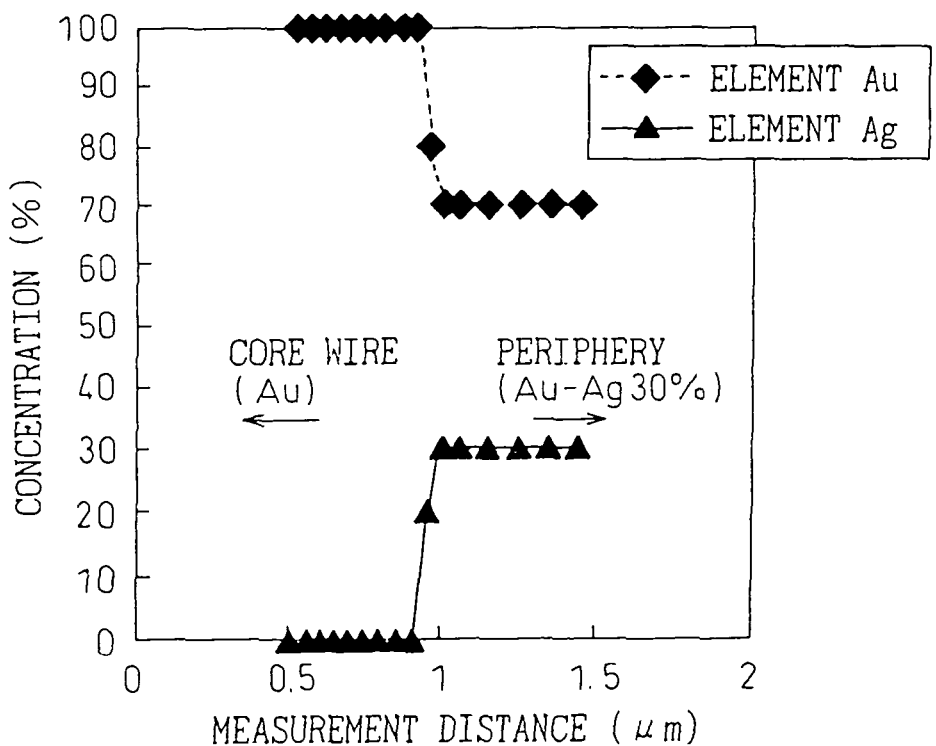

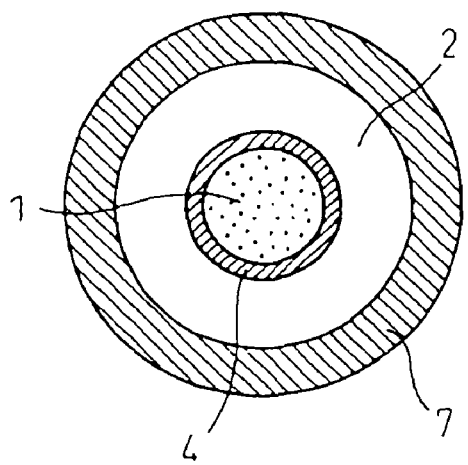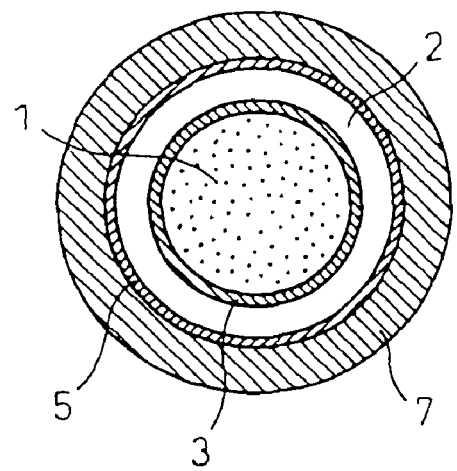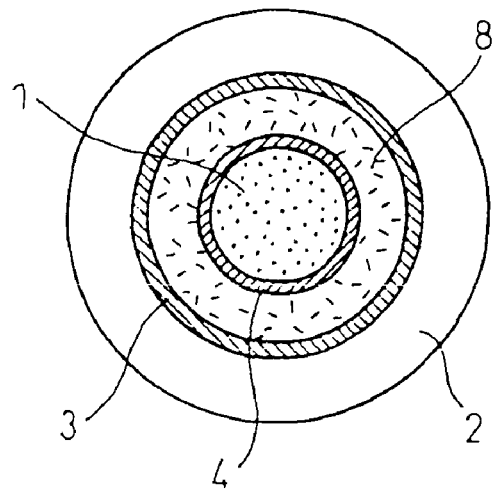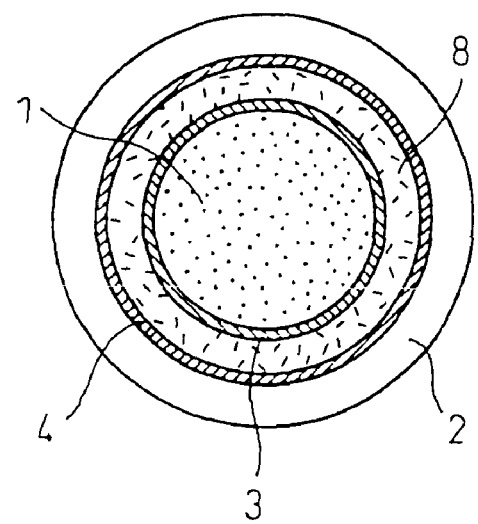

BONDING WIRE FOR SEMICONDUCTOR DEVICE AND METHOD FOR PRODUCING THE SAME

TECHNICAL FIELD

The present invention relates to a bonding wire for a semiconductor device used for connecting a pad of a semiconductor device with an outer lead.

BACKGROUND ART

Presently, a bonding wire 20 to 50 µm or so in diameter and made of gold of a purity of 4N (four nine) (purity >99.99 mass %) is mainly used for connecting a pad of a semiconductor device with an outer lead. The ultrasonic bonding or welding method with thermocompression is generally used for bonding the gold bonding wire, and a general purpose bonding machine and a capillary jig through which the wire is fed for the connection work are required for the method. The leading end of the wire is melted by arc heat input to form a molten metal ball under surface tension and the ball is bonded by compression onto a pad of a semiconductor device heated to a temperature in a range of 150 to 300° C., and then the wire is directly bonded to an outer lead by ultrasonic bonding or welding with compression.

Semiconductor device packaging technologies have rapidly diversified lately in the aspects of structure, materials, pad connections, etc.: for instance, new packaging structures such as the ball grid array (BGA) method and the chip scale packaging (CSP) method, using a substrate and a polyimide tape, etc. have come to be employed in addition to the presently used quad flat packaging (QFP) method using a lead frame. These new packaging methods require a new bonding wire having an enhanced loop property, bondability, and productivity and usability properties. Among various wire connecting methods, in addition to the ball/wedge bonding which is presently the mainstream technology, the wedge/wedge bonding method suitable for narrower pitch bonding requires an improved bondability of the thin wire since the wire is directly bonded at two points.

The materials of the portions to which bonding wires are bonded are also changing. Cu, which is better suited for fine wiring, has come to be used, in addition to conventional Al alloys, for the wiring and pads of a silicon substrate. Besides this, the thickness of a pad film is becoming thinner and thinner, as the wiring becomes denser, which makes damage, such as cracking of the semiconductor substrate immediately beneath the pad film when the ball at the wire en is bonded onto it, a real danger. Further, in pursuit of downscaling and densification of semiconductor devices, a new type of semiconductor device hitherto considered difficult to produce wherein elements are formed beneath the pad films is being developed and, as a result, a reduction in the damage to the semiconductor devices caused by the ball bonding has become more and more important. For copying with these changes in the materials to which the bonding wire is bonded, higher bondability and bonding reliability are required of a bonding wire.

To respond to the higher integration and densification of semiconductor devices, the required connection properties of a gold bonding wire have become more widely varied; the most strongly required being (1) narrower pitch bonding, (2) the use of thinner wires, (3) increased number of pins and longer wires, (4) small ball bonding, (5) less damage to a chip at the bonded portions, etc.

In the resin molding process in which a high viscosity thermosetting epoxy resin is injected onto a semiconductor device at a high speed, for instance, there occurs a problem of a bonding wire deforming to contact an adjacent wire. The prevention of the wire deformation during the resin molding to the greatest possible extent is imperative as the narrower pitch bonding and the use of longer and thinner wires are becoming more widely practiced. Although an increase in wire strength is effective for controlling the wire deformation to some extend, it cannot be practically applied unless problems such as difficulty in loop control and a decrease in the bonding strength are solved.

For coping with these requirements, it is necessary for a bonding wire to satisfy the overall characteristics covering aspects such as the ease of the loop control during the bonding work, good bondability to the pads and leads, the prevention of wire deformation during the resin molding after wire bonding.

The addition of alloy elements has conventionally been the principal measures to increase the strength of the bonding wire. In the case of the gold bonding wire of high purity, which is most commonly used at present, however, the addition of alloy elements is limited to several tens of ppm. With this level of alloy element addition, while excellent loop control and bondability are achieved, sufficiently good results have not been obtained in aspects such as wire deformation and the strength of a heat affected zone (neck portion) at ball formation. High concentration alloy wires containing 1% or so of alloy elements in total have lately come to be used in some IC devices, but the effect to prevent the wires from deforming during the resin molding work is not sufficient and problems such as poor bondability with the leads have not been eliminated.

New bonding wire materials to substitute for gold have also been examined. However, with a copper wire, for example, it is difficult to obtain satisfactory results in increasing the wire strength and softening the ball portion and, for this reason, copper is not used for common LSIs. It is true that aluminum wires are used for the wedge/wedge bonding for ceramics packaging uses but aluminum cannot be used for general applications either, owing to problems such as surface corrosion after the resin molding, poor bondability when alloy elements are added in high concentrations, and so forth.

There have been proposals of bonding wires, the core wire and the periphery of which are composed of different metals (such a wire being hereinafter referred to as a "double layer bonding wire"), as a measure to increase the strength of the bonding wire. Japanese Unexamined Patent Publication No. S56-21354, for example, discloses a bonding wire wherein a core wire of Ag is coated with Au, Japanese Unexamined Patent Publication No. S59-155161 discloses another bonding wire having a core wire of a conductive metal and plated with Au on the surface, and Japanese Unexamined Patent Publication No. H4-79246 discloses another bonding wire having a core wire of Pt/Pt alloy and a periphery of Ag/Ag alloy. Additionally, as an example of a case of using materials containing the same elements in different concentrations for the two layers, Japanese Unexamined Patent Publication No. H6-252196 discloses a bonding wire having a core of an Au alloy containing Ca, Be, etc. and a periphery of another Au alloy containing the same alloy elements in lower concentrations. These bonding wires are expected to satisfy, in an overall manner, the properties suitable for any general purpose devices, which is difficult for a bonding wire consisting of a single material (hereinafter referred to as a "single layer bonding wire"), through the combination of different metals for the core wire and the periphery. Further, Japanese Unexamined Patent Publication No. H3-135040 discloses yet another bonding wire the surface of which is coated with an alloy element or a high concentration alloy and wherein the concentration of the alloy element is gradually and continuously changed from the periphery towards the center.

When the amount of an alloy element is increased for enhancing the strength of a conventional single layer bonding wire, bondability is deteriorated owing to factors such as the surface oxidation of the ball, the occurrence of defects such as cavity, or its wedge bondability is adversely affected by the hardening, oxidation, etc. of the wire surface, and these problems end up with a poor product yield of the final product. Besides, since electric resistance tends to rise with an increase in an alloy element, an excessive increase in electric resistance may cause apparent signal delay, especially in the case of an IC for high frequency use.

As a measure to solve the problems the single layer bonding wires cannot cope with, various combinations of materials have been proposed in relation to multi-layer bonding wires such as the double layer bonding wire composed of different materials in the core wire and the periphery. The double layer bonding wire, however, has not been brought to actual use and therefore few reports have so far been presented on the evaluation of its use in actual semiconductor devices. This is due to various difficulties. For example, the structure of the proposed double layer bonding wires to use different materials for the core wire and periphery requires very complicated production and quality control technologies to obtain a prescribed material ratio between the core wire and periphery in mass production. While a double layer bonding wire may be excellent in certain property aspects, the adhesion between its core wire and periphery tends to be poor, and thus it is difficult for the bonding wire to satisfy wide-ranged property requirements in an all-round manner.

The inventors of the present invention studied the characteristics of the double layer bonding wires and confirmed that there were various problems to be solved such as the poor adhesion between the core wire and the periphery, production and quality control technologies for securing a prescribed material ratio between the core wire and periphery, and the like.

In the case of double layer bonding wires so far proposed in which the core wire and periphery are composed mainly of different metals, problems caused by poor interface adhesion are often seen, since the different materials are simply in contact with each other. Although the adhesion is improved to some extent by wire drawing or similar work, it is difficult to obtain sufficiently strong adhesion only by working. Because different metal materials having different mechanical properties are drawn at the same time during the wire drawing work, unless the adhesion at the interface is good, there will be problems that the area ratio of the core wire and the periphery becomes longitudinally uneven during manufacturing and it becomes difficult to obtain prescribed product properties and that interface separation and cracking may occur during high speed drawing. Problems related to the interface separation of the double layer bonding wires will also occur during use when they are bent in complicated curves at a high speed and undergo heavy plastic deformation at the bonding.

Because different metal materials having different mechanical properties are drawn at the same time during the wire drawing work, it is difficult to obtain prescribed product properties as the area ratio of the core wire and periphery changes during manufacturing.

A double layer bonding wire can be manufactured by producing an ingot or a thick wire having a two-layer structure and drawing it into a final product diameter, or by forming a surface layer by plating, vapor deposition, or a similar method on the surface of a single layer wire drawn to near a final diameter. All of the methods, however, have problems related to manufacturing. In the former method it is difficult to obtain stable mechanical properties because of problems such as poor adhesion at the interface between the core wire and the periphery and the change in the area ratio of the core wire and the periphery from the initial ratio as a result of the wire drawing work in which different metal materials having different mechanical properties are drawn at the same time. The latter method also has problems such as insufficient interface adhesion between the core wire and the periphery and difficulty in obtaining a smooth wire surface, because the surface layer is formed at the final manufacturing stage.

Besides, while it is possible to increase the wire strength by the use of different materials composed mainly of different metals for the core wire and the periphery, this brings about a problem of bondability of the ball. More specifically, the materials of the core wire and periphery are mixed in the ball portion formed by melting the wire, forming a material containing alloy elements in high concentrations, which in turn makes the ball prone to hardening, surface oxidation, cavity, etc., causing problems such as the deterioration of bonding strength, cracks and other damage to the semiconductor substrate immediately beneath the portion where the ball is bonded. In the case that the core wire and periphery are mainly composed of different metals, for instance, the total content of the alloy elements in the molten ball often becomes as high as several percent to several tens of percent. In view of the above, it is important, in the actual use of a double layer bonding wire, to secure the bonding strength of the ball bonding and reduce the damage to the semiconductor substrate.

The problems related to the interface adhesion are likely to occur in the case of a double layer bonding wire in which the core wire and periphery are mainly composed of a metal common to both, as well as in the case of the core wire and periphery being mainly composed of different metals. Thus, the problems such as low productivity, interface separation at bending deformation and bonding, uneven wire properties, etc. remain. Although the use of the same metal as the main element can reduce the problems such as the damage to the semiconductor substrate at ball bonding seen in the case of the different metals, it is still difficult, by the same measure, to improve the strength and other mechanical properties to surpass those of the single layer bonding wire presently used, in spite of the double layer structure. For instance, the strength and elastic modulus of the wire, which are governed by the mixing rule determined by the sectional area ratio of the core wire and the periphery, will be influenced by the properties of the core wire and the periphery, which have similar properties owing to their being mainly composed of the common metal, and it is difficult for the strength and elastic modulus to surpass those of the core wire and periphery. Namely, in view of the fact that the strength and elastic modulus of a wire are often governed by the mixing rule determined by the sectional area ratio of the core wire and the periphery, it is difficult for either of them to surpass the material properties of either of the core wire and the periphery, whichever has the better strength or elastic modulus.

However, if an element or elements is/are added to the materials of the core wire and the periphery in a high concentration(s) for the purpose of increasing the strength, the problem of poor bondability of the ball and wedge occurs, as in the case of the single layer bonding wire. In order to cope with the narrower pitch bonding and the use of thinner and longer wires in the future, it is necessary to suppress the collapse of the loops and the deformation of the wires during resin molding. This, in turn, requires an improvement in the mechanical properties of the wire further to those of the double layer bonding wire so far proposed. The present inventors have confirmed that, among the mechanical properties to be improved, what has to be improved, to significantly reduce the wire deformation during the resin molding, is flexural rigidity.

In the case of a bonding wire the surface of which is coated with an alloy element or a high concentration alloy and in which the concentration of the alloy element is gradually and continuously changed from the periphery towards the center, it is difficult to achieve the same level of properties as the presently used single layer bonding wire, even when the former bonding wire is used together with a latest bonding apparatus and under the latest loop formation and bonding conditions. Even when the concentration of an alloy element is changed continuously near the surface of the wire, the loop shape may still become uneven and the linearity of the wire remain poor, because the measure is not enough for the wire to properly withstand the severe loop formation and friction with the inner wall of a capillary jig. In the above case, the thickness of the surface coating layer is several thousand Å or so, and the concentrations of the alloy elements change there. As a consequence, insufficient bonding strength often results from a significant deformation of the wire during the wedge bonding to the plated portion of a lead or a resin substrate and the existence of the thin coating layer at the connection interface between the wire and the plated portion. The layer having uneven element concentrations at the connection interface may also bring about inhomogeneous diffusion behavior at the connection interface. This may adversely affect the long-term reliability of the bonding.

From the above and also for coping with future packaging technologies of semiconductor devices, what is required of the material development of a bonding wire is not only to satisfy certain specific required characteristics but to improve the overall characteristics. Since this cannot be achieved only by means of composition design of the presently used single layer bonding wire, material selection of a double layer bonding wire or simply introducing a double layer structure, a bonding wire excellent in the loop controllability, having high strength and improved bondability and bonding strength, is required.

The object of the present invention is to provide a bonding wire for a semiconductor device having altogether: high strength and high flexural rigidity conforming to the narrower pitch bonding and the use of thinner and longer wires, excellent ball and wedge bondability, and excellent industrial mass-producibility and usability in high speed bonding; which have been the three requirements hardly satisfied by a conventional single or double layer bonding wire at the same time.

DISCLOSURE OF THE INVENTION

The gist of the present invention to achieve the aforementioned object is as follows:

(1) A bonding wire for a semiconductor device characterized by having a periphery comprising a conductive metal, a core wire comprising an alloy mainly composed of said metal and a diffusion layer between the core wire and the periphery.

(2) A bonding wire for a semiconductor device characterized by having a core wire comprising a conductive metal, a periphery comprising an alloy mainly composed of said metal and a diffusion layer between the core wire and the periphery.

(3) A bonding wire for a semiconductor device characterized by having: a core wire and a periphery comprising different alloys mainly composed of a conductive metal common to both, each of which alloys containing at least an alloy element not contained in the other and/or at least one of the alloy elements in a different concentration from the other; and a diffusion layer and/or an intermetallic compound layer between the core wire and the periphery.

(4) A bonding wire for a semiconductor device according to the item (2) or (3) characterized by having, on the outer surface of the periphery, an outermost surface layer comprising the same metal as the main element of the core wire and the periphery.

(5) A bonding wire for a semiconductor device according to the item (2) or (3) characterized by having: on the outer surface of the periphery, an outermost surface layer comprising the same metal as the main element of the core wire and the periphery; and a diffusion layer between the periphery and the outermost surface layer.

(6) A bonding wire for a semiconductor device according to any one of the items (1) to (3) characterized by having: on the outer surface of the periphery, an outermost surface layer comprising a metal different from the main element of the core wire or the periphery and less susceptible to oxidation than the main element of the periphery; and a diffusion layer and/or an intermetallic compound layer between the periphery and the outermost surface layer.

(7) A bonding wire for a semiconductor device characterized by having: a core wire comprising a first conductive metal or an alloy mainly composed of the first conductive metal; a periphery comprising a second conductive metal different from the first conductive metal of the core wire or an alloy mainly composed of the second conductive metal; and, between the core wire and the periphery, a diffusion layer.

(8) A bonding wire for a semiconductor device characterized by having: a core wire comprising a first conductive metal or an alloy mainly composed of the first conductive metal; a periphery comprising a second conductive metal different from the first conductive metal of the core wire or an alloy mainly composed of the second conductive metal; and, between the core wire and the periphery, at least one intermetallic compound layer.

(9) A bonding wire for a semiconductor device characterized by having: a core wire comprising a first conductive metal or an alloy mainly composed of the first conductive metal; a periphery comprising a second conductive metal different from the first conductive metal of the core wire or an alloy mainly composed of the second conductive metal; and, between the core wire and the periphery, a diffusion layer and an intermetallic compound layer.

(10) A bonding wire for a semiconductor device characterized by having: a core wire comprising a first conductive metal or an alloy mainly composed of the first conductive metal; a middle layer comprising a second conductive metal different from the first conductive metal of the core wire or an alloy mainly composed of the second conductive metal; a periphery comprising another conductive metal different from the second conductive metal of the middle layer or an alloy of said conductive metal; and, between the core wire and the middle layer and/or between the middle layer and the periphery, a diffusion layer and/or an intermetallic compound layer.

(11) A bonding wire for semiconductor device according to any one of the items (7) to (10) characterized by having, on the outer surface of the periphery, an outermost surface layer comprising a conductive metal different from the main component metal of the periphery or an alloy mainly composed of said metal.

(12) A method to produce a bonding wire for a semiconductor device according to any one of the items (1) to (11) characterized by subjecting the bonding wire to a diffusion heat treatment to form the diffusion layer and/or the intermetallic compound layer at the interface between the core wire and the periphery.

(13) A method to produce a bonding wire for a semiconductor device according to any one of the items (1) to (11) characterized by subjecting the bonding wire to a diffusion heat treatment to form the diffusion layer and/or the intermetallic compound layer at the interface between the core wire and the periphery and then drawing the bonding wire.

BRIEF DESCRIPTION OF THE DRAWINGS

FIG. 3 is a graph showing the result of sectional line scanning using an Auger spectroscope of a composite bonding wire having a core wire of Au and a periphery of an Au-20% Pd alloy, corresponding to the wire sample having a diffusion layer shown in FIG. 2(a).

FIG. 4(a) is a graph showing the result of sectional line scanning, using an Auger spectroscope, of a composite bonding wire having a core wire of Au and a periphery of an Au-30% Ag alloy.

FIG. 4(b) is a graph showing the result of sectional line scanning, using an Auger spectroscope, of a composite bonding wire sample having a core wire of Au and a periphery of an Au-30% Ag alloy without the diffusion layer shown in FIG. 2(b).

FIG. 6(a) shows a schematic illustration of a section of a bonding wire having a core wire 1, an intermetallic compound layer 4 and a periphery 2 and, on the outer surface of the periphery, an outermost surface common metal layer 7 composed of the same metal as the solvent element of the core wire and the periphery.

FIG. 6(b) shows a schematic illustration of a section of a bonding wire having a core wire 1, a diffusion layer 3, a periphery 2 and an intermediate layer 5 and, on the outer surface of the periphery, an outermost surface common metal layer 7 consisting the same metal as the solvent element of the core wire and the periphery.

FIG. 7(a) shows a schematic illustration of a section of an intermediate-layered composite bonding wire having three-layer structure comprising a core wire 1, an intermetallic compound layer 4, a middle layer 8, a diffusion layer 3 and a periphery 2.

FIG. 7(b) shows a schematic illustration of a section of an intermediate-layered composite bonding wire having three-layer structure comprising a core wire 1, a diffusion layer 3, a middle layer 8, an intermetallic compound layer 4 and a periphery 2.

BEST MODE FOR CARRYING OUT THE INVENTION

The structure of a bonding wire according to the present invention is explained hereafter in more detail. Note that all of the percentage figures appearing hereinafter mean mol %, unless otherwise specified.

The present inventors discovered that the following two kinds of bonding wires were effective for achieving, in an all-round manner, the mutually conflicting targets such as high strength, high bondability and high productivity. One is a bonding wire (hereinafter referred to as "intermediate-layered composite bonding wire") comprising a core wire and a periphery, each comprising a metal or an alloy composed mainly of a common element, and having, between the core wire and the periphery, a diffusion layer or an intermetallic compound layer (hereinafter collectively referred to as "intermediate layer") being composed of the elements forming the core wire and the periphery, as described in the items (1) to (6) of the present invention. The other is a bonding wire (hereinafter also referred to as "intermediate-layered composite bonding wire") comprising: a core wire comprising a first conductive metal or an alloy mainly composed of the first conductive metal; a periphery comprising a second conductive metal different from the first conductive metal of the core wire or an alloy mainly composed of the second conductive metal; and, between the core wire and the periphery, a diffusion layer or an intermetallic compound layer (hereinafter collectively referred to as "intermediate layer"), either of them comprising at least one element contained in each of the core wire and the periphery, as described in the items (7) to (11) of the present invention. The advantage of an intermediate-layered composite bonding wire is that the adhesion at the interface of the core wire and the periphery as well as the mechanical properties of the wire can be markedly enhanced.

Here, the substances in the core wire and the periphery deeply involved in the formation of a diffusion layer or an intermetallic compound layer can be classified into metals and alloys. The main constituent element responsible for the highest composition ratio of an alloy is herein called the solvent element, and the element or elements which is/are added to form the alloy is/are called the solute element(s). Thus, in an intermediate-layered composite bonding wire according to the items (1) to (6) of the present invention, the core wire and the periphery have a common solvent element, and, in an intermediate-layered composite bonding wire according to the items (7) to (11) of the present invention, the core wire and the periphery have different solvent elements.

Figure 1A:
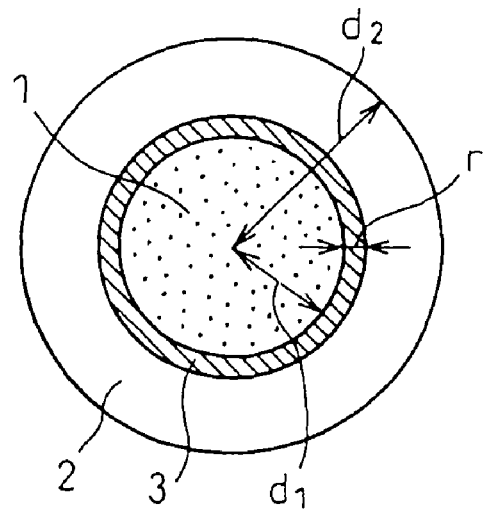
FIG. 1(a) shows a schematic illustration of a wire section according to the intermediate-layered composite bonding wire of the present invention comprising a core wire 1, a diffusion layer 3 and a periphery 2.

A diffusion layer is a zone where the atoms of the elements composing a core wire and those composing a periphery are mixed as a result of mutual diffusion in which they move in directions opposite to each other, and the elements are in the state of solid solution. FIG. 1(a) schematically shows a section of the bonding wire in which a diffusion layer 3 is formed at the interface between the core wire 1 and the periphery 2. The concentrations of the elements contained in the diffusion layer are basically different from their respective concentrations in the core wire and the periphery. For this reason, the boundary of the diffusion layer can be recognized as an interface where the element concentrations change discontinuously.

It is necessary that a periphery should be made of a metal or an alloy forming a layer throughout which the solute element(s) is/are evenly distributed without concentration gradient. This is because homogeneous concentrations of elements in the surface region of a wire brings about stable diffusion at a wedge bonding interface, and thus a good bondability is maintained. The above effect is obtained by securing 0.5 µm or more of the homogeneous portions in both the core wire and periphery. It is more preferable if a core wire is also made of a metal or a homogenized alloy. This not only makes the formation of the intermediate layer between the core wire and the periphery stable and reproducible, but also stabilizes the productivity and wire property during the wire drawing work and enhances the loop shape and bondability of the product.

Different types of intermediate layers can be formed at the core wire/periphery interface by changing the material combination of the core wire and the periphery: more specifically, in the case of a bonding wire according to the items (1) to (6) of the present invention, a diffusion layer can be formed when the material combination of the core wire and periphery is metal/alloy, and a diffusion layer and/or an intermetallic compound layer when the material combination is alloy/alloy. These cases are individually explained hereafter.

First, when a core wire/periphery material combination is metal/alloy, a diffusion layer with at least one solute element contained in a solvent element can be formed. It is preferable that the average concentration (%) of the solute element(s) in the diffusion layer is $1/10$ of the same (%) in the alloy or higher. This is because an effect to enhance adhesion strength at the diffusion layer/core wire interface as well as the diffusion layer/periphery interface can be obtained by making the concentration of the solute element(s) in the diffusion layer equal to $1/10$ of the same in the alloy or higher.

Then, when a core wire/periphery material combination is alloy/alloy, besides the diffusion layer containing at least one solute element in a solvent element, a diffusion layer composed mainly of a solute element or solute elements is also formed, and both are effective for enhancing the mechanical properties of the wire. In the former diffusion layer being composed mainly of a solvent element, the same construction and effects as the diffusion layer formed in the case of the metal/alloy combination can be obtained. In the case of the latter diffusion layer composed mainly of the solute element(s), it is preferable that it contains two or more solute elements and that the total concentration of the solute elements is 60% or higher, because this enhances the elastic modulus of the wire and, consequently, its linearity during the loop formation.

The diffusion layers formed in the bonding wires according to the items (7) to (11) of the present invention can be classified into the following three types by whether their component elements are solvent elements or solute elements: one being composed of the solvent element of the core wire and that of the periphery; another being composed of a solvent element and a solute element or solute elements; and a third one being composed of two or more solute elements only. Any of them have nearly the same effects.

The component elements of these diffusion layers are different depending on the material combination of the core wire and periphery. The diffusion layer formed when the material combination of a core wire and a periphery is metal/metal (first metal/second metal) contains only the solvent elements (the first metal and the second metal). When the material combination is metal/alloy (first metal/alloy of second metal, second metal/alloy of first metal), in contrast, both a diffusion layer mainly being composed of the solvent elements (the first metal and the solvent element of the second metal alloy, the second metal and the solvent element of the first metal alloy) and another diffusion layer being composed of the solute element(s) in the alloy (the solute element(s) of the second metal alloy, or the solute element(s) of the first metal alloy) and the solvent element in the other material (the first metal or the solvent element of the second metal alloy) may be formed.

When the material combination is alloy/alloy (alloy of first metal/alloy of second metal), a diffusion layer being composed mainly of two different solute elements (the solute element of the first metal alloy and the solute element of the first metal alloy) can be formed, in addition to a diffusion layer being composed mainly of the solvent elements of both the alloys (the solvent element of the first metal alloy and the solvent element of the second metal alloy) and another diffusion layer being composed of the solute elements(s) (the solute elements(s) of the first metal alloy, or the solute elements(s) of the second metal alloy) and a solvent element in the other material (the solvent element of the second metal alloy, or the solvent element of the first metal alloy). In any of these cases, what is formed most often is the diffusion layer being composed mainly of two solvent elements. It is possible, however, to promote the formation of the diffusion layer containing solute elements by adding to the wire materials a solute element or solute elements to diffuse quicker than the solvent element(s).

It is necessary that a diffusion layer being composed mainly of solvent elements should contain at least 1% or more of either of the two solvent elements, since the effect to enhance the adhesion strength of the diffusion layer/core wire interface as well as the diffusion layer/periphery interface can be obtained when the diffusion layer contains 1% or more of the element. If the concentration is 3% or more, this is better still, as this secures good loop controllability even if the friction of the wire with the inner wall of a capillary jig increases during loop formation. If the diffusion layer is composed mainly of a solvent element and contains some solute elements, it reinforces the effects to enhance the hardness and other properties of the diffusion layer and suppress the wire deformation during resin molding. It is preferable that the concentration of the solute elements is 0.5% or higher because the solid solution hardening effect of the solute elements shows when the concentration is 0.5% or higher.

In a diffusion layer being composed of a solvent element of one of the core wire or the periphery and the solute element(s) of the other, good interface adhesion and flexural rigidity are realized when the diffusion layer contains 2% or more of the solute element(s). In the case of a diffusion layer being composed mainly of two different solute elements, it is necessary that the concentration of at least one of the solute elements should be 3% or higher, because the interface adhesion is enhanced by the diffusion layer containing 3% or more of the solute element, and the deformation resistance of the wire is enhanced by thus making the strength of the diffusion layer greater than that of the core wire or the periphery where the solute element comes from.

Note that, in a bonding wire according to the present invention, the concentrations of the elements in the diffusion layer need not be even, and existence of a concentration gradient does not constitute any problem. The concentration gradient can further enhance the adhesion of the diffusion layer/core wire interface as well as the diffusion layer/periphery interface, makes the production easier and raises the productivity of the wire. When there is a concentration gradient, it is enough for obtaining sufficient effects if the concentrations of the elements in the entire diffusion layer satisfy the relationships of the concentrations specified before as an average. If the relationships of the concentrations specified before are satisfied in the portion where the concentration of the element in question is the lowest, it is better still, as the interface adhesion is increased more than when the concentrations are homogeneous and thus the interface separation is suppressed better even when the wire undergoes plastic deformation.

Figure 1B:
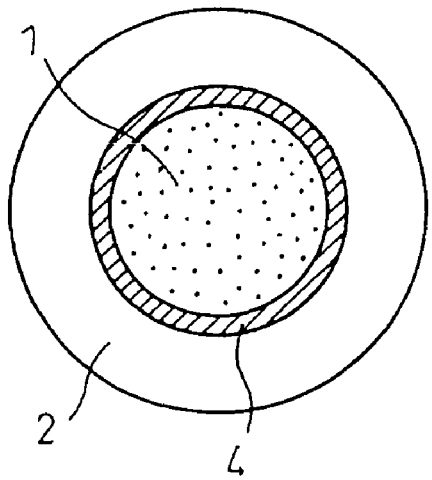
FIG. 1(b) shows a schematic illustration of a wire section according to the intermediate-layered composite bonding wire of the present invention comprising a core wire 1, an intermetallic compound layer 4 and a periphery 2.

FIG. 1(b) schematically shows a section of the bonding wire in which an intermetallic compound layer 4 is formed at the interface between the core wire 1 and the periphery 2. The intermetallic compound here is characterized by having a crystal structure, a lattice constant and a composition different from those of the core wire and the periphery. That is, in a bonding wire according to the items (3) to (6) of the present invention, if both the core wire and the periphery consist of alloys, an intermetallic compound layer can be formed between them, even though both the core wire and the periphery are composed mainly of a common element. If the intermetallic compound layer formed at the interface between the core wire and the periphery is composed of an intermetallic compound comprise at least one solute element of each of the core wire and the periphery, the effects to enhance the interface adhesion and the mechanical properties of the wire can be obtained.

In the case of a bonding wire according to the items (8) to (11) of the present invention, the intermetallic compound layer formed at the interface between the core wire and the periphery is composed mainly of an intermetallic compound of the two solvent elements (first metal and second metal, or the solvent element of the first metal alloy and the solvent element of the second metal alloy) of the core wire and the periphery, and this intermetallic compound layer has the effects to enhance the interface adhesion and the mechanical properties of the wire. Otherwise, when at least one of the core wire and the periphery consists of an alloy containing one solute element or more, an intermetallic compound being composed of the solute element(s) (for example, the solute element(s) of the first metal alloy) and the solvent element (for example, the solvent element of the second metal alloy) of the core wire or the periphery not containing the solute element(s), or another intermetallic compound being composed of plural solute elements (the solute element(s) of the first metal alloy and the solute element(s) of the second metal alloy) may be formed, and in these cases, nearly the same effects are also brought about. In a bonding wire according to the present invention, the number of elements to form the intermetallic compounds is two (compounds of a binary system) in most cases, but equally good effects are also obtained when they are composed of three or more elements (compounds of a ternary system or quaternary system, etc.) including a solute element or solute elements. The kind of the intermetallic compound and the number of its layer are not necessarily one: it is also possible to form two or more different kinds of intermetallic compounds in layers and take advantage of synergistic effects of the characteristics of the plural phases.

In a bonding wire of the present invention, it is also effective to make a solute element or solute elements contained in a core wire or a periphery concentrate near the intermediate layer, namely the diffusion layer or the intermetallic compound layer. This is achieved by adding to the material of a core wire or a periphery, beforehand, a solute element or solute elements insoluble to the intermediate layer to be formed at the interface, and by having the element(s) exude near the intermediate layer/core wire boundary or the intermediate layer/periphery boundary during the process of the formation of the intermediate layer. The wire strength can be enhanced locally by forming the condensation zones, and the effect to increase the flexural rigidity can be more enhanced than the case that the solute element(s) is/are evenly distributed. For the above effect to show, it is desirable that the concentration(s) of the solute element(s) at the condensation zones is/are higher than its/their concentration(s) in the original materials by 5% or more.

Next, property enhancement effects the formation of a diffusion layer and an intermetallic compound layer brings about and the thickness of the layers are described in more detail hereafter.

As, in the present invention, a diffusion layer or an intermetallic compound layer formed at the interface enhances the adhesion strength of the core wire/periphery interface, the problems seen with ordinary double layer bonding wires such as the interface separation during wire production, poor loop control and interface separation during the bonding work, etc. can be reduced. In other words, the present invention realizes the adhesion strong enough to prevent the separation at the core wire/periphery interface even under a significant bending deformation.

During resin molding work, bonding wires are deformed under the bending moment imposed on the entire wires by the rapid flow of high viscosity epoxy resin (such wire deformation is called the resin deformation of wires). The enhancement of the flexural rigidity of a wire is very effective for suppressing the resin deformation of wires.

An intermediate-layered composite bonding wire can enhance the mechanical properties such as tensile strength, yield strength, elastic modulus, flexural rigidity, etc., and the effects to suppress its deformation during resin molding can be significantly increased especially by greatly increasing the flexural rigidity. In other words, the flexural rigidity of an intermediate-layered composite bonding wire can not only be raised more than that of a conventional single layer bonding wire but also significantly more than that of an ordinary double layer bonding wire, thanks to the formation of the diffusion layer or the intermetallic compound layer having higher strength and rigidity than the core wire or the periphery at their interface and being of a three-or-more-layered structure including an intermediate layer at the wire section. Thus, an intermediate-layered composite bonding wire can cope with the narrower pitch bonding and the use of thinner wires, which are difficult for a single layer bonding wire to cope with.

Another significant advantage of an intermediate-layered composite bonding wire is that its ball formability and bonding strength can be enhanced, besides the increase in the wire strength and flexural rigidity. In the case of a conventional single layer bonding wire, if an alloy element is added in a large concentration for enhancing strength, problems such as cavity caused by oxidation during the ball formation, consequent poor bonding strength, the deterioration of wedge bondability resulting from the increased strength, etc. can be expected. With an intermediate-layered composite bonding wire, in contrast, it is possible to realize, at the same time, high strength and good bondability, hitherto considered contradictory to each other, by using a high strength material for the core wire and a highly bondable material for the periphery and forming the intermediate layer at their interface and to suppress the oxidation and hardening of the ball by controlling the area ratio of the core wire and the periphery so that the concentration of the alloy elements in the molten ball may be kept low. It is true that, with a conventionally proposed double layer bonding wire comprising a core wire and a periphery, the above effects can be realized better than a single layer bonding wire to some extent, but it is difficult to fully satisfy all the requirements. Compared with an ordinary double layer bonding wire, remarkable property enhancement effects can be brought about by the use of an intermediate-layered composite bonding wire. The advantages are that the wire deformation during the resin molding is reduced by a large increase in the modulus of rigidity, that the interface separation during the wedge bonding is suppressed and that the strength of the ball neck portion, which is softened by the heat of the ball formation, can be increased. It has to be noted especially that, the thinner the wire, the more significant these effects become, and thus an intermediate-layered composite bonding wire is very advantageous in the bonding work of a chip having pads at a pitch of 50 μm or less, the use of ultra thin wires 20 μm or less, or even 18 μm or less, in diameter, and so forth.

In order to fully enjoy the advantages of these improvements, it is necessary to thoroughly examine the influence of the flexural rigidity governing the wire deformation during the resin molding and the structure of an intermediate-layered composite bonding wire to enhance the flexural rigidity. These aspects are described hereafter in detail.

While the present inventors confirmed the effects of the flexural rigidity to suppress the wire deformation during resin molding through experiments, they also discovered that the influence could be sufficiently understood through deformation analyses. If, for simplicity's sake, a wire is a cantilever beam fixed at an end, for instance, and its deformation is studied under a distributed load q along its total length L, the maximum bend Ymax under the condition is given by the following equation, where E is the elastic modulus and I the geometrical moment of inertia:

$$Y\max = qL^4/(8EI) \quad (1).$$

In the case of a wire comprising a core wire (In), an intermediate layer (Mid) and a periphery (out), the product EI of the elastic modulus multiplied by the geometrical moment of inertia in equation (1) can be approximated through the following equation using elastic moduli $E_{In}$, $E_{Mid}$, and $E_{Out}$ and geometrical moments of inertia $I_{In}$, $I_{Mid}$ and $I_{Out}$ of the materials of the core wire, intermediate layer and periphery, respectively:

$$EI_Z = E_{In}I_{In} + E_{Mid}I_{Mid} + E_{Out}I_{Out} \quad (2).$$

The geometrical moments of inertia $I_{In}$, $I_{Mid}$ and $I_{Out}$, respectively, of the materials of the core wire, intermediate layer and periphery can be expressed as follows using the diameter of the core wire $d_1$, wire diameter $d_2$ and the thickness r of the intermediate layer:

$$I_{In} = \pi \cdot d_1^4/64 \quad (3)$$

$$I_{Mid} = \pi((d_1+r)^4 - d_1^4)/64 \quad (4)$$

$$I_{Out} = \pi(d_2^4 - (d_1+r)^4)/64 \quad (5).$$

It was made clear from equation (1) that the wire deformation Ymax could be decreased by increasing the product EI of the elastic modulus multiplied by the geometrical moment of inertia. In comparison with the case of an ordinary double layer bonding wire without the intermediate layer, the term $E_{Mid}I_{Mid}$ of equation (2) is newly included in the case of an intermediate-layered composite bonding wire. Thus it follows that, for enhancing the effect to increase the geometrical moment of inertia, a better effect is obtained by the use of a material with a high elastic modulus $E_{Mid}$ for the intermediate layer or by increasing its thickness.

Further, comparing equations (3) to (5), it is made clear that it is advantageous for increasing the flexural rigidity to form an intermediate layer between a core wire and a periphery consisting of a common metal. For instance, since the diffusion layer is usually formed on the low concentration side as a result of the solute element(s) in the core wire or periphery diffusing from the high concentration side to the low concentration side, the thickness r of the intermediate layer of equation (4) grows mainly on the low concentration side, making the thickness of the material having a lower elastic modulus on the low concentration side decrease as a consequence. Thus, the elastic modulus of the whole wire is increased, as the thickness of the material of the low concentration side having the lower elastic modulus is decreased and a corresponding amount of the intermediate layer having a higher elastic modulus is formed. For these reasons, it was confirmed to be possible to obtain the effect to increase the value of $EI_z$ of the whole wire of equation (2), even if the elastic modulus of the intermediate layer was lower than that of one of the core wire and the periphery. It is preferable, for accelerating the diffusion of the solute element(s) to the low concentration side, to add a solute element or solute elements to diffuse quicker than the solvent element(s).

An intermetallic compound layer formed at an interface has the same effect to enhance the interface adhesion as a diffusion layer has, but its effect to enhance the mechanical properties including the flexural rigidity is greater. That is, because intermetallic compounds are strong, and especially because the elastic modulus of intermetallic compounds is higher than that of a diffusion layer, the value of $E_{Mid}$ in equation (2) further increases by the formation of intermetallic compounds, the flexural rigidity increases more than in the case that only a diffusion layer is formed, and the effect to suppress the wire deformation during the resin molding can be remarkably increased. The composition of the intermetallic compounds formed here can be of any of the phases of intermetallic compounds viable under the given thermal equilibrium but it is possible to form a specific phase or specific phases, selectively, to thereby increase the effects to improve the wire properties such as the flexural rigidity through the utilization of the properties of the selected phase(s).

Figure 1C:
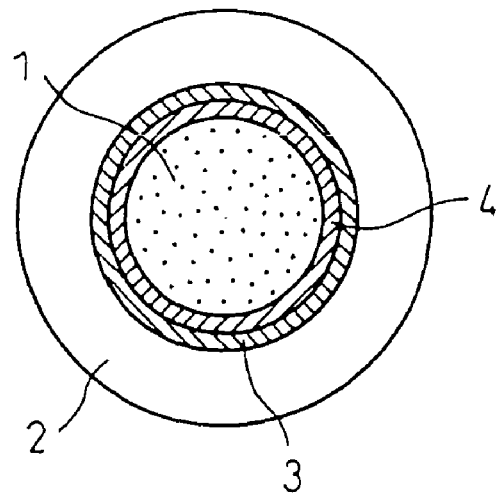
FIG. 1(c) shows a schematic illustration of a wire section according to intermediate-layered composite bonding wire of the present invention comprising a core wire 1, an intermetallic compound layer 4, a diffusion layer 3 and a periphery 2.

With respect to the structure of an intermediate-layered composite bonding wire, besides the cases explained above that either a diffusion layer or an intermetallic compound layer is formed individually, there are cases in which both a diffusion layer and an intermetallic compound layer are formed at the same time at the interface. In such a case, the effects to enhance the mechanical properties are increased synergistically. FIG. 1(c) shows a section of a bonding wire having the "core wire 1/intermetallic compound layer 4/diffusion layer 3/periphery 2" structure as an example of the intermediate-layered composite bonding wires. Besides this structure, the "core wire/diffusion layer/intermetallic compound layer/periphery" structure, the "core wire/diffusion layer/intermetallic compound layer/diffusion layer/periphery" structure, etc. are also included in the structure of the intermediate-layered composite bonding wires according to the present invention.

As is clear from equation (4), the thickness r of an intermediate layer, namely a diffusion layer or an intermetallic compound layer, is an important factor. Good effects to enhance the adhesion, tensile strength, yield strength and flexural rigidity can be obtained when the thickness of the diffusion layer is 0.05 μm or more. Preferably, when it is 0.2 μm or more, the strength of the heat affected zone (neck portion) at the ball formation can be improved. More preferably, when it is 1.0 μm or more, the flexural rigidity is remarkably increased, the wire deformation during the resin molding is suppressed and, what is more, the strength of the neck portion is increased, minimizing the wire breakage at the neck.

When a thickness of an intermetallic compound layer is 0.03 μm or more, sufficient effects are obtained to improve the interface adhesion and increase the tensile strength, elastic modulus and flexural rigidity. Preferably, if it is 0.1 μm or more, the flexural rigidity is remarkably increased suppressing the wire deformation during the resin molding and, besides, the decomposition of the intermetallic compound layer during wire production and loop formation is decreased. More preferably, if it is 1 μm or more, the flexural rigidity is largely improved and, as a consequence, good loop formation and bondability are obtained even when applied to a thin wire 20 μm or less in diameter required for the narrower pitch bonding.

No specific upper limit is set forth for the thickness of an intermediate layer, namely a diffusion layer or an intermetallic compound layer, but it is preferable to control it not to exceed seven tenths of the wire diameter in order to have the core wire, intermediate layer and periphery play their respective roles efficiently. Considering the fact that the formation of a hard intermetallic compound layer makes the wire drawing work difficult, it is desirable that the thickness of an intermetallic compound layer is controlled not to exceed five tenths of the wire diameter especially when high productivity is required.

An intermediate layer can be measured using EPMA, EDX, Auger spectroscopy, transmission electron microscope (TEM), and the like. The thickness and composition of a diffusion layer and an intermetallic compound layer can be clarified through line scanning across the interface between the core wire and periphery at a polished section of a wire.

The methods to measure a diffusion layer are explained hereafter based on specific examples.

An effective method to actually observe a diffusion layer is line scanning of regions across the interface between the core wire and periphery at a section of a wire. In the concentration profile obtained through the line scanning, the concentrations of elements change near the boundary of a diffusion layer either continuously or discontinuously, and the methods to identify a diffusion layer are somewhat different depending on the manner of the concentration change. When the concentration change near the interface is discontinuous, the position where the concentration of a solute element changes discontinuously is identified as the boundary of a diffusion layer, and the region between the boundary on the core wire side and the other on the periphery side is the diffusion layer. When the concentration change near the interface is continuous, on the other hand, it is essential to pay attention to the changes of the concentration gradient in a unit measurement distance: in the case of a sample in which a diffusion layer is formed, the diffusion layer is identified as the region where the concentration gradient is less steep than in the case that there is no diffusion layer. In the case of the continuous concentration change, the boundary of a diffusion layer can be identified as the position where, in a coordinate system of measurement distance and concentration, a straight line extrapolating the concentration gradient inside the diffusion layer near the boundary crosses another straight line extrapolating the concentration gradient in the core wire or periphery. The thickness and other features of a diffusion layer can be accurately measured by thus changing the identification method, depending on whether the concentration change at the diffusion layer boundary is continuous or discontinuous.

Figure 2A:
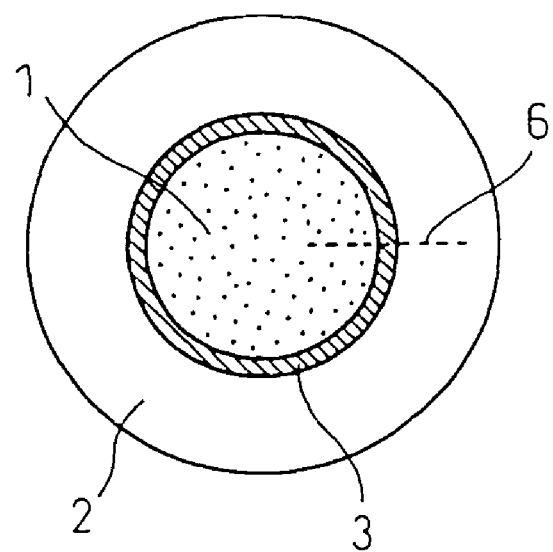
FIG. 2(a) is a schematic illustration showing sectional line scanning, using an Auger spectroscope, of a composite bonding wire sample in which a diffusion layer is formed.
Figure 2B:
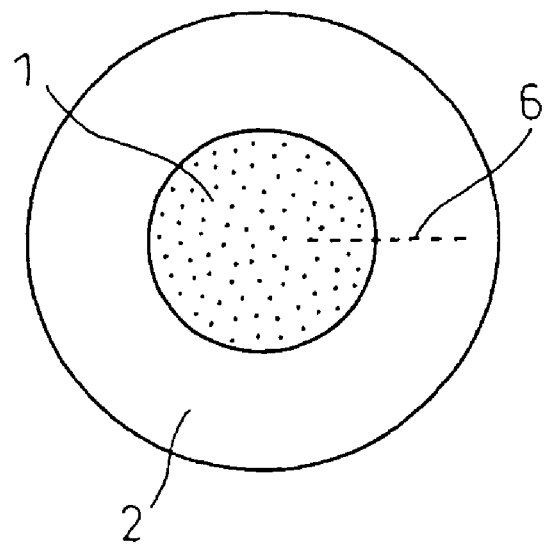
FIG. 2(b) is a illustration showing sectional line scanning, using an Auger spectroscope, of a composite bonding wire sample without a diffusion layer.

FIG. 2 shows an outline of the method of sectional line scanning of wires by the Auger spectroscopy and FIGS. 3, 4 and 5 the results of the scanning. FIG. 2(a) illustrates that the scanning is done along the scanning line 6 across the diffusion layer 3 formed at the interface between the core wire 1 and the periphery 2 using a sample polished at a section perpendicular to the wire length. FIG. 2(b) shows, as a comparison, a section of a wire comprising the core wire 1 and the periphery 2 without a diffusion layer in between. The reason why the Auger spectroscopy is employed is that the method is suitable for analyzing very small areas and is effective for analyzing samples having thin diffusion layers. FIG. 3 shows a case that a diffusion layer is formed under the material combination of a core wire of Au and a periphery of an Au-20% Pd alloy, and FIG. 4(a) a case that a diffusion layer is formed under the material combination of a core wire of Au and a periphery of an Au-30% Ag alloy. FIG. 4(b) shows a comparative case of the same material combination of the core wire and periphery without forming any diffusion layer. The materials were analyzed at an interval of 0.05 μm.

Figure 5A:
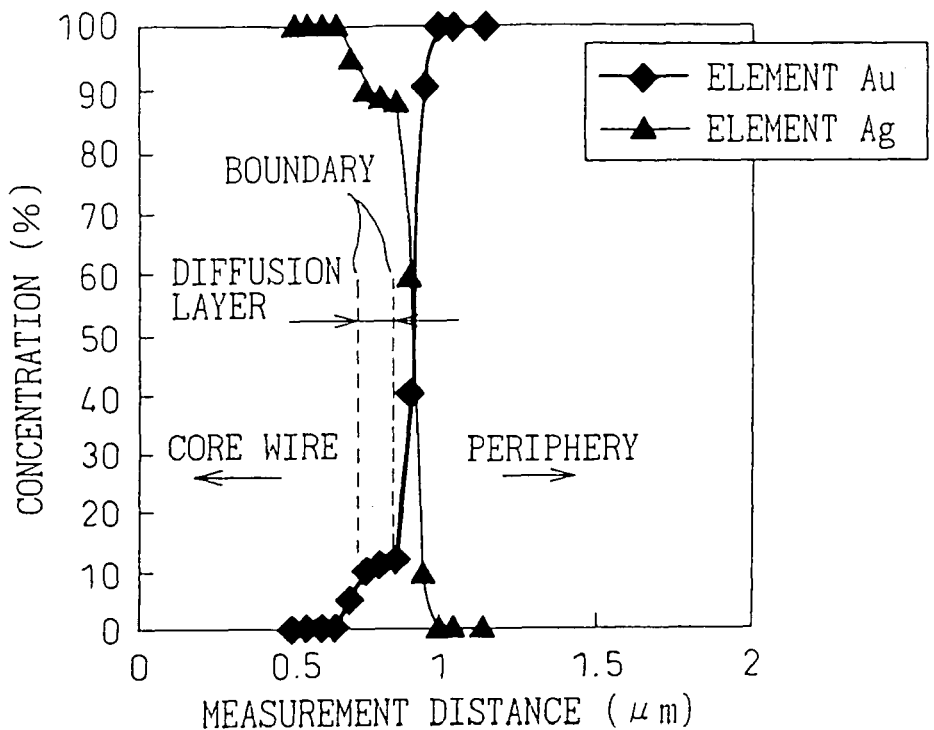
FIG. 5(a) is a graph showing the result of sectional line scanning, using an Auger spectroscope, of a composite bonding wire sample having a core wire of Ag and a periphery of Au with the diffusion layer shown in FIG. 2(a).
Figure 5B:
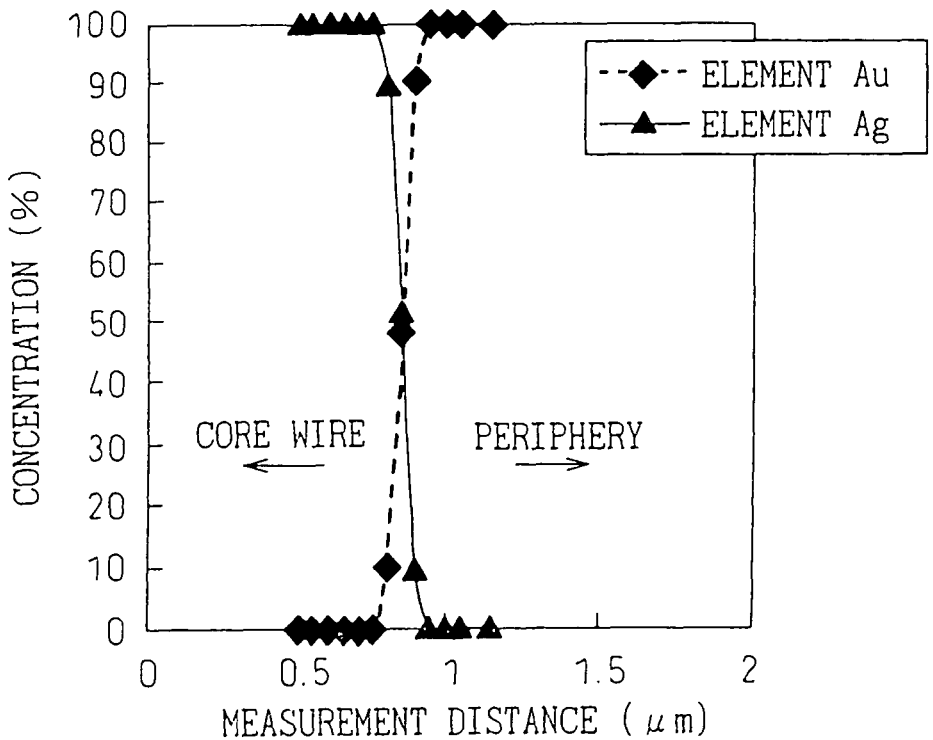
FIG. 5(b) is a graph showing the result of sectional line scanning, using an Auger spectroscope, of a composite bonding wire having a core wire of Ag and a periphery of Au without the diffusion layer shown in FIG. 2(b).

FIG. 5 compares two sample wires both having the material combination of a core wire of Ag and a periphery of Au: FIG. 5(a) shows the analysis result of the wire sample with a diffusion layer shown in FIG. 2(a), and FIG. 5(b) that of the other wire sample without a diffusion layer shown in FIG. 2(b). The samples were analyzed also at an interval of 0.05 μm.

The analysis results shown in FIGS. 4(b) and 5(b) of the wire samples without diffusion layers as shown in FIG. 2(b) demonstrate continuous concentration changes near the core wire/periphery interface. This is a phenomenon in which the concentration apparently changes, generally observed in line scanning when the analysis area covers a boundary across the core wire/periphery interface. This continuous concentration change is observed inevitably owing to the limits of accuracy and resolution of the presently available analysis methods. In the analysis results shown in FIGS. 3 and 5(a) of wire samples with diffusion layers as shown in FIG. 2(a), in contrast, the discontinuous concentration change can be seen, and the portion separated by the discontinuations can be identified as the diffusion layer and, further, the boundary of the diffusion layer is identified as the interface where the concentration change is discontinuous. In the analysis result shown in FIG. 4(a), although the concentration changes continuously near the boundaries of the diffusion layer, the formation of the diffusion layer can be confirmed from the less steep concentration gradient in a unit measurement distance when compared with samples without diffusion layers as shown in FIG. 4(b). In this case, a diffusion layer can be identified with good reproducibility by identifying as its boundary the position p where a straight line m extrapolating the concentration gradient inside the diffusion layer crosses another straight line n extrapolating the concentration gradient inside the periphery. As it is possible to identify a diffusion layer as a concentration change in the analysis at a wire section, as seen in the analysis results shown in FIGS. 3, 4(a) and 5(a), it is quite possible to identify diffusion layers by the above analysis method at wire sections.

When it is necessary to raise the analysis accuracy and resolution for reasons such as the thickness of a diffusion layer not exceeding 0.5 μm, the concentration to be measured being very low, etc., it is effective to conduct the line scanning at a smaller interval or carry out point analyses focusing on areas to be minutely observed around the boundary. It is also possible to improve the accuracy and resolution of the analysis to the level of 0.01 μm or so by enlarging the thickness of a diffusion layer by obliquely polishing a wire section surface. Further, when it is necessary to enhance quantitative accuracy of the analysis in order to clarify the composition of a diffusion layer, the concentration measurement accuracy can be improved by using a sample of the same material as the diffusion layer, prepared beforehand to a prescribed composition, as a standard sample and obtain a calibration curve using the sample. Otherwise, for accurately measuring the thickness and composition of an intermediate layer thinner than 0.05 μm, it is effective, though troublesome, to prepare a thin film sample including an intermediate layer and observe the sample with TEM or by methods such as electron beam diffraction.

In a bonding wire according to the items (1) to (6) of the present invention, while it is possible to improve formability, etc. by forming an intermediate layer, namely a diffusion layer or an intermetallic compound layer, between the core wire and the periphery, the selection of the materials composing the core wire and the periphery is significant for further satisfying the overall performance in the use of the bonding wire. In other words, it is possible to control the wedge bondability, ball bondability, flexural rigidity, surface properties, etc. by properly selecting the core wire/periphery material composition from among the metal/alloy, alloy/metal and alloy/alloy combinations.

The characteristics of the material combinations of the core wire and periphery of a bonding wire according to the items (1) to (6) of the present invention are explained hereafter individually.

Firstly, in the case of a bonding wire comprising a periphery of a conductive metal and a core wire of an alloy composed mainly of the conductive metal and having a diffusion layer in between (such a structure being hereinafter referred to as $alloy_{In}$/diffusion layer/$metal_{Out}$), good wedge bondability is obtained by the periphery being the metal, while achieving high strength by the core wire being the alloy. Here, the wedge bondability means the property of a bonding wire to obtain good performance in high speed bonding and high bonding strength of wedge bonding portions and secure high pull strength around the wedge bonding portions at the same time, without causing bonding separation, abnormal shape of the balls and other bonding defects when the wires are connected directly onto the layers of leads plated with Ag or Pd, the portions of substrates plated with Au, or the Al pad films of Si chips, etc. Since the periphery is composed of a metal, the oxidation, sulfurization, etc. of the wire surface is mitigated, bonding strength is enhanced by accelerating the diffusion at the bonding interface, the separation of the bonding joints is suppressed by the formation of a diffusion layer, pull strength near the wedge bonding joints is improved.

While flexural rigidity is not sufficiently improved in a conventionally proposed bonding wire having a double-layered $metal_{In}$/$metal_{Out}$ structure composed of a common metal, if a diffusion layer is formed between the two layers to form a $metal_{In}$/diffusion layer/$metal_{Out}$ structure, the flexural rigidity and other mechanical properties can be improved. This is because the product EI of the elastic modulus of an entire wire multiplied by the geometrical moment of inertia of equation (2) can be raised higher than that of the conventionally proposed double layer bonding wire without a diffusion layer, by forming a diffusion layer mainly on the low concentration $metal_{Out}$ side as explained before to increase the elastic modulus of the portion. In the conventionally proposed double layer bonding wires, it is necessary to raise the concentration of the $alloy_{In}$ portion and increase the area of the portion in order to increase the flexural rigidity, which increases the concentration of the ball and results in the problem of the deterioration of bondability. However, since it is possible by the present invention to increase flexural rigidity by the formation of a diffusion layer without relying on the above measures, the problem of the high concentration of the ball can be improved.

In order to realize high strength and good wedge bondability at the same time in the $alloy_{In}$/diffusion layer/$metal_{Out}$ structure, it is preferable to control the ratio ($d_1/d_2$) of the core wire diameter $d_1$ to the wire diameter $d_2$ within the range from 0.2 to 0.8. This is because the above range was found to be desirable for increasing the geometrical moment of inertia of each of the core wire, intermediate layer and periphery in an overall manner, as a result of comparative studies of the values of the geometrical moment of inertia I expressed by equations (3) to (5).

Secondly, in the case of a bonding wire comprising a core wire of a conductive metal and a periphery of an alloy composed mainly of the conductive metal and having a diffusion layer in between (such a structure being hereinafter referred to as metal$_{In}$/diffusion layer/alloy$_{Out}$), the effect to suppress the wire deformation during the resin molding can be increased by raising flexural rigidity, etc. In the case of the metal$_{In}$/alloy$_{Out}$ structure without a diffusion layer, the alloy of the periphery is little worked during wire drawing and, as a consequence, the problems related to poor adhesion occur more often during wire production than in the case of the alloy$_{In}$/metal$_{Out}$ structure. Productivity can be largely increased if a diffusion layer is created between the two layers to form the metal$_{In}$/diffusion layer/alloy$_{Out}$ structure. Additionally, it is preferable for the alloy of the periphery to be composed mainly of the metal element of the core wire as the solvent and contain an element or elements to strengthen it through solid solution or precipitation in the solvent.

When a periphery consists of an alloy, the control of the diffusion at the wedge bonding interface may become difficult and, besides this, it becomes difficult to secure bonding strength especially in thin wires or at low temperature bonding. It is preferable to make the concentration of solute element(s) in the periphery homogeneous for improving the bonding strength, since this stabilizes the diffusion at the bonding interface. It is preferable to secure a thickness of 0.5 μm or more of the homogenized periphery in order to enjoy the effect.

Further, the flexural rigidity of a wire having a periphery consisting of an alloy having higher strength than that of a core wire can be increased more than that of a wire composed of a periphery of a metal and a core wire of an alloy of the metal. The values of the geometrical moment of inertia of the core wire and periphery can be calculated using equations (3) and (5). When the wire diameter $d_2$ is twice as large as the core wire diameter $d_1$ (namely $d_2=2d_1$), for example, supposing that the thickness r of the intermediate layer is smaller than $d_1$, the geometrical moment of inertia of the periphery $I_{Out}$ will be 15 times that of the core wire $I_{In}$ (namely $I_{Out}=15 \cdot I_{In}$) and, if the area of the core wire is equal to that of the periphery (namely $d_1^2=d_2^2$), the geometrical moment of inertia of the periphery $I_{Out}$ will be three times that of the core wire $I_{In}$ (namely $I_{Out}=3 \cdot I_{In}$). It is confirmed from such analyses that the effect of a periphery to enhance the flexural rigidity is larger than that of a core wire. Equation (4) also shows that the effect to enhance the flexural rigidity is larger when a material having a high elastic modulus is used rather in a periphery than in a core wire. The above descriptions confirm that higher flexural rigidity is realized in a wire having a core wire of a metal and a periphery of an alloy of the metal (the metal$_{In}$/diffusion layer/alloy$_{Out}$ structure). In addition, it is desirable that the diameter $d_1$ of the metal core wire is 84% or less of the wire diameter $d_2$. This is because, from the analyses of equations (3) and (5), the relationship of $I_{Out}>I_{In}$ is maintained by satisfying the expression $d_1<0.84 \cdot d_2$, namely, the geometrical moment of inertia of a periphery can be kept larger than that of a core wire by keeping the core wire diameter $d_1$ not exceeding 84% of the wire diameter $d_2$.

In the case of a bonding wire comprising a core wire consisting of an alloy composed mainly of a conductive metal and a periphery consisting of another alloy composed mainly of the same conductive metal, each of the alloys containing at least one alloying element uncommon to the other or at least one element in a different concentration from the other, and having at least a diffusion layer or an intermetallic compound layer formed between the core wire and the periphery (such a structure being hereinafter referred to as "alloy$_{In}$/intermediate layer/alloy$_{Out}$"), the effect to enhance the flexural rigidity and suppress the wire deformation during resin molding can be increased. If the structure is alloy$_{In}$/alloy$_{Out}$, lacking the intermediate layer, the adhesion at the interface will be insufficient and wire breakage during wire production and poor loop shape during high speed bonding are likely to occur. By forming the intermediate layer and changing the structure into the alloy$_{In}$/intermediate layer/alloy$_{Out}$ structure, the flexural rigidity of both the core wire and periphery will be increased and the adhesion between the core wire and periphery will be remarkably enhanced. An intermediate layer can be formed by adding solute elements to the alloys of the core wire and periphery in a manner that each of the alloys contains at least one element not common to the other or at least one element in a different concentration from the other. The formation of an intermetallic compound layer at the interface of the core wire and periphery can be accelerated by adding, for instance, two or more kinds of strongly active elements to the alloys of the core wire and periphery differently. It is more preferable for enhancing flexural rigidity to use for a periphery an alloy having a higher elastic modulus than the alloy of a core wire. In order to stabilize bondability, it is desirable to monogenize the concentration(s) of the solute element(s) in the alloy of a periphery. The area ratios of a core wire and a periphery are important for the properties of the ball, the strength and bondability of the wire, etc. and it is preferable for practical purposes that each of the core wire and periphery has an area ratio of 10% or more. This is because when the area ratio is 10% or more the material of each of the core wire and the periphery is not consumed and does not disappear during a diffusion heat treatment and the core wire and the periphery can fully exercise their respective functions when the wire is used. Here, the area ratio cited in the present invention is defined by the proportion of each sectional area to the total sectional area of the cross section perpendicular to the axial direction of a wire.

What is common to the three types of bonding wires according to the items (1) to (6) of the present invention having the alloy$_{In}$/diffusion layer/metal$_{Out}$, metal$_{In}$/diffusion layer/alloy$_{Out}$ and alloy$_{In}$/intermediate layer/alloy$_{Out}$ structures is that the core wire and the periphery contain a solvent element common to both. This enables enhancement not only of the wire strength, flexural rigidity, etc. but also of ball formability, bonding strength, etc. In a conventional single layer bonding wire, when an alloy element or alloy elements is/are added in high concentration(s) to increase strength, problems such as cavities caused by oxidation during ball formation, consequent deterioration of the bonding strength, etc. are expected to occur. With the case of a conventionally proposed double layer bonding wire having a core wire and a periphery consisting of a common solvent element but not having an intermediate layer, it is possible to improve the bondability of the ball by controlling the concentration of the alloy elements in the ball as a whole to a low level, but, wire strength, flexural rigidity, etc. are not sufficiently enhanced. If the concentration of the alloy elements or the area ratio of the alloy is increased in order to improve the mechanical properties of a core wire and a periphery, on the other hand, the concentrations of the alloy elements in the ball will rise and the problem of the poor bondability appears again. In contrast, the core wire/intermediate layer/periphery multiple layer structure realizes high strength and high bondability, conventionally viewed as mutually contradictory.

In the case of a bonding wire according to the items (2) to (5) of the present invention having the metal$_{In}$/diffusion layer/alloy$_{Out}$ structure or the alloy$_{In}$/intermediate layer/alloy$_{Out}$ structure, in either of which the periphery consists of an alloy, the wedge bondability, ball bondability, loop stability, etc. can be further enhanced by creating, on the surface of the periphery 2, an outermost surface layer 7 composed of the same metal element constituting the solvent element of the core wire 1 and the periphery 2. FIG. 6(*a*) schematically shows a section of a bonding wire having the "outermost surface common metal layer 7/periphery 2/intermediate layer 5/core wire 1" structure. Here, the intermediate layer 5 is composed of an intermetallic compound layer 4. The segregation or oxidation of the solute element(s) of the alloy at the wire surface may deteriorate the wedge bondability and increase the wire friction with the inner wall of the capillary jig causing random loop shape. The formation, as a countermeasure, of the outermost surface layer consisting of a metal common to the core wire and the periphery to make the "outermost surface common metal layer/periphery/intermediate layer/core wire" structure decreases segregation and oxidation at the wire surface and, at the same time, makes the outer portion of the wire softer than the inner portion. This optimizes the wire deformation during bonding work and thus improves the wedge bondability at low temperatures. Further, since the metal composing the outermost surface layer is the same metal as the solvent element of the core wire and the periphery, the concentration of the solvent element in the molten ball is increased, and, owing to this, the oxidation and hardening of the ball are decreased and the effect to improve ball bondability is also obtained. As one of the most serious concerns, especially in the bonding wire of the alloy$_{In}$/intermediate layer/alloy$_{Out}$ structure having a core wire and a periphery both composed of alloys, is the damage to the chip inflicted by the ball hardened by the solute element(s), the ball bondability is remarkably improved through the formation of the outermost surface layer 7 composed of the common metal. It is preferable that the purity of the metal of the outermost surface layer 7 is 99.5% or higher and that its thickness is within the range from 0.1 to 10% of the wire diameter. A sufficient effect to improve wedge bondability and ball bondability is obtained when the thickness falls within this range. The outermost surface layer can be formed effectively by plating, vapor deposition, etc. on the surface of a wire in which an intermediate layer is formed. As for the timing to form the outermost surface layer, the layer may be formed either after drawing the wire to the final diameter or before drawing it to the final diameter while its diameter is a little larger than the final diameter. When an intermediate layer 5 is created between the outermost surface common metal layer 7 and the periphery 2 to form the "outermost surface common metal layer 7/intermediate layer 5/periphery 2/intermediate layer 5/core wire 1" structure as shown in FIG. 6(*b*), the adhesion of the interface is improved, decreasing the occurrence of defects such as the interface separation under, for instance, a higher frequency of the ultrasonic bonding at the wedge bonding. In the case of the wire shown in FIG. 6(*b*), the intermediate layer 5 between the periphery 2 and the core wire 1 is composed of a diffusion layer 3.

In a bonding wire according to the present invention, the ratios of the core wire and the periphery is also significant in relation to the characteristics such as the ball properties, wire strength and bondability. For practical purposes, it is preferable that each of the area ratios of both a core wire and a periphery is 10% or more. This is because, when the area ratio is 10% or more, the material of either the core wire or the periphery is not consumed and does not disappear during a diffusion heat treatment and they can fully exert their respective functions at the use. What is more, the area ratios not only affect the wire strength, bondability, resistance to wire deformation, etc. but the ball formed at the end of the wire by melting consists of an alloy wherein the materials of the core wire and periphery are mixed in accordance with the area ratios, and the sphericity, hardness, deformability, surface properties, etc. of the ball are determined by the composition. The optimization of the area ratios prevents problems such as the excessive hardness of the ball to damage the semiconductor substrates and the oxidation of the ball surface to deteriorate bondability. It is therefore necessary to optimize the area ratios in accordance with the kind of elements composing the core wire and periphery so as to satisfy the required characteristics of the wire in an overall manner. Here, the area ratio cited in the present invention is defined by the proportion of each sectional area to the total sectional area of the cross section perpendicular to the axial direction of a wire.

A diffusion heat treatment to accelerate the diffusion at the interface between a core wire and a periphery is required for forming a diffusion layer or an intermetallic compound layer at the interface. A diffusion heat treatment is applied to a wire composed of different materials in the core wire and the periphery in the following three alternative ways. The first alternative method is to apply a diffusion heat treatment (initial heating) first to a wire material (hereinafter called the "initial composite material") made by simply combining a core wire and a periphery and, then, to draw the material into a thin wire. The second alternative is to draw an initial composite material first to a prescribed diameter, then, apply a diffusion heat treatment (middle heating), and draw the wire to the final diameter. The third is to draw an initial composite material first to the final diameter and, then, apply a diffusion heat treatment (final heating). The advantage of applying a diffusion heat treatment to a thick material before wire drawing is that the diffusion layer and the intermetallic compound layer prevent the interface from separating during the drawing work after their formation, but a problem of the method is that, in order to secure a required final thickness of the intermediate layer, troublesome control of the heat treatment conditions is required to obtain a sufficient initial thickness of the layer formed before drawing work in consideration of its thinning during the drawing work. The advantage of applying a diffusion heat treatment at the final stage, on the other hand, is that it is easy to control the thicknesses of the diffusion layer and the intermetallic compound layer, but the points to be careful about are that it is necessary to find out suitable drawing conditions to prevent the core wire/periphery interface from separating, that the wire surface is expected to oxidize during the heat treatment at high temperatures at the final stage and that, when applying the diffusion heat treatment to a wire moving continuously, the thinner the wire becomes, the longer time it takes. When the above characteristics are understood, the timing and the conditions of a diffusion heat treatment can be suitably selected in consideration of the material combination, the required properties of the wire and the like. It is also effective to form a diffusion layer and an intermetallic compound layer step by step, based on the knowledge of the process advantages and disadvantages, through the combination of the initial, middle and final heating of the diffusion heat treatment, instead of forming the layers in one step.

When a periphery consists of an easily oxidizing metal or a wire is heated to a comparatively high temperature, it is necessary to apply a heat treatment in a non-oxidizing atmosphere in order to prevent the wire surface from oxidizing. The surface oxidation during a diffusion heat treatment can be kept under control, specifically, by conducting the heat treatment in a furnace atmosphere of an inert gas such as Ar, $N_2$, etc. or a reducing gas containing $H_2$, etc.

The wire surface oxidation occurs not only during a heat treatment, but it often causes problems at any stage during production and storage, during bonding and resin molding. Especially when coping with the latest use of thinner wires for the narrower pitch bonding or improving low temperature bondability in the substrate connection such as the BGA, the enhancement of wedge bondability through the control of the wire surface oxidation becomes important. For this end, as described in the items (6) and (11) of the present invention, it is effective to form, on the surface of the periphery of an intermediate-layered composite bonding wire, an outermost surface layer (coating layer) consisting of a conductive, non-oxidizing metal different from the main component element of the core wire and the periphery or different from the metal of the periphery, or consisting of an alloy of the metal. The outermost surface layer/periphery/intermediate layer/core wire structure thus formed makes it easier to improve wedge bondability of the intermediate-layered composite bonding wire. A sufficient effect to improve the wedge bondability can be obtained when the thickness of the outermost surface layer is within the range from 0.05 to 10% of the wire diameter. It is desirable that the metal used for an outermost surface layer is a non-oxidizing metal such as Au, Pt or Pd, or an alloy of the metal. Low temperature bondability is improved by forming the outermost surface layer having the thickness and material quality specified above. An outermost surface layer can be effectively formed by plating, vapor deposition, etc. on the surface of a wire in which an intermediate layer is formed. As for the timing to form an outermost surface layer, it may be formed after drawing a wire to the final diameter or before a wire is drawn to the final diameter when its diameter is a little larger than the final diameter. If an intermediate layer is created between the outermost surface layer and the periphery to form the "outermost surface layer/intermediate layer (b)/periphery/intermediate layer (a)/core wire" structure, the adhesion of the interface is improved, enhancing the productivity of thin wire products 20 μm or less in diameter and decreasing the occurrence of defects such as the separation of the outermost surface layer from the periphery even when the frequency of the ultrasonic bonding at the wedge bonding is raised.

For producing a bonding wire having a diffusion layer and/or an intermetallic compound layer between the core wire and the periphery, it is necessary to control the formation of a diffusion layer and an intermetallic compound layer through appropriate selection of the diffusion heat treatment conditions. Simply heating a wire is not enough to create the diffusion layer and the intermetallic compound layer having necessary characteristics, and it is necessary to optimize the heat treatment conditions in consideration of required characteristics of the layers. Various annealing processes are included in ordinary wire production processes such as the one to relieve work stress and another to increase elongation but, by these annealing processes alone, it is difficult to form a diffusion layer and an intermetallic compound layer according to the present invention in a desired manner and have them exert desired characteristic functions. In order to achieve envisaged kind, thickness, composition, adhesion strength etc. of a diffusion layer and an intermetallic compound layer, therefore, it is necessary to control not only the temperature, heating time, wire travelling speed, atmosphere, etc. of a heat treatment but also the processes before and after the heat treatment. The conditions of a diffusion heat treatment can be optimized only when diffusion behaviors at the core wire/periphery interface are fully understood. The temperature and heating time of a diffusion heat treatment can be appropriately selected on the basis particularly of the philosophy described below.

The thickness L of a diffusion layer is governed by mutual diffusion coefficient Di and diffusion time t as expressed below:

$$L = (Di \cdot t)^{1/2} \tag{6}$$

The mutual diffusion coefficient Di takes a value close to the diffusion velocity of a solute element in the solvent element in the case of a diffusion layer composed mainly of a solvent element. In the case of a diffusion layer composed mainly of solute elements contained in the core wire and the periphery, on the other hand, it can be expressed by the following equation, where $D_{In}$ and $D_{Out}$ are diffusion coefficients respectively of the solvent elements of the core wire and the periphery and $c_{In}$ and $c_{Out}$ are concentrations of the respective solvent elements in the diffusion layer ($c_{In} + c_{Out} = 1$):

$$Di = (D_{In}c_{In} + D_{Out}c_{Out}) \tag{7}$$

The mutual diffusion coefficient Di corresponds to the growth speed of a diffusion layer. As is clear from the above equation, the composition of a diffusion layer ($c_{In}$, and $c_{Out}$) is involved in it. The combinations of the diffusion constants, $D_{In}$ and $D_{Out}$, for a considerable number of binary systems have been made available by various reports. Further, the relation between the mutual diffusion coefficient Di and heating temperature T can be expressed by the following equation, where Q is the activation energy of diffusion, R is a gas constant and f is a constant:

$$Di = f \exp(-Q/RT) \tag{8}$$

Q and f are physical property figures uniquely defined according to element combination and, when their values are specified, the mutual diffusion coefficient Di is defined and the thickness L of the diffusion layer can be calculated from equation (6).

There often occurs concentration unevenness in a diffusion layer and thus the control of the concentration is important. Supposing that a wire is of a cylindrical shape, the concentration C at a distance x from the center can be approximated by the following equation, where a and b are constants:

$$C = a + b \cdot \ln x \tag{9}$$

It is important to select the heat treatment conditions in consideration of factors such as the diffusion layer thickness of equation (6) and the concentration of equation (9). Namely, the diffusion time t to achieve a target diffusion layer thickness L and a target concentration distribution C can be calculated when the heating temperature T is given, and the heating temperature T to achieve the same can be calculated when the diffusion time t is given beforehand.

Likewise, the thickness d of an intermetallic compound layer, which is determined by the diffusion time t and the parabola rule, can be expressed by the following equation:

$$d = k \cdot t^{1/2} \tag{10}$$

where k is the speed of the layer growth, and it is expressed using the activation energy E of the growth of the compound layer as follows:

$$k = k_0 \cdot \exp(-E/RT) \tag{11}$$

Here, while the approximate values of $k_0$ and E are given depending on the kind of the intermetallic compound in question, they are sometimes influenced by factors such as the combination of elements. In order to make intermetallic compounds grow stably, it is necessary to feed an amount of heat exceeding the activation energy E, the value of which, however, is different depending on the phase. By controlling the heating temperature, time, etc. on the basis of the understanding of the growth behavior of intermetallic compounds, therefore, selective formation of desired intermetallic compounds is made possible.

In a diffusion heat treatment to form an intermediate layer, namely a diffusion layer or an intermetallic compound layer, the higher the heating temperature, the more the growth is accelerated. But, if the temperature is too high, the material of the periphery may be oxidized to deteriorate bondability or the thermal strain during cooling may cause cracks to develop in the intermediate layer created at the interface. Facing the situation, the present inventors carried out tests changing the combinations of materials and, as a result, confirmed that the temperature $T_d$ of the diffusion heat treatment could be expressed approximately using the melting points of the materials of the core wire and periphery. Specifically, it turned out to be preferable for the diffusion heat treatment temperature $T_d$ to satisfy the following expression in relation to the mean value $T_{m0}$ of the melting points of the materials of the core wire and periphery:

$$0.3T_{m0} < T_d < 0.9T_{m0} \tag{12}.$$

A desired thickness of an intermediate layer can be obtained, when the heating temperature is set within this range and the heating time is appropriately controlled.

It is not necessary to use only one furnace for the diffusion heat treatment. When it is desirable to avoid rapid heating and cooling, it is effective to conduct a preliminary heating before the heat treatment proper or a secondary heating after it. For relieving the thermal strain formed by the rapid cooling at the core wire/intermetallic compound layer interface or the periphery/intermetallic compound layer interface, the secondary heating after the heat treatment proper is effective, depending especially on the phase of the intermetallic compound(s) formed at the interface. If it is necessary to suppress the formation of a fragile intermetallic compound phase and promote the growth of a specific phase, it is possible to suppress the growth of the fragile phase by properly controlling the diffusion heat treatment conditions such as temperature and time, or, if this is not enough for the purpose, to accelerate the formation of the desired intermetallic compound phase by a preliminary heating to selectively control the nucleation of intermetallic compounds. For the purpose of heating the material to different temperature ranges, a heating furnace comprising plural zones with different temperature settings or another in which the furnace temperature changes continuously may be used.

Apart from the above methods to use the diffusion heat treatment, an intermediate layer can also be created by heating one of the core wire and the periphery to a high temperature above its melting point so as to accelerate the diffusion when they are combined to form a composite material. This method can be classified into two methods by the material to be melted, the core wire or the periphery: a method to form a periphery by casting a molten metal or alloy around a prefabricated core wire and another method to form a core wire by casting a molten metal or alloy into a space drilled at the center of a cylindrical body pre-fabricated as the periphery. By either method it is possible to produce a double layer bonding wire having an intermediate layer between the core wire and periphery. It has to be noted, however, that it is important to control the melting temperature, time, cooling rate, etc. for obtaining a desired kind of intermediate layer in a desired thickness. It is necessary to fully understand the diffusion behaviors as explained using equations (5) to (11) for establishing a philosophy of the diffusion heat treatment to work out the practical heat treatment conditions for the purpose. It becomes possible to form a desired intermediate layer only when the heat input and cooling are controlled on the basis of the understanding. As a method to form an intermediate layer using molten metal, it is also possible to produce either the core wire or the periphery by continuous casting. This simplifies production processes compared with the above piece-by-piece cast-in method and improves productivity by making the wire diameter smaller.

For producing a bonding wire in which intermediate layers are formed at two interfaces between the periphery and the core wire and between the outermost surface layer and the periphery to form the "outermost surface layer/intermediate layer (b)/periphery/intermediate layer (a)/core wire" structure, it is preferable to employ the three methods described below selectively in accordance with the advantage and disadvantage of the methods and desired characteristics of the wire. The first method is to produce, in the first place, a wire of the "periphery/intermediate layer (a)/core wire" structure with the intermediate layer (a) formed between the core wire and the periphery, form an outermost surface layer on the surface of the wire and, finally, form the intermediate layer (b) between the outermost surface layer and the periphery by a diffusion heat treatment. This method is effective for forming an outermost surface layer or an intermediate layer (b) having a comparatively small thickness of 0.7 μm or less, or two intermediate layers having different ranges of optimum forming temperature. The second method is to form the intermediate layers (a) and (b) in one diffusion heat treatment. Although it is difficult to control the growths of the two intermediate layers individually by this method, it has the advantage of a high productivity thanks to the formation of the two layers in one treatment process. The third method is to form the intermediate layers (a) and (b) at different temperature ranges of the diffusion heat treatment, high and low. It is possible to form the intermediate layers (a) and (b) having different desired properties by employing two heat treatment furnaces kept at different temperature ranges or one heat treatment furnace having two or more heating zones kept at different temperature ranges and appropriately controlling heating time and heating zone lengths. Either of these methods makes it possible to selectively form desired types of intermediate layers at two interfaces from among various possible diffusion layers and intermetallic compound layers, taking advantage of the mutual diffusion or intermetallic compound growth taking place under different thermal activation conditions.

It is preferable that each of the conductive metals used for the core wire and the periphery of a bonding wire according to the items (1) to (6) of the present invention is chosen from among the elements of Au, Pt, Pd, Cu, Ag, Al, etc. Further, it is more preferable that the conductive metal is a pure metal having a purity of 99.9% or higher. This is because the advantages of an intermediate-layered composite bonding wire are fully enjoyed when the core wire and the periphery consist of the above metals or their alloys containing the metals as respective solvents. For improving the bondability to the pads of semiconductor device wiring and the plated portions of leads, it is more preferable to use Au, Pd and/or Pt but, for enhancing strength and elastic modulus, it is more preferable to use Pd, Cu, etc.

It is preferable that each of the alloys used for a core wire or a periphery comprises Au, Pt, Pd, Cu, Ag, Al, etc. as the solvent element and at least one solute element or more in the range of 0.02 to 45% in total. This is because the strength and rigidity of the alloys are made higher than those of respective pure metals when the concentration of the solute element(s) is 0.02% or more, and the hardening, oxidation, etc. of the ball are kept under control when the concentration is below 45%. The kind of the solute elements to be added is different depending on the solvent element. For instance, the following element combinations are preferable: when Au is the solvent element, to add at least one from among Ca, Be, In, Cu, Pd, Pt, Ag, Co, Ni, a rare earth element, etc. in the range of 0.01 to 40% in total as the solute element(s); when Cu is the solvent element, to add at least one from among Be, Au, Pd, Ag, Sn, Mn, etc. in the range of 0.1 to 30% in total; and, when Al is the solvent element, to add at least one from among Si, Mg, Au, Pd, Zn, etc. in the range of 0.1 to 20% in total. The strength of a diffusion layer and an intermetallic compound layer can be remarkably enhanced when each of the layers formed between the core wire and periphery contains the solute element(s) as explained above.

Further, in order to accelerate the growth of a diffusion layer mainly composed of solute elements, it is preferable to make the core wire and the periphery contain each of the elements respectively of the solute element combinations such as Ag—Cu, Ag—Pd, Cu—Be, Pd—Pt, etc. In order to accelerate the growth of an intermetallic compound layer at the interface, on the other hand, it is also effective to make the core wire and the periphery contain each of the elements respectively of the solute element combinations such as Au—Al, Ag—Al, Cu—Pd, Ag—Pd, Au—Cu, Fe—Pd, etc.

It is preferable that each of the conductive metals used for the core wire and the periphery of a bonding wire according to the items (7) to (11) of the present invention is one of Au, Pt, Pd, Cu, Ag, Al, Ni, Fe, etc. or an alloy containing the metal as the solvent element. That is, the advantages of an intermediate-layered composite bonding wire are enjoyed when different materials for the core wire and the periphery are composed of two elements selected from among the elements listed above. Here, it is more preferable to use Au, Pt, Pd, Ag or Al for a periphery in order to prevent the oxidation of the outermost surface of a wire. It is still more preferable to use Au, Pd or Pt for a periphery in order to enhance further the bondability to the pads of semiconductor device wiring and the plated portions of leads. In contrast, since it is desirable for a core wire material to have high strength and elastic modulus, the use of Pd, Cu, Ni, Fe, etc. is more preferable.

The elements such as Ni and Fe have high strength but, when used directly for a core wire or a periphery, it becomes difficult to secure the interface adhesion. But they can be used for forming an intermediate layer at the interface and brings about a high effect to suppress wire deformation. It is preferable to use Ni or Fe or its alloy for a core wire and an element to prevent oxidation such as Au, Pt, Pd, or Ag, for a periphery, since the bondability of a bonding wire of such a composition is enhanced. A bonding wire mainly composed of Ni or Fe is suitable for the wedge/wedge bonding.

Whether a diffusion layer or an intermetallic compound layer is formed, and what its composition is, are governed by the material combination of the core wire and the periphery. When the material combination is Au—Ag, for instance, a diffusion layer is formed at the interface, but no intermetallic compound layer can be formed. There are many other binary systems in whose phase diagram no compounds can exist from the thermal equilibrium viewpoint and with which only a diffusion layer is expected to form, like the Au—Ag combination. Au—Pt, Au—Ni, Ag—Cu, Ag—Pd, Ag—Ni, Pd—Pt, etc. are examples of such systems. With the combinations such as Au—Al and Ag—Al, in contrast, it is difficult to form only a diffusion layer at an interface, although it is easy to form an intermetallic compound layer.

As explained above, it is important to select the materials of a core wire and a periphery and the conditions of the diffusion heat treatment so that the core wire and periphery may satisfy their required properties and sufficient effects to enhance the interface adhesion and flexural rigidity may be obtained trough the formation of a diffusion layer and/or an intermetallic compound layer at their interface. The present inventors confirmed that an intermediate-layered composite bonding wire comprising a periphery of Au and a core wire of Cu, with intermetallic compounds ($Au_3Cu$, AuCu and $AUCu_3$) formed in an intermediate layer, for example, has good bondability to aluminum pads, sufficient strength of the ball neck, which is prone to have low strength owing to the thermal effect of the ball, and, moreover, a bonding machine for the present mainstream Au bonding wires is applicable to the above wire without modifications.

The conductive material of a core wire or a periphery may also be a pure metal having a purity of 99.9 mass % or higher, or an alloy composed of the metal as the solvent element containing at least one solute element. An alloy composed of an element of Au, Pt, Pd, Cu, Ag, Al, Ni or Fe as the solvent can be given higher strength and rigidity compared with respective pure metals and, thus, the use of such an alloy enhances the mechanical properties of the core wire or the periphery. The kind of the solute element to be added is different depending on the solvent element. For instance, the following element combinations are preferable: when Au is the solvent element, to add at least one from among Ca, Be, In, Cu, Pd, Pt, Ag, Co, Ni, a rare earth element, etc. in the range of 0.01 to 40% in total as the solute element(s); when Cu is the solvent element, to add at least one from among Be, Au, Pd, Ag, Sn, Mn, etc. in the range of 0.1 to 30% in total; and, when Al is the solvent element, to add at least one from among Si, Mg, Au, Pd, Zn, etc. in the range of 0.1 to 20% in total. The strength of a diffusion layer and an intermetallic compound layer can be remarkably enhanced when the diffusion layer and the intermetallic compound layer formed at the core wire and periphery contain the solute element(s) as explained above.

Better effects to enhance strength, adhesion, bondability, etc. can be realized with a bonding wire according to the item (10) of the present invention in which wire a middle layer is formed between the core wire and the periphery to constitute a three-layer structure of the core wire, the middle layer and the periphery and, additionally, at least one of a diffusion layer and an intermetallic compound layer is formed at each of the core wire/middle layer interface and the middle layer/ periphery interface. Examples of the construction of such intermediate-layered composite bonding wires having the three-layer structure are shown in FIG. 7: FIG. 7(a) illustrates the "core wire 1/intermetallic compound layer 4/middle layer 8/diffusion layer 3/periphery 2" structure, and FIG. 7(b) the "core wire 1/diffusion layer 3/middle layer 8/intermetallic compound layer 4/periphery 2" structure. Here, the intermediate layer, namely the diffusion layer or the intermetallic compound layer, formed at each of the core wire/middle layer interface and the middle layer/periphery interface, has nearly the same effects to enhance the adhesion, mechanical properties, etc. as the intermediate layer formed at the interface of the two-layer structure composed of the core wire and the periphery of the intermediate-layered composite bonding wire described before, by making its composition and thickness same as those of the latter intermediate layer. The same methods of diffusion heat treatments to form intermediate layers can be applied to the formation of the above intermediate layers. A conventionally proposed two-layer structure has been difficult to construct owing to the poor adhesion of the core wire/periphery interface, and, as a matter of course, a bonding wire of the three-layer structure comprising a core wire, a middle layer and a periphery is very difficult to produce, let alone its mass production, which has been deemed impracticable. By the present invention, however, since the adhesion at the core wire/middle layer interface and the middle layer/periphery interface is enhanced by forming a diffusion layer or an intermetallic compound layer at each of the interfaces, the mass production of a three-layer bonding wire is made viable. What is more, the effect to suppress wire deformation can be further improved thanks to increases in the strength, flexural rigidity, etc. as a result of the formation of the intermediate layers at both the interfaces.

A three-layer structure with intermediate layers formed at both the interfaces makes it easier to satisfy mutually contradictory requirements such as high wire strength, improved loop controllability, enhanced wedge bondability, and the prevention of ball hardening, than does a bonding wire of the two-layer structure with an intermediate layer. The use of a high strength metal or an alloy of the metal for the middle layer and a softer metal or softer metals than the middle layer material or an alloy or alloys of the metal(s) for the core wire and the periphery, for example, realizes a desired loop shape as the wire is made flexible to withstanding severe loop control, and suppresses the wire deformation during resin molding. Wedge bondability of a wire can be enhanced by the use of a metal to improve the wedge bondability such as Au, Al and Cu for the high strength periphery. Further, the use of a metal or an alloy or alloys containing the metal as the solvent for the core wire and the periphery and a hard material different from the material(s) of the core wire and the periphery for the middle layer is effective for reducing the proportion, in the molten ball, of the solute element(s) to harden the ball excessively and alleviate the damage to the portion immediately beneath the bonding portion. As an example of this, a bonding wire composed of a periphery of Au, a middle layer of a metal such as Cu and Pd or an alloy of the metal and a core wire of an Au alloy has better ball bondability, wedge bondability, etc. than a bonding wire of the two-layer structure.

EXAMPLES

The present invention is explained hereunder based on the examples.

Example 1

These examples relate to bonding wires according to the items (1) to (6) of the present invention.

Each of Au, Pt, Pd, Cu, Ag and Al elements having the purity of about 99.9 mass % was prepared in the state of grains or small fragments as a raw material of a bonding wire.

In addition to those high purity materials, alloys such as Au alloy containing one or more elements of Ca, Be, In, Cu, Ag, Pt, Pd, etc. in the range of 0.001 to 1% in total, Cu alloy containing one or more elements of Be, Au, etc. in the range of 0.001 to 1% in total, Al alloy containing one or more elements of Si, Mg, Ag, Pt, Pd, etc. in the range of 0.01 to 1% in total, and the like were respectively produced by melting and casting in an ultrasound vacuum melting furnace.

The following two methods were adopted to produce intermediate-layered composite bonding wires whose core wires consist of different materials from the periphery materials.

The first method was a method to prepare a core wire and a periphery material separately, combine them and, after that, make the combined material thin to a certain diameter by forging, rolling or the like, subject it to a diffusion heat treatment, and further make it thinner up to a final diameter by wire drawing thereafter (hereunder referred to as "insertion method"). In this example, a periphery material was produced by preparing a wire having the length of 10 cm and the diameter of about 5 mm and piercing it to form a hole having a diameter in the range of 0.4 to 2.5 mm at the center of its cross section and a core material was produced so as to have a diameter equivalent to the diameter of the hole, each of them separately. The core wire was inserted in the hole of the periphery material, thus produced material was processed by forging, rolling, die wire drawing and the like, and a wire having a diameter of 50 to 100 µm was produced. To subject the wire to a diffusion heat treatment, the wire was heat-treated while continuously transferring the wire at a speed of 0.01 to 40 m/sec. in a furnace where the temperature was set at 300 to 900° C. by using a horizontal infrared heating furnace having a soaking zone 20 cm in length. The wire subjected to the diffusion heat treatment was further drawn up to a final diameter of 20 to 30 µm by die wire drawing. Finally, the work induced strain of the wire was removed by heat-treating it in the aforementioned furnace and the properties of the wire were adjusted so that the elongation was about 4%.

The second method was a method to prepare a core wire whose diameter was reduced to a certain level, produce a periphery material with a different material so as to cover the core wire surface, subject the covered wire to a diffusion heat treatment thereafter, and then further make it thin up to a final diameter by wire drawing (hereunder referred to as "coating method"). In this example, a wire having a diameter of about 200 to 500 µm was prepared beforehand, the surface of the wire was coated with a periphery material in a thickness of 0.1 to 30 µm by vapor deposition, plating or the like, the coated wire was drawn to a diameter of 60 to 100 µm by die wire drawing, and thereafter the wire was subjected to a similar diffusion heat treatment using the aforementioned heating furnace. The wire subjected to the diffusion heat treatment was further drawn up to a final diameter of 20 to 30 µm by die wire drawing. Finally the work induced strain of the wire was removed and the wire was subjected to a heat treatment so that the elongation was about 4%.

To evaluate the mass productivity of wires, wire samples arranged so that the total weight of each wire was about 50 g were produced by the insertion method and the frequency of the wire breakage was measured when the wires were drawn into the diameter of 25 µm at a constant speed by using some dies in the same series. The results were expressed by the mark ×, judging that the productivity was poor in case that the frequency of the wire breakage was 6 or more, by the mark Δ, because the productivity was insufficient in case that the same was 2 to 5, and by the mark ○, judging that the mass productivity was good in case that the same was 1 or less.

The tensile strength and elastic modulus of a wire were determined by carrying out the tensile tests using five wires having the length of 10 cm and calculating the average. The modulus of flexural rigidity was measured by the cantilever beam test method. More specifically, a wire 2 to 5 cm in length was fixed at one end, the distortion curve formed by the self-weight was measured, and the modulus of rigidity was analytically calculated from the amount of the distortion.

The connection of bonding wires was performed by ball/wedge bonding or wedge/wedge bonding using a commercially available automatic wire bonder. In the ball/wedge bonding method, a ball (initial ball diameter: 46 µm) was formed at the tip of a wire by arc discharge and bonded to a pad film on a silicon substrate, and the other end of the wire was bonded on a lead pad by wedge bonding. Here, in case of a wire containing Cu, Ag, Al elements and the like in the core wire or the periphery, the arc discharge was performed by blowing $N_2$ gas to the wire tip to suppress the oxidization when melting to form a ball. In case of the wedge/wedge bonding method, a wire was directly bonded to a pad film on a silicon substrate without forming a ball.

As a material to which a bonding wire was bonded, an Al alloy film (Al-1% Si-0.5% Cu) or a Cu film (Au 0.01 μm/Ni 0.4 μm/Cu 0.4 μm), which was a material of a pad film on a silicon substrate and had the thickness of 1 μm, was used. On the other hand, as a partner material for wedge bonding, a lead frame on the surface of which Ag plating (1 to 4 μm in thickness) was applied, or a resin substrate on the surface of which an Au plated/Ni plated/Cu film was formed, was used.

The pull test method was used to evaluate the strength at a neck portion (heat affected zone) near a ball portion. This was a method to measure fracture strength (pull strength) while hanging a dedicated hook on a portion closer to a ball bonding portion than the center portion of a bonded wire and pulling it upward, and the average of the data obtained from 20 test specimens was measured.

The stability of a loop shape at the bonding process was evaluated by observing 500 wires with a projector and expressed by the mark ×, after judging that the stability was poor in case that the number of the wires wherein wire linearity, loop height and the like were inferior was 3 or more, by the mark ○ in case that the inferiority in stability was not observed, and by the mark Δ in case that the same number was 1 or 2 in between the above two cases. As one of the causes of the inferiority, it was confirmed that bad stability of a loop shape was generated in relation to insufficient adhesiveness at the interface between a core wire and a periphery material. Therefore, this evaluation method can be used as a method to determine such adhesiveness.

With regard to the measurement of wire deformation (resin deformation) during resin molding, defined as the wire deformation after molding was a value (in percentage) obtained by sealing a lead frame provided with semiconductor devices bonded so as to secure the wire span of about 6 mm with epoxy resin using a molding apparatus, then subjecting the interior of the resin sealed semiconductor devices to X-ray projection using a soft X-ray non-destructive inspection apparatus, measuring the deformed amount of 20 specimens at the portions where the wire deformation was the largest, and dividing the average of the deformed amount by the wire span length.

The bond strength of a ball bonding portion was measured by the shear test method wherein shear fracture strength was determined while moving a jig in parallel at the position 2 μm upward the aluminum pad and obtained by calculating the average of the fracture load of 20 specimens.

For evaluating the damage to a silicon substrate immediately under a ball joint, the ball joint and a pad film were removed with nitrohydrochloric acid and, after that, cracks and tiny pitting holes were observed with an optical microscope, an SEM or the like. 500 joints were observed and the results were expressed by the mark Δ, after judging that chip damages were detrimental in case that 3 or more of cracks 5 μm or more in size were observed, by the mark ○, after judging that chip damages were concerned but not detrimental in practical use in case that 1 to 3 of cracks were generated or 2 or more of pitting holes about 1 μm in size were observed, and by the mark ⊚, if the result was very good in case that no cracks were generated and the number of the pitting holes was 1 or less.

Wedge bondability when a wire was bonded to a lead was evaluated by performing the bonding of 1,000 pins at 250° C., which was the common stage temperature in lead frame connection, and the results were expressed by the mark Δ in case that joint was peeled off or the wire was not deformed in symmetrical shape, and by the mark ○ in case that such damage was not generated and the result was as good as a currently used general purpose gold bonding wire. Further, for evaluating the wedge bondability at a low temperature, which BGA, etc. require, the bonding of 1,000 pins at the stage temperature of 180° C. was performed, and the results were expressed by the mark ⊚, judging that the low temperature wedge bondability was also excellent in case that the all pins were successfully connected and the shapes of the bonding were also good.

TABLE 1

| | Test no. | Sample no. | Wire material | | | | | Mechanical properties of wire | | | Wire breakage during drawing | Pull strength (g) | Loop shape stability | Resin deformation rate (%) | Shear strength (g) | Damage beneath ball bond | Wedge bond-ability |
|---|---|---|---|---|---|---|---|---|---|---|---|---|---|---|---|---|---|
| | | | Core wire Diameter (μm) | (μm) of diffusion layer | Concentration and thickness | Peri-phery | Wire diameter (μm) | Pad material | Tensile strength (g) | Elastic modulus (kg/mm²) | Flexural rigidity (MPa) | | | | | | |
| Invention example | 1 | 1-a | Au—Cu3%-Ca0.1% 12 | Cu 0.5% 0.03 | | Au | 25 | Al alloy | 16.5 | 8700 | 101 | ○ | 6.2 | ○ | 6.9 | 23.0 | ○ | ◎ |
| | 2 | 1-b | Au—Cu3%-Ca0.1% 12 | Cu 1.2% 0.3 | | Au | 25 | Al alloy | 16.8 | 9100 | 105 | ○ | 6.4 | ○ | 6.7 | 23.2 | ○ | ◎ |
| | 3 | 1-c | Au—Cu3%-Ca0.1% 12 | Cu 1.2% 3 | | Au | 25 | Al alloy | 17.1 | 9800 | 122 | ○ | 7.6 | ○ | 5.6 | 23.1 | ○ | ◎ |
| | 4 | 2-a | Au—Cu5%-Pt1%-Be0.1% 12 | Cu0.8%-Pt0.5 2 | | Au | 25 | Cu | 17.0 | 9800 | 118 | ○ | 7.5 | ○ | 6.6 | 23.4 | ○ | ◎ |
| | 5 | 3-a | Au—Pd10%-Pt1% 9 | Pd 2% 1.5 | | Au | 25 | Al alloy | 17.2 | 9000 | 115 | ○ | 7.4 | ○ | 5.9 | 23.2 | ○ | ◎ |
| | 6 | 3-b | Au—Pd10%-Pt1% 20 | Pd 2% 1.5 | | Au | 25 | Al alloy | 18.1 | 9500 | 129 | ○ | 7.7 | ○ | 5.0 | 23.1 | ○ | ◎ |
| | 7 | 4-a | Au—Ag30%-Ni0.5% 12 | Ag 10% (Ni condensation) 8 | | Au | 25 | Al alloy | 17.0 | 9100 | 109 | ○ | 7.2 | ○ | 6.1 | 23.4 | ○ | ◎ |
| | 8 | 5-a | Au—Ca0.1%-La0.2%-Ce0.1% 8 | Ca0.08%-La0.1% 2.5 | | Au | 25 | Al alloy | 17.2 | 9400 | 120 | ○ | 7.4 | ○ | 6.2 | 23.5 | ○ | ◎ |
| | 9 | 5-b | Au—Ca0.1%-La0.2%-Ce0.1% 20 | Ca0.08%-La0.1% 2.5 | | Au | 25 | Al alloy | 18.0 | 10000 | 131 | ○ | 7.8 | ○ | 5.0 | 23.4 | ○ | ◎ |

TABLE 2

| | | | Wire material | | | | | Mechanical properties of wire | | | | | | | Resin | | Damage | | Wedge bond-ability |
|---|---|---|---|---|---|---|---|---|---|---|---|---|---|---|---|---|---|---|---|
| | Test no. | Sample no. | Core wire Diameter (μm) | Concentration and thickness (μm) of diffusion layer | Periphery | Wire diameter (μm) | Pad material | Tensile strength (g) | Elastic modulus (kg/mm²) | Flexural rigidity (MPa) | Wire breakage during drawing | Pull strength (g) | Loop shape stability | | deformation rate (%) | Shear strength (g) | beneath ball bond | | |
| Invention example | 10 | 6-a | Au—Al5%-Cr0.5% 12 | Al 1% (Cr condensation) 0.5 | Au | 25 | Al alloy | 17.4 | 9100 | 104 | ○ | 7.0 | ○ | | 6.4 | 23.0 | ○ | | ◎ |
| | 11 | 7-a | Cu—Au5% 15 | Au 1% 2 | Cu | 25 | Cu | 18.5 | 9500 | 120 | ○ | 8.0 | ○ | | 5.5 | 22.4 | ○ | | ◎ |
| | 12 | 8-a | Cu—Pd5%-Be1% 15 | Pd 1%-Be 0.2% 2 | Cu | 25 | Al alloy | 19.0 | 10000 | 128 | ○ | 8.2 | ○ | | 5.3 | 22.1 | ○ | | ◎ |
| | 13 | 9-a | Cu—Sn10%-Zn0.2% 15 | Sn 2% 0.5 | Cu | 20 | Al alloy | 13.5 | 9300 | 120 | ○ | 5.7 | ○ | | 5.2 | 22.0 | ○ | | ◎ |
| | 14 | 10-a | Pd—Au5%-Al0.1% 8 | Au 1.5% 2 | Pd | 25 | Al alloy | 18.2 | 9400 | 108 | ○ | 8.0 | ○ | | 5.0 | 21.8 | ○ | | ◎ |
| | 15 | 11-a | Pd—Cu2%-Ag1% 8 | Cu 0.8% 0.5 | Pd | 25 | Al alloy | 18.5 | 9700 | 115 | ○ | 8.1 | ○ | | 5.1 | 22.0 | ○ | | ◎ |
| | 16 | 12-a | Ag—Au2%-Pt1% 8 | Au0.5%-Pt0.4% 2 | Ag | 25 | Al alloy | 16.9 | 8700 | 103 | ○ | 7.0 | ○ | | 6.5 | 22.3 | ○ | | ◎ |
| | 17 | 13-a | Ag—Cu1%-Al1% 8 | Cu0.5%-Al0.3% 2 | Ag | 25 | Al alloy | 17.3 | 9000 | 108 | ○ | 7.1 | ○ | | 6.3 | 22.2 | ○ | | ◎ |
| | 18 | 14-a | Pt—Cu2%-Ag2% 8 | Cu1%-Ag0.8% 1 | Pt | 25 | Al alloy | 17.5 | 9200 | 120 | ○ | 7.9 | ○ | | 6.1 | 21.9 | ○ | | ◎ |
| | 19 | 15-a | Al—Si1%-Au0.5% 15 | Ag 25% 2 | Al | 25 | Al alloy | 17.0 | 9200 | 108 | ○ | 8.1 | ○ | | 6.4 | 22.4 | ○ | | ◎ |

TABLE 3

| | Test no. | Sample no. | Wire material Core wire Diameter (μm) | Concentration and thickness (μm) of Intermediate layer (diffusion layer or intermetallic compound layer) | Periphery | Wire diameter (μm) | Pad material | Mechanical properties of wire Tensile strength (g) | Elastic modulus (kg/mm²) | Flexural rigidity (MPa) | Wire breakage during drawing | Pull strength (g) | Loop shape stability | Resin deformation rate (%) | Shear strength (g) | Damage beneath ball bond | Wedge bond-ability |
|---|---|---|---|---|---|---|---|---|---|---|---|---|---|---|---|---|---|
| Invention example | 20 | 16-a | Au 13 | Cu 0.8% 0.01 | Au—Cu3% | 25 | Al alloy | 17.6 | 9500 | 115 | ○ | 8.0 | ○ | 6.7 | 22.5 | ○ | ○ |
| | 21 | 16-b | Au 12 | Cu 1% 2 | Au—Cu3% | 25 | Cu | 17.8 | 10200 | 130 | ○ | 8.2 | ○ | 6.3 | 22.7 | ○ | ○ |
| | 22 | 17-a | Au 13 | Pd 1% 1 | Au—Pd10%-Pt1% | 25 | Al alloy | 17.9 | 9500 | 122 | ○ | 7.4 | ○ | 5.7 | 23.0 | ○ | ○ |
| | 23 | 18-a | Au 13 | Ag 5% (Ni condensation) 2 (incl. diffusion layer) | Au—Ag20%-Ni0.5% | 25 | Al alloy | 17.4 | 9600 | 120 | ○ | 7.3 | ○ | 5.8 | 23.3 | ○ | ○ |
| | 24 | 19-a | Cu 12 | Au 1% 0.5 | Cu—Au5%-Y0.1% | 25 | Cu | 19.6 | 10500 | 132 | ○ | 8.8 | ○ | 4.8 | 22.8 | ○ | ○ |
| | 25 | 20-a | Cu 14 | CuBe/Pd 1.5% 2 (incl. diffusion layer) | Cu—Pd5%-Be1% | 25 | Al alloy | 20.2 | 10600 | 144 | ○ | 8.8 | ○ | 4.4 | 21.8 | ○ | ○ |
| | 26 | 21-a | Pd 15 | Au 2% 1 | Pd—Au5%-Al0.5% | 18 | Al alloy | 15.6 | 9300 | 128 | ○ | 5.8 | ○ | 5.2 | 21.5 | ○ | ○ |
| | 27 | 22-a | Ag 13 | Au1%-Pt0.2% 2 | Ag—Au2%-Pt0.6% | 25 | Al alloy | 18.0 | 9200 | 112 | ○ | 7.0 | ○ | 6.3 | 21.6 | ○ | ○ |
| | 28 | 23-a | Ag 15 | Cu0.5%-Al0.2% 4 | Ag—Cu1%-Al0.4% | 25 | Al alloy | 18.6 | 9400 | 114 | ○ | 7.4 | ○ | 6.2 | 23.0 | ○ | ○ |
| | 29 | 24-a | Pt 15 | Cu0.1%-Ag0.2% 2 | Pt—Cu2%-Ag2% | 25 | Al alloy | 19.8 | 9500 | 142 | ○ | 8.5 | ○ | 4.4 | 22.2 | ○ | ○ |

TABLE 4

| | | | Wire material | | | | | Mechanical properties of wire | | | Wire | | | Resin | | Damage | |
|---|---|---|---|---|---|---|---|---|---|---|---|---|---|---|---|---|---|
| | | | Core wire Diameter (μm) | Concentration and thickness (μm) of Intermediate layer (diffusion layer or intermetallic compound layer) | Periphery | Wire diameter (μm) | Pad material | Tensile strength (g) | Elastic modulus (kg/mm²) | Flexural rigidity (MPa) | breakage during drawing | Pull strength (g) | Loop shape stability | deformation rate (%) | Shear strength (g) | beneath ball bond | Wedge bondability |
| Test no. | Sample no. | | | | | | | | | | | | | | | | |
| Invention example | 30 | 25-a | Al 15 | Au 0.2% 3 | Al—Si1%-Au0.5% | 25 | Al alloy | 20.4 | 8800 | 112 | ○ | 7.4 | ○ | 6.5 | 20.6 | ○ | ○ |
| | 31 | 26-a | Au—Cu3%-Ca0.1% 12 | Cu0.5%-Pd0.4% 2 | Au—Pd2% | 25 | Al alloy | 21.5 | 10500 | 138 | ○ | 7.8 | ○ | 4.5 | 23.0 | ○ | ○ |
| | 32 | 27-a | Au—Ag20%-Pd2% 12 | Ag4%-Sn1% 2 | Au—Sn2%-Cu0.5% | 25 | Al alloy | 21.2 | 10800 | 139 | ○ | 8.5 | ○ | 4.5 | 21.8 | ○ | ○ |
| | 33 | 28-a | Au—Cu5%-Cr0.5% 12 | Au—Cu0.5%/Cu₃Pt 0.5 (incl. diffusion layer) | Au—Pt4%-Fe0.2% | 25 | Al alloy | 20.9 | 10500 | 146 | ○ | 8.4 | ○ | 3.7 | 22.3 | ○ | ○ |
| | 34 | 29-a | Cu—Pd5%-Be1% 15 | Au₃Pd 0.8 (incl. diffusion layer) | Cu—Au5% | 25 | Al alloy | 21.6 | 11000 | 157 | ○ | 8.3 | ○ | 3.8 | 21.9 | ○ | ○ |
| | 35 | 30-a | Pd—Cu2%-Al2% 8 | Au₅Al₂ 1 (incl. diffusion layer) | Pd—Au5%-Ag1% | 25 | Al alloy | 21.7 | 10500 | 158 | ○ | 8.7 | ○ | 4.0 | 21.8 | ○ | ○ |
| | 36 | 31-a | Ag—Cu1%-Al 0.2% 8 | Au1%-Cu0.5% 2 | Ag—Au2%-Pt0.5% | 25 | Al alloy | 19.8 | 9900 | 142 | ○ | 8.7 | ○ | 4.3 | 22.8 | ○ | ○ |
| | 37 | 32-a | Al—Si5%-Mg0.5% 10 | Si1%-Mg0.1% 1 | Al—Au0.5% | 25 | Al alloy | 19.8 | 9900 | 138 | ○ | 8.6 | ○ | 5.0 | 23.2 | ○ | ○ |

TABLE 5

| | Test no. | Sample no. | Wire material | | | | Wire diameter (µm) | Pad material | Mechanical properties of wire | | | Wire breakage during drawing | Pull strength (g) | Loop shape stability | Resin deformation rate (%) | Shear strength (g) | Damage beneath ball bond | Wedge bondability |
|---|---|---|---|---|---|---|---|---|---|---|---|---|---|---|---|---|---|---|
| | | | Core wire Diameter (µm) | Concentration and thickness (µm) of intermediate layer at interface between core wire and periphery | Periphery | Thickness (µm) and concentration of intermediate layer at interface between periphery and outermost surface layer | Thickness of outermost surface layer (µm) | | Tensile strength (g) | Elastic modulus (kg/mm²) | Flexural rigidity (MPa) | | | | | | | |
| Invention example | 38 | 16-c | Au 12 | Cu 1% 2 | Au—Cu3% | Cu 0.5% 0.1 | Au 0.5 | 25 | Al alloy | 18.1 | 10300 | 134 | ○ | 8.3 | ○ | 5.8 | 23.2 | ◎ | ◎ |
| | 39 | 22-b | Ag 12 | Au1%-Pt0.2% 2 | Ag—Au2%-Pt0.6% | Nil | Ag 1 | 25 | Al alloy | 19.6 | 10500 | 136 | ○ | 8.8 | ○ | 4.8 | 22.8 | ◎ | ◎ |
| | 40 | 26-b | Au—Cu3%-Ca0.1% 12 | Cu0.5%-Pd0.4% 2 | Au—Pd2% | Nil | Au 0.8 | 25 | Al alloy | 21.5 | 10500 | 144 | ○ | 8.0 | ○ | 4.3 | 23.0 | ◎ | ◎ |
| | 41 | 26-c | Au—Cu3%-Ca0.1% 12 | Cu0.5%-Pd0.4% 2 | Au—Pd2% | Pd 0.8% 0.3 | Au 1 | 25 | Al alloy | 22.2 | 10800 | 155 | ○ | 8.3 | ○ | 3.9 | 23.2 | ◎ | ◎ |
| | 42 | 29-b | Cu—Pd5%Be1% 15 | Au₃Pd 0.8 (incl. diffusion layer) | Cu—Au5% | Au 0.5% 0.3 | Cu 1 | 25 | Al alloy | 21.6 | 11000 | 162 | ○ | 8.3 | ○ | 3.6 | 21.9 | ◎ | ◎ |
| | 43 | 7-b | Cu—Au5% 15 | Au 1% 2 | Cu | Nil | Au 1 | 25 | Cu | 18.6 | 9700 | 131 | ○ | 8.3 | ○ | 4.6 | 22.6 | ○ | ◎ |
| | 44 | 15-b | Al—Si1%-Au0.5% 15 | Ag 25% 2 | Al | Au—Al 4% 0.3 | Au 1 | 25 | Al alloy | 17.5 | 9600 | 131 | ○ | 8.4 | ○ | 5.5 | 22.6 | ○ | ◎ |
| | 45 | 23-b | Ag 15 | Cu0.5%-Al 0.2% 4 | Ag—Cu1%-Al 0.4% | Nil | Pt 1 | 25 | Al alloy | 20.2 | 10700 | 146 | ○ | 8.5 | ○ | 4.3 | 22.0 | ○ | ◎ |
| | 46 | 29-b | Cu—Pd5%Be1% 15 | Au₃Pd 0.8 (incl. diffusion layer) | Cu—Au5% | Cu—Pd 2% 0.5 | Pd 0.4 | 20 | Al alloy | 22.0 | 11300 | 163 | ○ | 8.3 | ○ | 3.3 | 21.9 | ○ | ◎ |

TABLE 6

| | | | Wire material | | | Wire | | Mechanical properties of wire | | | | | Loop shape stability | Resin deformation rate (%) | Shear strength (g) | Damage beneath ball bond | Wedge bondability |
|---|---|---|---|---|---|---|---|---|---|---|---|---|---|---|---|---|---|
| Test no. | Sample no. | Core wire Diameter (μm) | Intermediate layer (diffusion layer or metallic compound layer) | Periphery | | diameter (μm) | Pad material | Tensile strength (g) | Elastic modulus (kg/mm²) | Flexural rigidity (MPa) | Wire breakage during drawing | Pull strength (g) | | | | | |
| Comparative example 1 | 1-d | Au—Cu3%-Ca0.1% 11 | Nil | Au | | 25 | Al alloy | 15.8 | 8100 | 75 | x | 5.5 | △ | 8.6 | 21.8 | ○ | △ |
| 2 | 5-c | Au—Ca0.1%-La0.1%-Y0.1% 8 | Nil | Au | | 25 | Al alloy | 15.8 | 8500 | 83 | x | 6.2 | △ | 8.2 | 22.6 | ○ | △ |
| 3 | 8-b | Cu—Pd5%-Be1% 15 | Nil | Cu | | 25 | Al alloy | 17.5 | 8900 | 88 | x | 6.3 | △ | 7.9 | 22.4 | ○ | △ |
| 4 | 17-b | Au 13 | Nil | Au—Pd10%-Pt1% | | 25 | Al alloy | 17.2 | 8500 | 92 | x | 6.4 | x | 8.0 | 20.4 | ○ | △ |
| 5 | 23-c | Ag 15 | Nil | Ag—Cu1%-Al0.4% | | 25 | Al alloy | 17.3 | 8500 | 89 | x | 6.5 | △ | 8.1 | 22.4 | ○ | △ |
| 6 | 26-c | Au—Cu3%-Ca0.1% 12 | Nil | Au—Pd2% | | 25 | Al alloy | 19.5 | 8800 | 90 | x | 6.4 | △ | 7.8 | 23.0 | ○ | △ |
| 7 | 30-b | Pd—Cu2%-Ag1% 8 | Nil | Pd—Au5%-Al0.1% | | 25 | Al alloy | 19.6 | 9000 | 96 | x | 6.4 | △ | 7.8 | 22.3 | ○ | △ |
| 8 | 33-a | Au—Cu3%-Ca0.1% 11 | Nil | Cu | | 25 | Al alloy | 18.2 | 9300 | 125 | x | 7.1 | x | 6.2 | 18.5 | △ | △ |
| 9 | 34-a | Pt 13 | Nil | Cu—Pd5%-Be1% 15 | | 25 | Al alloy | 17.3 | 9300 | 128 | x | 7.2 | x | 6.3 | 18.7 | △ | △ |
| 10 | 35-a | Au 13 | Nil | Pd | | 25 | Al alloy | 18.2 | 8800 | 116 | x | 6.8 | x | 7.0 | 18.5 | △ | △ |

TABLE 7

| | Test no. | Sample no. | Core wire Diameter (μm) | Intermediate layer at interface between core wire and periphery | Periphery | Intermediate layer at interface between periphery and outermost surface layer | Thickness of outermost surface layer (μm) | Wire diameter (μm) | Pad material |
|---|---|---|---|---|---|---|---|---|---|
| Comparative example | 11 | 16-c | Au 12 | Nil | Au—Cu3% | Nil | Au 0.5 | 25 | Al alloy |
| | 12 | 26-d | Au—Cu3%-Ca0.1% 12 | Nil | Au—Pd2% | Nil | Au 1 | 25 | Al alloy |
| | 13 | 29-b | Cu—Pd5%-Be1% 15 | Nil | Cu—Au5% | Nil | Pd 0.4 | 20 | Al alloy |

| | Test no. | Sample no. | Mechanical properties of wire | | | Wire breakage during drawing | Pull strength (g) | Loop shape stability | Resin deformation rate (%) | Shear strength (g) | Damage | |
|---|---|---|---|---|---|---|---|---|---|---|---|---|
| | | | Tensile strength (g) | Elastic modulus (kg/mm$^2$) | Flexural rigidity (MPa) | | | | | | beneath ball bond | Wedge bondability |
| Comparative example | 11 | 16-c | 16.9 | 8300 | 91 | x | 6.7 | Δ | 7.4 | 22.1 | ○ | Δ |
| | 12 | 26-d | 18.0 | 8800 | 95 | x | 6.5 | Δ | 7.2 | 22.2 | ○ | Δ |
| | 13 | 29-b | 17.9 | 8600 | 97 | x | 6.5 | Δ | 6.9 | 21.2 | ○ | Δ |

Tables 1 to 4 show the results of evaluating the intermediate-layered composite bonding wires according to the present invention. The examples 1 to 19 in Tables 1 and 2 show the results of the bonding wires according to the present invention (1), each of which comprises a metallic periphery, a core wire consisting of an alloy containing the metal of the periphery, and a diffusion layer between the periphery and the core wire. Likewise, the examples 20 to 30 in Tables 3 and 4 show the results of the wires according to the present invention (2), each of which comprises a metallic core wire, a periphery consisting of an alloy containing the metal of the core wire, and a diffusion layer formed between the periphery and the core wire, and the examples 29 to 35 in the same tables show the same of the wires according to the present invention (3), whose peripheries and core wires consist of alloys mainly composed of an element common to both. The examples 38 to 42 in Table 5 show the results of the bonding wires according to the present invention (4), each of which has an outermost surface layer composed of a metal common to the main element of the core wire and the periphery and formed outside each of the several kinds of intermediate-layered composite bonding wires shown in Tables 3 and 4 by vapor deposition, plating or the like, and, among the examples, the examples 38, 41 and 42 show the results of the bonding wires according to the present invention (5), each of which has an intermediate layer formed between the outermost surface layer and the periphery. The examples 43 to 46 in Table 5 show the results of the bonding wires according to the present invention (6), each of which has an outermost surface layer composed of a metal different from the main element of the core wire and the periphery.

On the other hand, Table 6 shows comparative examples each of which has a double layer structure only comprising a core wire and a periphery. Among those, the comparative examples 1 to 7 are the case of the double layer structure comprising the core wire and the periphery mainly composed of an element common to both, and the comparative examples 8 to 10 are the case of the double layer structure wire comprising the core wire and the periphery mainly composed of different elements. The comparative examples 11 to 13 in Table 7 are the ones to be compared with the examples of the triple layer structure shown in Table 5. In all of the comparative examples an intermediate layer is not formed between a core wire and a periphery.

The sample number shown in the tables is a number to classify and rearrange relevant samples. The first numeral means the sample number before conducting a diffusion heat treatment, and the succeeding letter (a, b, c, etc.) corresponds to the case that different diffusion treatments are applied to the same samples or the case that coating is applied on the outermost surface. For example, the examples 1 to 3 (Sample Nos. 1-a to 1-c), the examples 20 and 21 (Sample Nos. 16-a and 16-b) and the like are the results of the samples prepared so as to vary the thickness of the diffusion layer by changing the diffusion heat treatment conditions using wires each of which has a core wire and a periphery whose materials and proportions are identical. In contrast, the comparative example 1 (Sample No. 1-d) corresponds to the case that a diffusion heat treatment is not conducted to the same sample.

The conditions of the diffusion heat treatment are changed in accordance with the combination of the materials of a core wire and a periphery or the thickness of a diffusion layer or an intermetallic compound layer. For example, the example 1 is the case of annealing continuously at the rate of 40 m/sec. in a furnace of about 500° C., the example 3 is the case of heat-treating at the rate of 5 m/sec. and about 650° C., the example 14 at the rate of 40 m/sec. and about 550° C., and the example 29 at the rate of 2 m/sec. and about 750° C.

Figure 8:
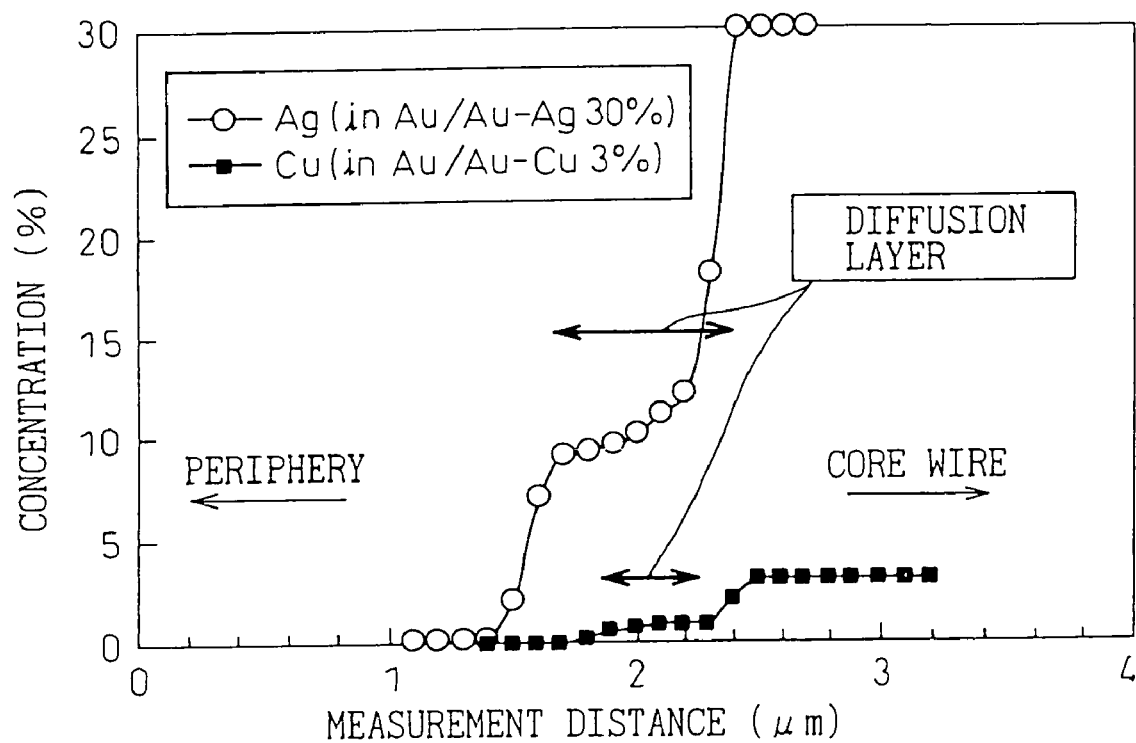
FIG. 8 is a graph showing the result of sectional line scanning using an Auger spectroscope of wires having different combinations of materials for the core wire and the periphery: it compares the Ag concentration in the diffusion layer of a wire comprising a periphery of Au and a core wire of Au-30% Ag alloy with the Cu concentration in the diffusion layer of a wire comprising a periphery of Au and a core wire of Au-3% Cu alloy.

The tables show the thicknesses and the concentrations of the diffusion layers or the intermetallic compound layers, or the compositions of chemical compounds and the like. These are results obtained by polishing the cross section of a wire and measuring an intermediate layer formed at the interface of a core wire and a periphery using an Auger spectroscope or an EPMA. FIGS. 8 and 9 show the examples of the measurement results obtained by line scanning with Auger spectroscopy. The line scanning is performed from a periphery to a core including an intermediate layer in between and a distance from an arbitrary position is shown along the horizontal axis of the graph. FIG. 8 shows the Ag concentration in the diffusion layer between the periphery of Au and the core wire of Au-30% Ag alloy and the Cu concentration in the diffusion layer between the periphery of Au and the core wire of Au-3%

Figure 9A:
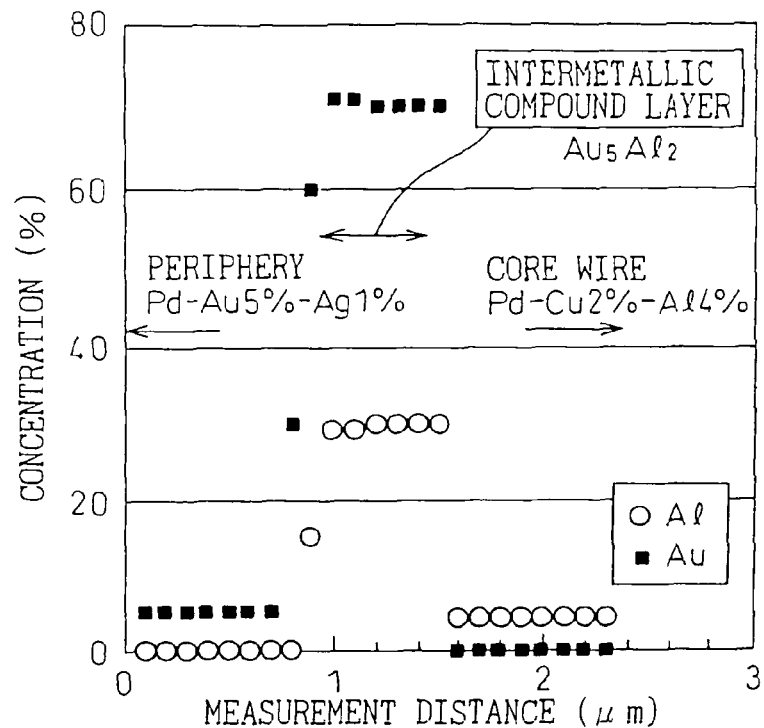
FIG. 9(a) is a graph showing the change of concentration of Au and Al in the intermetallic compound layer of a wire comprising a core wire of Pd-2% Cu-4% Al alloy and a periphery of Pd-5% Au-1% Ag alloy as the result of sectional line scanning, using an Auger spectroscope, of wire having different combination of materials for the core wire and the periphery.
Figure 9B:
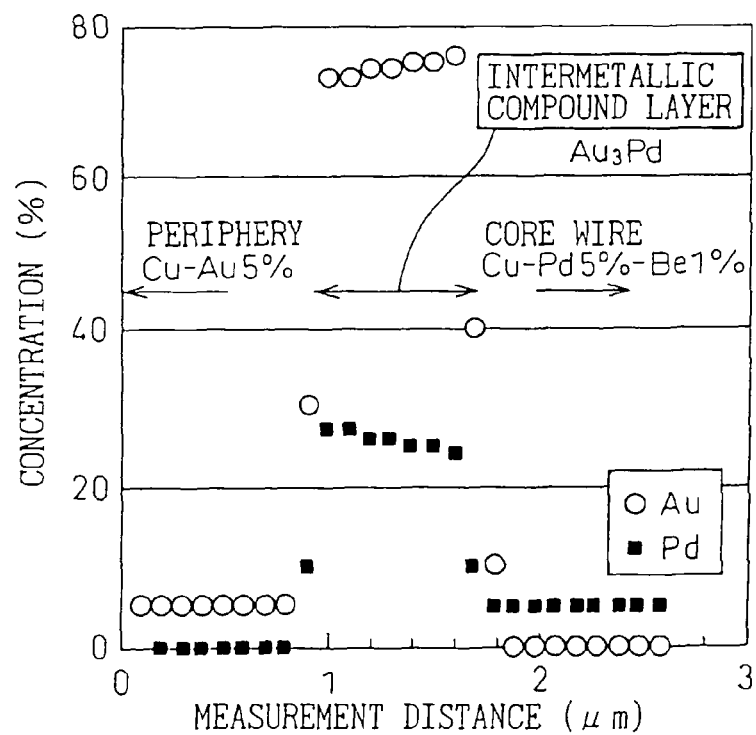
FIG. 9(b) is a graph showing the change of concentration of Pd and Au in the intermetallic compound layer of a wire comprising a core wire of Cu-5% Pd-1% aBe alloy and a periphery of Cu-5% Au alloy as the result of sectional line scanning, using an Auger spectroscope, of wire having different combination of materials for the core wire and the periphery.

Cu alloy, FIG. 9(a) the transition of the Au and Al concentrations in the intermetallic compound layer in the case of the core wire of Pd-2% Cu-4% Al alloy and the periphery of Pd-5% Au-1% Ag alloy, and FIG. 9(b) the transition of the Pd and Au concentrations in the intermetallic compound layer in the case of the core wire of Cu-5% Pd-1% Be alloy and the periphery of Cu-5% Au alloy. In any of the above results, the diffusion layers and the intermetallic compound layers formed inside the wires can be confirmed and further the thickness of each layer can be measured. For example, it was observed that the main intermetallic compounds are $Au_5Al_2$ phase in case of FIG. 9(a) and $Au_3Pd$ phase in case of FIG. 9(b). The thickness, composition, etc. shown in Tables 1 to 5 are also measured by the similar methods. The concentration of a diffusion layer shown in the tables is expressed by the average concentration in the diffusion layer even though the concentration in the diffusion layer may vary with gradient in some samples. For example, the range of the concentration in the diffusion layer is 1.5 to 2.5% for Pd in case of the example 5 and the same is 30 to 40% for Pd in case of the example 9. Major grown intermetallic compound phases are shown in the tables and they are expressed in the form of averaged compositions when the composition ratio varies to some extent due to a stoichiometric imperfection. There is a case that a diffusion layer and an intermetallic compound layer are determined simultaneously. For example, in the example 33, the diffusion layer of Au-0.5% Cu and the intermetallic compound layer of $Cu_3Pt$ are observed. Furthermore, the fact that a solute element concentrates in the vicinity of an intermediate layer such as a diffusion layer, an intermetallic compound layer and the like, was observed. For example, in example 7, Ni element concentrates by 10% or more compared with the addition amount to the core wire in the vicinity of an interface between a diffusion layer containing about 10% of Ag and a core wire.

Looking at the mass production of wires in the first place, the conventional wires of double layer structure shown in Table 6 cause wire breakage during wire drawing and thus a low yield, and show a bad appearance such as surface defects when the wires are observed with an SEM. In contrast, intermediate-layered composite bonding wires shown in Tables 1 to 4 have the least wire breakage during processing and have the least wire breakage.

It is determined that the bonding wires in which diffusion layers are formed as shown in Tables 1 and 2 are excellent in strength, elastic modulus, flexural rigidity, etc. even compared with the comparative examples 1 to 3 and suppress the wire deformation (resin deformation) during resin molding. In particular, it is considered that apparent increase of flexural rigidity caused by the formation of the diffusion layer yields an effect of suppressing wire deformation.

When comparing the examples 1 to 3 (Sample Nos. 1-a to 1-c) with the comparative example 1 (Sample No. 1-d), which are identically composed of peripheries of Au and core wires of Au-3% Cu-0.1% Ca alloy, as an example, it is confirmed that the mechanical properties improve as the thicknesses of the diffusion layers increase. For example, in the example 1, though the thickness of the diffusion layer L is as thin as 0.03 µm, improvements such as the enhancement of elastic modulus and flexural rigidity, the reduction of resin deformation, and the like are observed, comparing with the comparative example 1 (L=0). Further, in example 2 (L=0.3 µm), the improvement effect increases because it satisfies the condition of L>0.05 µm and the resin deformation rate can be suppressed to not more than 7% which has been a target. The reason why 7% is chosen as the target is that several kinds of general-purpose products of high purity Au bonding wires which are currently mainly used are evaluated and it is confirmed that the resin deformation rate is always 7% or more and consequently the suppression of resin deformation rate to not more than 7% has been used as a standard to improve the properties of a wire. Furthermore, in the example 3 (L=2 µm), in addition to the above effects, pull strength also increases and thus it is expected to be effective in suppressing the bending failure at the neck portions.

In addition, in case that the compositions of core wires, peripheries and intermediate layers are identical but the thickness of each is different, as seen in the examples 5 and 6, flexural rigidity increases and also the resin deformation decreases in the example 6 as a result of the diameter of the core wire being larger than that of the example 5 and the core wire being formed outward further than the intermediate layer of the example 5. Further, by comparing the example 8 with the example 9, a similar effect is confirmed.

Similar results are seen in Tables 3 and 4, and it was confirmed that elastic modulus and flexural rigidity can increase and resin deformation can decrease by forming an intermediate layer, comparing with the comparative examples 4 to 8 in Table 6. In case of Tables 3 and 4, the flexural rigidity increases by 10% and the resin deformation decreases by making the periphery composed of an alloy, comparing with the case of making the core wire composed of an alloy as seen in Tables 1 and 2. Further, in case of the examples 25 and 29, it is confirmed that higher effects are obtained by forming an intermetallic compound layer, comparing with the case of forming only a diffusion layer, and the resin deformation can be suppressed to 4.5% or less.

Whereas a silicon substrate right under a ball joint suffers damage such as cracks, etc. in case of the comparative examples 8 to 10 representing the wires having the conventional double layer structure wherein the main components of the core wire and the periphery are different metals, in the case of Tables 1 to 4, it is confirmed that, by adopting the same metal as the main components of the core wire and the periphery, the function to mitigate the hardening of a ball portion is effected and the damage to the silicon substrate is suppressed.

Figure 10A:
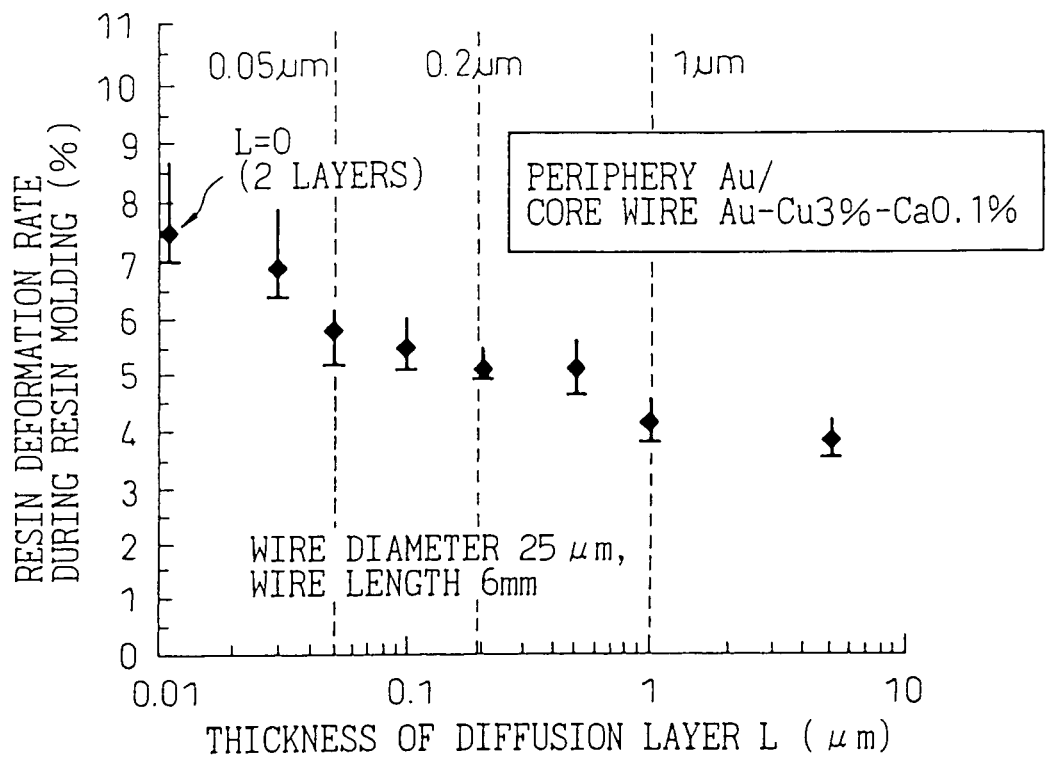
FIG. 10(a) is a graph showing wire deformation during resin molding in the case where a diffusion layer is formed in a wire, 25 μm in diameter, having a periphery of Au and a core wire of Au-3% Cu-0.1% Ca alloy.
Figure 10B:
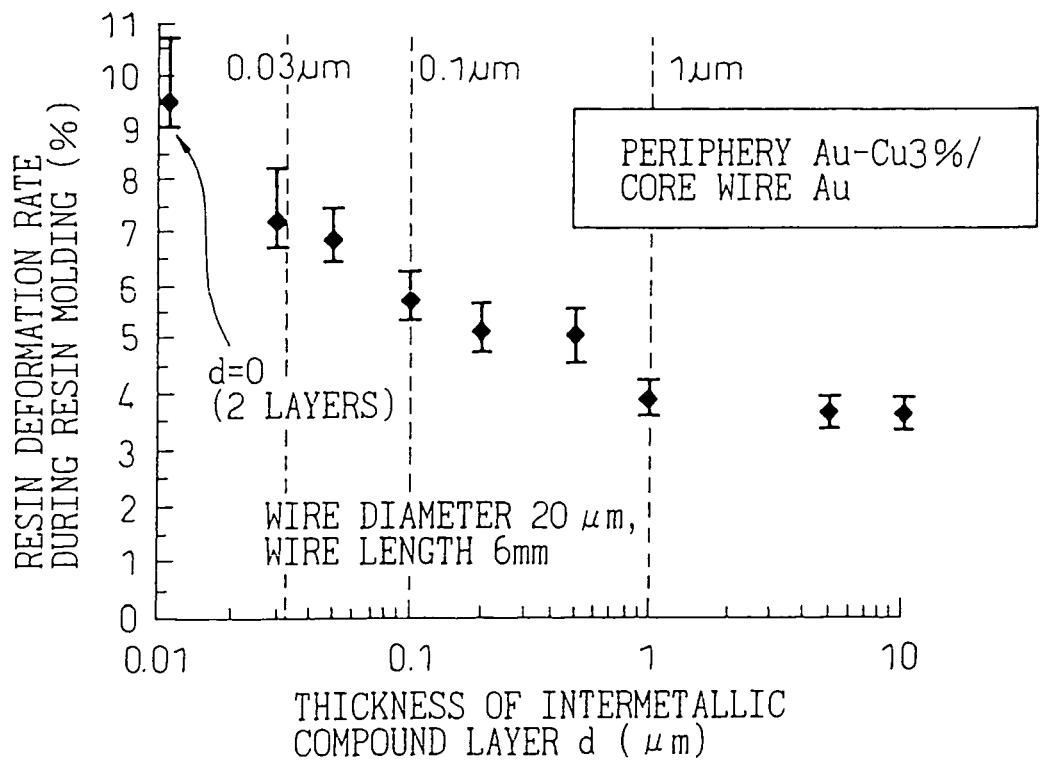
FIG. 10(b) is a graph showing wire deformation during resin molding in the case where an intermetallic compound layer is formed in a wire, 20 μm in diameter, having a core wire of Au and a periphery of Au-3% Cu alloy.

FIG. 10 shows the relation between the thickness of the diffusion layer or the intermetallic compound layer and the resin deformation. FIG. 10(a) represents the experimental result of the resin deformation rate in case of a wire 25 µm in diameter and 6 mm in length having a diffusion layer growing at the interface of the periphery of Au and the core wire of Au-3% Cu-0.1% Ca alloy, and FIG. 10(b) represents the experimental result in case of a wire 20 µm in diameter and 5 mm in length having mainly an intermetallic compound layer growing at the interface of the core wire of Au and the periphery of Au-3% Cu alloy. It is clear that, in both cases, the resin deformation is more suppressed as the thickness of a diffusion layer or an intermetallic compound layer increases. For example, in FIG. 10(a) showing the relation with the diffusion layer thickness L, the effect of suppressing the resin deformation appears when the diffusion layer thickness L is 0.05 µm or more and the effect intensifies when the thickness is 1.0 µm or more. Further, in FIG. 10(b) showing the relation with the intermetallic compound layer thickness d, it is confirmed that the effect of suppressing the resin deformation is substantial when the intermetallic compound layer thickness d is 0.05 µm or more, the effect intensifies when the thickness is 0.1 µm or more, and the effect further intensifies when the thickness is 1.0 µm or more.

Looking at the properties other than the resin deformation, in case of not forming an intermediate layer as seen in a wire having a double layer structure of Table 6 and a wire having a triple layer structure of Table 7, the loop shape varies, the loop stability is inconsistent, and the defects such as peeling off frequently occur also in the wedge bonding compared with a current gold bonding wire but, in case of an intermediate-layered composite bonding wire of Tables 1 to 5, it is confirmed that both of the loop stability and the wedge joint shape are good.

The examples 38 to 42 in Table 5 are the samples produced by forming the outermost surface layer mainly composed of the same element as the core wire and the periphery on the surface of each of the intermediate-layered composite bonding wires of the examples 20, 27, 31 and 34 in Tables 3 and 4, and, it is confirmed that, by taking the above measures, the wedge bondability at the low temperature of 180° C. improves and the chip damage right under the ball portions is also mitigated. Further, the examples 43 to 46 are the samples produced by forming the outermost surface layer mainly composed of an element which is different from the core wire and the periphery and moreover has less oxidizing capacity on the surface of each of the intermediate-layered composite bonding wires of the examples 11, 19, 28 and 34, and, by taking the above measures, the wedge bondability improves, properties such as flexural rigidity and the like also improve, and thus the effect of decreasing the resin deformation of the wire is obtained. In addition, the wedge-wedge bonding wherein a wire is directly bonded to a pad film on a chip is evaluated, and it is confirmed that, in case of the examples 1, 19, 24, etc., the bond strength is high, the incidence of bad wedge bonding at the low temperature of 180° C. remarkably decreases, and the resin deformation of the wire also decreases.

It is confirmed that the effect of the outermost surface layer on suppressing oxidization is maintained in case of the examples 43 to 46 even though the wires are tested after being exposed to the normal atmosphere for 6 months. From this result, it is also confirmed that no specific packaging is required and the aging is not a concern in case of the examples 43 to 46, though it has been believed that the packaging with gas substitution is required for reducing the oxidization at the time of delivery in case of the wires of examples 11, 19, 28, 34, etc.

When comparing the wires having the triple layer structure of a core wire, a periphery and an outermost surface layer, whereas, in case of the comparative examples 11 to 13 in Table 7, the wire breakage occurs during wire drawing and thus the yield deteriorates, and, in the evaluation of usability, loop shape varies and the bad shape of the wedge bonding appears, in case of the examples 38 to 46 shown in Table 5, by having the triple layer structure and forming the intermediate layer at their interface, the wire breakage during processing decreases to the least, the mass productivity improves, the loop shape and the shape of the wedge bonding are also good, moreover the strength, elastic modulus, flexural rigidity, etc. increase, and the effect on suppressing the resin deformation intensifies, and from those improvements, the effects by forming the intermediate layer is confirmed.

Example 2

These examples relates to bonding wires according to the items (7) to (11) of the present invention.

Each element of Au, Pt, Pd, Cu, Ag, Al, having the purity of about 99.99 mass % or more, Ni, about 99.9 mass % or more, and Fe, about 99 mass % or more was prepared in the state of grains or small fragments as a raw material.

In addition to those high purity materials, alloys such as Au alloy containing one or more elements of Ca, Be, In, Cu, Ag, Pt, Pd, etc. in the range of 0.001 to 1% in total, Cu alloy containing one or more elements of Be, Au, etc. in the range of 0.001 to 1% in total, Al alloy containing one or more elements of Si, Mg, Ag, Pt, Pd, etc. in the range of 0.01 to 1% in total, and the like were respectively produced by melting and casting in an ultrasound vacuum melting furnace.

The following two methods were adopted to produce intermediate-layered composite bonding wires whose core wires consist of different materials from the periphery materials.

The first method was a method to prepare a core wire and a periphery material separately, combine them and, after that, make the combined material thin up to a certain diameter by forging, rolling or the like, subject it to a diffusion heat treatment, and further make it thinner up to a final diameter by wire drawing thereafter (hereunder referred to as "insertion method"). In this example, a periphery material was produced by preparing a wire having the length of 10 cm and the diameter of about 5 mm and piercing it through to form a hole having a diameter in the range of 0.4 to 2.5 mm at the center of its cross section and a core material was produced so as to have a diameter equivalent to the diameter of the hole, each of them separately. The core wire was inserted in the hole of the periphery material, the thus produced material was processed by forging, rolling, die wire drawing and the like, and a wire having a diameter of 50 to 100 μm was produced. To subject the wire to a diffusion heat treatment, the wire was heat-treated while continuously transferring the wire at a speed of 0.01 to 40 m/sec. in a furnace where the temperature was set at 300 to 900° C. by using a horizontal infrared heating furnace having a soaking zone 20 cm in length. The wire subjected to the diffusion heat treatment was further drawn up to a final diameter of 20 to 30 μm by die wire drawing. Finally, the work induced strain of the wire was removed by heat-treating it in the aforementioned furnace and the properties of the wire were adjusted so that the elongation was about 4%.

The second method was a method to prepare a core wire whose diameter was reduced to a certain level, produce a periphery material with a different material so as to cover the core wire surface, subject the covered wire to a diffusion heat treatment thereafter, and then further make it thin up to a final diameter by wire drawing (hereunder referred to as "coating method"). In this example, a wire having a diameter of about 200 to 500 μm was prepared beforehand, the surface of the wire was coated with a periphery material in a thickness of 0.1 to 30 μm by vapor deposition, plating or the like, the coated wire was drawn to a diameter of 60 to 100 μm by die wire drawing, and thereafter the wire was subjected to a similar diffusion heat treatment using the aforementioned heating furnace. The wire subjected to the diffusion heat treatment was further drawn up to a final diameter of 20 to 30 μm by die wire drawing. Finally the work induced strain of the wire was removed and the wire was subjected to a heat treatment so that the elongation was about 4%.

To evaluate the mass production of wires, wire samples arranged so that the total weight of each wire was about 50 g were produced by the insertion method and measured was the frequency of the wire breakage when the wires were drawn into the diameter of 25 μm at a constant speed by using a die in the same series. The results were expressed by the mark ×, judging that the productivity was poor in case that the frequency of the wire breakage was 6 or more, by the mark Δ, because the productivity was insufficient in case that the same was 2 to 5, and by the mark ○, judging that the mass productivity was good in case that the same was 1 or less.

The tensile strength and elastic modulus of a wire were determined by carrying out the tensile tests using five wires having the length of 10 cm and calculating the average. The modulus of flexural rigidity was measured by the cantilever beam test method. More specifically, a wire 2 to 5 cm in length was fixed at one end, the distortion curve formed by the self-weight was measured, and the modulus of rigidity was analytically calculated from the amount of the distortion.

The connection of bonding wires was performed by ball/wedge bonding or wedge/wedge bonding using a commercially available automatic wire bonder. In the ball/wedge bonding method, a ball (initial ball diameter: 46 μm) was formed at the tip of a wire by arc discharge and bonded to a pad film on a silicon substrate, and the other end of the wire was bonded on a lead pad by wedge bonding. Here, in case of a wire containing Cu, Ag, Al, Ni, Fe elements and the like in the core wire or the periphery, the arc discharge was performed by blowing $N_2$ gas to the wire tip to suppress the oxidization when melting to form a ball. In case of the wedge/wedge bonding method, a wire was directly bonded to a pad film on a silicon substrate without forming a ball.

As a material to which a bonding wire was bonded, an Al alloy film (Al-1% Si-0.5% Cu) or a Cu film (Au 0.01 μm/ Ni 0.4 μm/ Cu 0.4 μm), which was a material of a pad film on a silicon substrate and had the thickness of 1 μm, was used. On the other hand, as a partner material for wedge bonding, a lead frame on the surface of which Ag plating (1 to 4 μm in thickness) was applied, or a glass fiber reinforced epoxy resin substrate on the surface of which an Au plated/Ni plated/Cu film was formed was used.

The pull test method was used to evaluate the strength at a neck portion (heat affected zone) near a ball portion. This was a method to measure fracture strength (pull strength) while hanging a dedicated hook on a portion closer to a ball bonding portion than the center portion of a bonded wire and pulling it upward, and the average of the data obtained from 20 test specimens was measured.

The stability of a loop shape at the bonding process was evaluated by observing 1,000 wires with a projector and expressed by the mark ×, judging that the stability was poor in case that the number of the wires wherein wire linearity, loop height and the like were inferior was 3 or more, by the mark ○ in case that the inferiority in stability was not observed, and by the mark Δ in case that the same number was 1 or 2 in between the above two cases. As one of the causes of the inferiority, it was confirmed that bad stability of a loop shape was generated in relation to insufficient adhesiveness at the interface between a core wire and a periphery material. Therefore, this evaluation method can be used as a method to determine such adhesiveness.

With regard to the measurement of wire deformation (hereunder referred to as "resin deformation") during resin molding, defined as the wire deformation after molding was a value (in percentage) obtained by molding a lead frame provided with semiconductor devices bonded so as to secure the wire span of about 6 mm with epoxy resin using a molding apparatus, then subjecting the interior of the resin sealed semiconductor devices to X-ray projection using a soft X-ray non-destructive inspection apparatus, measuring the deformed amount of 20 specimens at the portions where the wire deformation was the largest, and dividing the average of the deformed amount by the wire span length.

The bond strength of a ball bonding portion was measured by the shear test method wherein shear fracture strength was determined while moving a jig in parallel at the position 2 μm upward the aluminum pad and obtained by calculating the average of the fracture load of 20 specimens.

Wedge bondability when a wire was bonded to a lead was evaluated by performing the bonding of 1,000 pins at 250° C., which was the common stage temperature in lead frame connection, and the results were expressed by the mark Δ in case that joint was peeled off or the wire was not deformed in symmetrical shape, and by the mark ○ in case that such damages were not generated and the result was as good as a currently used general purpose gold bonding wire. Further, for evaluating the wedge bondability at a low temperature, which the BGA, etc. required, the bonding of 1,000 pins at the stage temperature of 180° C. was performed, and the results were expressed by the mark ⊙, judging that the low temperature wedge bondability was also excellent in case that the all pins were successfully connected and the shapes of the bonding were also good.

TABLE 8

| | Test no. | Sample no. | Wire material | | | Wire diameter (μm) | Pad material | Mechanical properties of wire | | | Wire breakage during drawing | Pull strength (g) | Loop shape stability | Resin deformation rate (%) | Shear strength (g) | Wedge bondability |
| | | | Core wire Diameter (μm) | Concentration and thickness (μm) of diffusion layer | Periphery | | | Tensile strength (g) | Elastic modulus (kg/mm²) | Flexural rigidity (MPa) | | | | | | |
|---|---|---|---|---|---|---|---|---|---|---|---|---|---|---|---|---|
| Invention example | 51 | a-1 | Ag 15 | Ag 4% 0.03 | Au | 25 | Al alloy | 16.9 | 8500 | 102 | ○ | 6.3 | ○ | 7.5 | 22.0 | ○ |
| | 52 | a-2 | Ag 15 | Ag 7% 0.06 | Au | 25 | Al alloy | 17.2 | 9000 | 110 | ○ | 6.5 | ○ | 6.5 | 22.2 | ○ |
| | 53 | a-3 | Ag 15 | Ag 10% 0.2 | Au | 25 | Cu | 17.5 | 9100 | 115 | ○ | 7.6 | ○ | 5.7 | 22.4 | ○ |
| | 54 | a-4 | Ag 15 | Ag 48% 2 | Au | 26 | Al alloy | 17.8 | 9250 | 120 | ○ | 7.8 | ○ | 4.8 | 22.6 | ○ |
| | 55 | b-1 | Au 12 | Ag 6% 2 | Ag | 25 | Al alloy | 17.7 | 9200 | 118 | ○ | 8.0 | ○ | 4.8 | 23.0 | ○ |
| | 56 | c-1 | Pt 20 | Pt 22% 0.2 | Au | 25 | Al alloy | 18.5 | 9400 | 118 | ○ | 8.0 | ○ | 4.6 | 22.2 | ○ |
| | 57 | c-2 | Pt 20 | Pt 45% 2 | Au | 25 | Al alloy | 18.7 | 9450 | 126 | ○ | 8.1 | ○ | 4.5 | 22.3 | ○ |
| | 58 | d-1 | Ag 15 | Ag 30% 2 | Pd | 25 | Al alloy | 19.2 | 9550 | 123 | ○ | 8.2 | ○ | 4.5 | 22.4 | ○ |
| | 59 | e-1 | Pd 20 | Pd 40% 2 | Pt | 25 | Al alloy | 19.6 | 9700 | 129 | ○ | 8.4 | ○ | 4.3 | 22.0 | ○ |
| | 60 | f-1 | Fe 5 | Fe 5% 0.5 | Au | 20 | Al alloy | 13.3 | 10600 | 138 | ○ | 5.6 | ○ | 4.2 | 20.9 | ○ |
| | 61 | g-1 | Ni 8 | Ni 6% 2 | Pt | 25 | Al alloy | 20.4 | 10700 | 139 | ○ | 8.8 | ○ | 4.0 | 21.0 | ○ |
| | 62 | h-1 | Cu 15 | Cu 15% 0.5 | Au alloy | 25 | Al alloy | 19.3 | 9900 | 136 | ○ | 8.7 | ○ | 4.1 | 22.6 | ○ |
| | 63 | i-1 | Ag 15 | Ag 25% 2 | Cu alloy | 25 | Al alloy | 19.1 | 9850 | 131 | ○ | 8.2 | ○ | 4.1 | 22.2 | ○ |

TABLE 9

| | | Wire material | | | | | Mechanical properties of wire | | | Wire | | Loop | Resin | Shear | Wedge |
|---|---|---|---|---|---|---|---|---|---|---|---|---|---|---|---|
| | | Core wire Diameter (μm) | Composition and thickness (μm) of Intermediate layer (diffusion layer or intermetallic compound layer) | Periphery | Wire diameter (μm) | Pad material | Tensile strength (g) | Elastic modulus (kg/mm²) | Flexural rigidity (MPa) | breakage during drawing | Pull strength (g) | shape stability | deformation rate (%) | strength (g) | bond-ability |
| Test no. | Sample no. | | | | | | | | | | | | | | |
| Invention example | | | | | | | | | | | | | | | |
| 64 | j-1 | Cu 17 | CuAu 0.01 | Au | 25 | Al alloy | 18.1 | 8700 | 105 | ○ | 7.0 | ○ | 7.1 | 22.5 | ○ |
| 65 | j-2 | Cu 17 | CuAu 0.03 | Au | 25 | Al alloy | 18.4 | 9250 | 125 | ○ | 7.2 | ○ | 5.5 | 22.7 | ○ |
| 66 | j-3 | Cu 17 | CuAu 0.1 | Au | 25 | Cu | 18.6 | 9500 | 138 | ○ | 7.7 | ○ | 4.5 | 2.3 | ○ |
| 67 | j-4 | Cu 17 | Cu₃Au, CuAu 10 (incl. diffusion layer) | Au | 25 | Al alloy | 21.1 | 11100 | 162 | ○ | 9.2 | ○ | 3.1 | 23.3 | ○ |
| 68 | k-1 | Au 10 | Cu₃Au, CuAu 2 (incl. diffusion layer) | Cu | 25 | Al alloy | 20.0 | 11300 | 155 | ○ | 8.5 | ○ | 3.4 | 22.8 | ○ |
| 69 | L-1 | Pd 15 | AuPd₃ 0.1 | Au | 25 | Al alloy | 20.7 | 9900 | 152 | ○ | 8.8 | ○ | 3.3 | 21.8 | ○ |
| 70 | L-2 | Pd 15 | AuPd₃ 2 (incl. diffusion layer) | Au | 25 | Al alloy | 21.2 | 10800 | 158 | ○ | 9.1 | ○ | 3.4 | 21.5 | ○ |
| 71 | m-1 | Cu 14 | Cu₃Pd 2 | Pd | 25 | Al alloy | 21.4 | 10600 | 161 | ○ | 9.0 | ○ | 3.4 | 21.6 | ○ |
| 72 | n-1 | Al 7 | Au₅Al₂ 2 | Au | 25 | Al alloy | 20.3 | 10100 | 155 | ○ | 8.5 | ○ | 3.7 | 23.0 | ○ |
| 73 | o-1 | Ag 10 | Ag₂Al 2 | Al | 25 | Al alloy | 20.4 | 10300 | 144 | ○ | 8.8 | ○ | 3.7 | 22.2 | ○ |
| 74 | g-1 | Fe 5 | Pd₃Fe 0.5 | Pd | 25 | Al alloy | 22.0 | 11500 | 166 | ○ | 9.0 | ○ | 3.1 | 20.6 | ○ |
| 75 | h-1 | Al 10 | Au₅Al₂, AuAl 2 | Au alloy | 19 | Al alloy | 14.2 | 11300 | 165 | ○ | 5.7 | ○ | 3.2 | 23.0 | ○ |
| 76 | i-1 | Cu alloy 17 | Cu₃Al₂, CuAl₂ 2 (incl. diffusion layer) | Al | 25 | Al alloy | 21.8 | 11400 | 160 | ○ | 9.0 | ○ | 3.2 | 21.8 | ○ |
| 77 | j-1 | Au 17 | Au₃Pd 2 | Pd alloy | 25 | Al alloy | 21.7 | 11500 | 165 | ○ | 9.0 | ○ | 3.1 | 22.3 | ○ |
| 78 | k-1 | Cu alloy 12 | Cu₃Au, CuAu 2 (incl. diffusion layer) | Au alloy | 25 | Cu | 22.1 | 11500 | 168 | ○ | 9.2 | ○ | 3.0 | 23.2 | ○ |

TABLE 10

| | Test no. | Sample no. | Core wire Diameter (μm) | Thickness (μm) and concentration of intermediate layer at interface between core wire and periphery | Periphery | Thickness (μm) and concentration of intermediate layer at interface between periphery and outermost surface layer | Thickness of outermost surface layer (μm) | Wire diameter (μm) | Pad material |
|---|---|---|---|---|---|---|---|---|---|
| Invention example | 79 | b-2 | Au 12 | Ag 6% 2 | Ag | Nil | Au 0.1 | 25 | Al alloy |
| | 80 | i-2 | Ag 15 | Ag 25% 2 | Cu alloy | Nil | Au 1 | 25 | Al alloy |
| | 81 | k-2 | Au 10 | Cu₃Au. CuAu 2 (incl. diffusion layer) | Cu | Nil | Au 0.5 | 25 | Al alloy |
| | 82 | m-2 | Cu 14 | Cu₃Pd 2 | Pd | Nil | Pt 2 | 25 | Al alloy |

| | Test no. | Sample no. | Mechanical properties of wire | | | Wire breakage during drawing | Pull strength (g) | Loop shape stability | Resin deformation rate (%) | Shear strength (g) | Wedge bond-ability |
|---|---|---|---|---|---|---|---|---|---|---|---|
| | | | Tensile strength (g) | Elastic modulus (kg/mm²) | Flexural rigidity (MPa) | | | | | | |
| Invention example | 79 | b-2 | 17.7 | 10100 | 121 | ○ | 8.0 | ○ | 4.8 | 23.0 | ⊚ |
| | 80 | i-2 | 19.1 | 10100 | 133 | ○ | 8.2 | ○ | 3.9 | 22.2 | ⊚ |
| | 81 | k-2 | 20.0 | 11400 | 157 | ○ | 8.5 | ○ | 3.3 | 22.8 | ⊚ |
| | 82 | m-2 | 21.4 | 10800 | 163 | ○ | 9.0 | ○ | 3.3 | 21.6 | ⊚ |

TABLE 11

| | Test no. | Sample no. | Core wire Diameter (μm) | Thickness (μm) and composition of intermediate layer at interface between core wire and middle layer | Middle layer | Thickness (μm) and composition of intermediate layer at interface between middle layer and periphery | Thickness of periphery (μm) | Wire diameter (μm) | Pad material |
|---|---|---|---|---|---|---|---|---|---|
| Invention example | 83 | p-1 | Pd 10 | Ag 30% 0.5 | Ag | Ag 10% 1 | Au 10 | 25 | Al alloy |
| | 84 | q-1 | Pd 10 | AuPd₃ 0.5 | Au | Au₅Al₂ 0.5 | Al 3 | 25 | Al alloy |
| | 85 | r-1 | Pt alloy 20 | Pt 25% 0.5 | Au | Cu₃Au. CuAu 2 (incl. diffusion layer) | Cu 3 | 25 | Cu |
| | 86 | s-1 | Au alloy 5 | CuAu 0.8 | Cu | CuAu 0.5 | Au 6 | 25 | Al alloy |
| | 87 | t-1 | Cu 13 | Cu₃Pd 0.5 | Pd | AuPd₃ 8 (incl. diffusion layer) | Au alloy 1 | 20 | Al alloy |

| | Test no. | Sample no. | Mechanical properties of wire | | | Wire breakage during drawing | Pull strength (g) | Loop shape stability | Resin deformation rate (%) | Shear strength (g) | Wedge bond-ability |
|---|---|---|---|---|---|---|---|---|---|---|---|
| | | | Tensile strength (g) | Elastic modulus (kg/mm²) | Flexural rigidity (MPa) | | | | | | |
| Invention example | 83 | p-1 | 21.5 | 11700 | 145 | ○ | 8.8 | ○ | 2.5 | 22.0 | ⊚ |
| | 84 | q-1 | 22.2 | 11800 | 140 | ○ | 9.1 | ○ | 2.5 | 22.4 | ○ |
| | 85 | r-1 | 23.3 | 12000 | 145 | ○ | 9.0 | ○ | 2.3 | 22.3 | ○ |
| | 86 | s-1 | 23.1 | 12100 | 138 | ○ | 9.1 | ○ | 2.4 | 20.9 | ⊚ |
| | 87 | t-1 | 14.5 | 12000 | 140 | ○ | 6.0 | ○ | 3.6 | 20.9 | ⊚ |

TABLE 12

| | Test no. | Sample no. | Wire material | | | Wire diameter (μm) | Pad material |
|---|---|---|---|---|---|---|---|
| | | | Core wire Diameter (μm) | Intermediate layer (diffusion layer or intermetallic compound layer) | Periphery | | |
| Comparative example | 21 | a-5 | Ag 15 | Nil | Au | 25 | Al alloy |
| | 22 | c-3 | Pt 20 | Nil | Au | 25 | Al alloy |
| | 23 | e-2 | Pd 20 | Nil | Pt | 25 | Al alloy |
| | 24 | f-1 | Fe 5 | Nil | Au | 20 | Al alloy |
| | 25 | j-5 | Cu 17 | Nil | Au | 25 | Al alloy |
| | 26 | L-3 | Pd 15 | Nil | Au | 25 | Al alloy |
| | 27 | m-2 | Cu 14 | Nil | Pd | 25 | Al alloy |

| | Test no. | Sample no. | Mechanical properties of wire | | | Wire breakage during drawing | Pull strength (g) | Loop shape stability | Resin deformation rate (%) | Shear strength (g) | Wedge bondability |
|---|---|---|---|---|---|---|---|---|---|---|---|
| | | | Tensile strength (g) | Elastic modulus (kg/mm²) | Flexural rigidity (MPa) | | | | | | |
| Comparative example | 21 | a-5 | 16.5 | 8100 | 70 | x | 6.1 | Δ | 8.6 | 21.9 | Δ |
| | 22 | c-3 | 17.7 | 8700 | 83 | x | 6.2 | Δ | 8.3 | 22.4 | Δ |
| | 23 | e-2 | 18.6 | 9000 | 95 | Δ | 6.2 | Δ | 8.0 | 22.3 | Δ |
| | 24 | f-1 | 12.2 | 9200 | 98 | x | 4.9 | x | 9.5 | 20.1 | Δ |
| | 25 | j-5 | 17.5 | 8800 | 88 | x | 6.1 | x | 8.7 | 22.7 | Δ |
| | 26 | L-3 | 18.3 | 8900 | 90 | x | 6.4 | Δ | 8.4 | 23.0 | Δ |
| | 27 | m-2 | 18.6 | 9100 | 97 | x | 6.4 | Δ | 7.9 | 22.4 | Δ |

TABLE 13

| | Test no. | Sample no. | Wire material | | | | | Wire diameter (μm) | Pad material |
|---|---|---|---|---|---|---|---|---|---|
| | | | Core wire Diameter (μm) | Intermediate layer at interface between core wire and middle layer | Middle layer | Intermediate layer at interface between middle layer and periphery | Thickness of periphery (μm) | | |
| Comparative example | 28 | p-2 | Pd 10 | Nil | Ag | Nil | Au 10 | 25 | Al alloy |
| | 29 | q-2 | Pd 10 | Nil | Au | Nil | Al 3 | 25 | Al alloy |
| | 30 | s-2 | Au alloy 5 | Nil | Cu | Nil | Au 6 | 20 | Al alloy |

| | Test no. | Sample no. | Mechanical properties of wire | | | Wire breakage during drawing | Pull strength (g) | Loop shape stability | Resin deformation rate (%) | Shear strength (g) | Wedge bondability |
|---|---|---|---|---|---|---|---|---|---|---|---|
| | | | Tensile strength (g) | Elastic modulus (kg/mm²) | Flexural rigidity (MPa) | | | | | | |
| Comparative example | 28 | p-2 | 17.4 | 8800 | 92 | x | 6.7 | Δ | 7.4 | 22.0 | Δ |
| | 29 | q-2 | 17.8 | 8800 | 94 | x | 6.3 | Δ | 7.9 | 22.4 | Δ |
| | 30 | s-2 | 16.8 | 8500 | 89 | x | 5.5 | Δ | 8.8 | 20.9 | Δ |

Tables 8 and 9 show the results of evaluating the intermediate-layered composite bonding wires according to the present invention. They are classified by the types of the intermediate layers formed at the interface of the core wire and the periphery. The examples 51 to 63 in Table 8 are the case that only the diffusion layers are formed, and the examples 64 to 78 in Table 9 are the case that the intermetallic compound layers (partly include the diffusion layers) are formed. The examples 79 to 82 in Table 10 are the case of the bonding wires each of which comprises an outermost surface layer, a periphery, an intermediate layer and a core wire, and the outermost surface layer being formed outside the intermediate-layered composite bonding wire by vapor deposition, plating or the like, and the examples 83 to 87 in Table 11 are the case of the wires each of which has a triple layer structure of a core wire, a middle layer and a periphery and moreover has an intermediate layer at the interfaces. On the other hand, the comparative examples 21 to 27 in Table 12 are the case that a wire has a double layer structure of a core wire and a periphery, and the comparative examples 28 to 30 in Table 13 are the case that a wire has a triple layer structure. Those comparative examples are not subjected to a diffusion heat treatment and therefore have no intermediate layer, though the materials and the proportions of the compositions of the core wires and the peripheries are identical with the wires described in Tables 8, 9 and 11.

The sample number shown in the tables is a number to classify and rearrange relevant samples. The letter (a, b, c, etc.) means the samples before subjected to a diffusion heat treatment and the succeeding numeral means that different diffusion treatments are applied to the same samples. For example, the examples 51 to 54 (Sample Nos. a-1 to a-4), the examples 64 to 67 (Sample Nos. j-1 to j-4) and the like are the results of the samples prepared so as to vary the thickness of the diffusion layer by changing the diffusion heat treatment conditions using wires each of which has a core wire and a periphery whose materials and proportions are identical. In contrast, the comparative examples 21 (Sample No. a-5) and 25 (Sample No. j-5) correspond to the case that a diffusion heat treatment is not conducted on the same sample.

The conditions of the diffusion heat treatment are changed in accordance with the combination of the materials of a core wire and a periphery or the thickness of a diffusion layer or an intermetallic compound layer. For example, the example 51 is the case of annealing continuously at the rate of 40 m/sec. in a furnace of about 500° C., the example 53 is the case of heat-treating at the rate of 5 m/sec. and about 650° C., the example 65 at the rate of 40 m/sec. and about 550° C., and the example 66 at the rate of 2 m/sec. and about 750° C.

Figure 11:
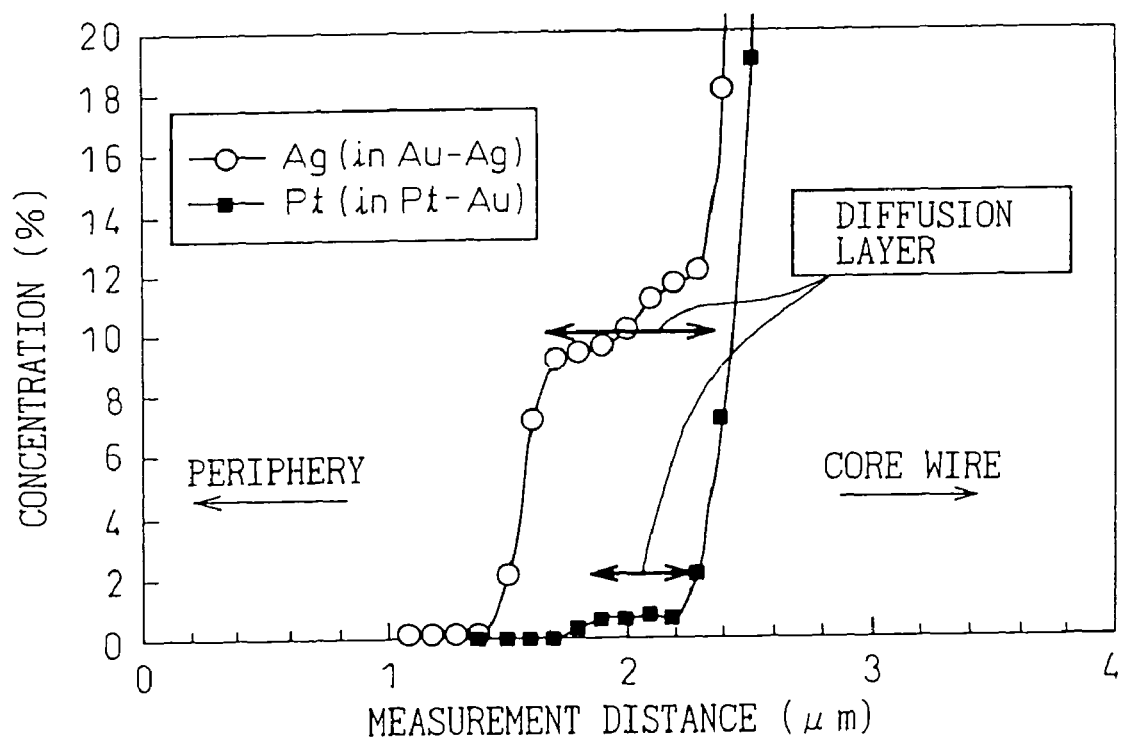
FIG. 11 is a graph showing the result of sectional line scanning, using an Auger spectroscope, of wires having different combinations of materials for the core wire and the periphery: it compares the concentration changes of the element Ag in an Au—Ag combination and the element Pt in a Pt—Au combination.
Figure 12A:
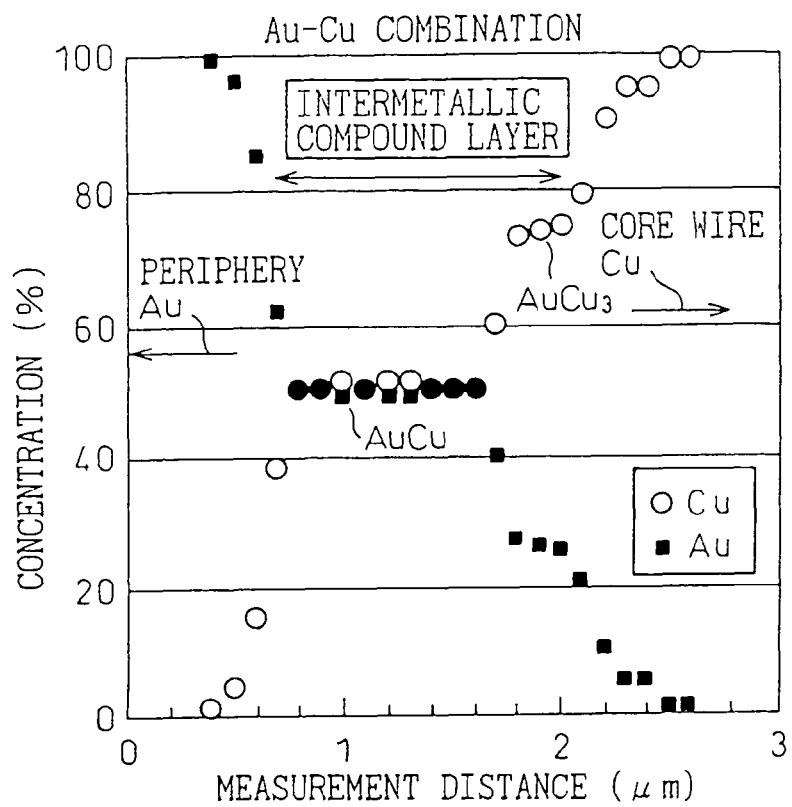
FIG. 12(a) is a graph showing an analysis result of an intermetallic compound layer formed at an interface of an Au—Cu combination as a result of sectional line scanning, using an Auger spectroscope, of a wire having different combination of materials for the core wire and the periphery.
Figure 12B:
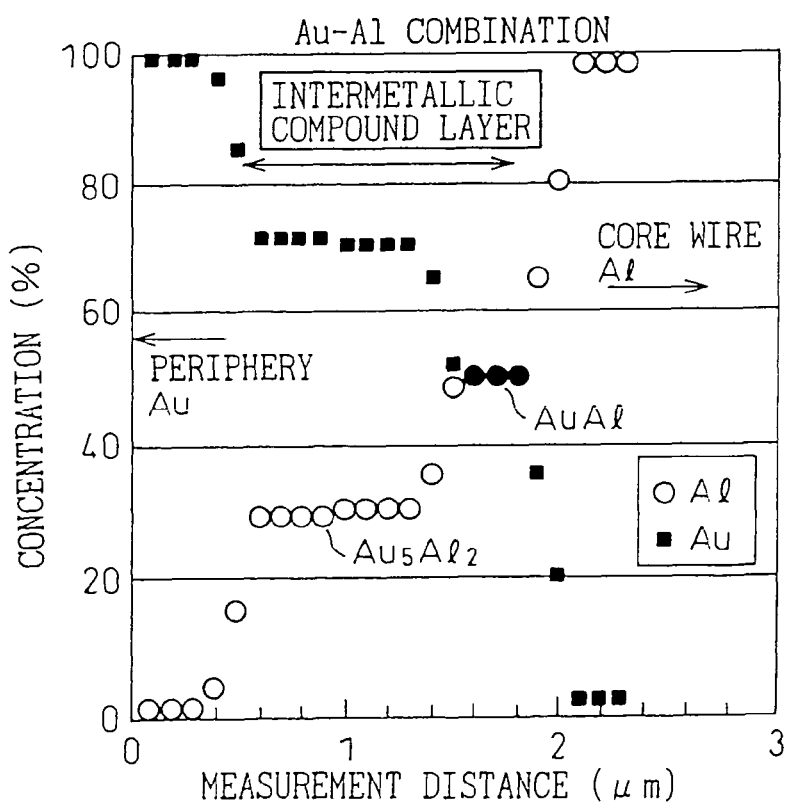
FIG. 12(b) is a graph showing an analysis result of an intermetallic compound layer formed at an interface of an Au—Al combination as a result of sectional line scanning, using an Auger spectroscope, of a wire having different combination of materials for the core wire and the periphery.

The tables show the thicknesses and concentrations of the diffusion layers or the intermetallic compound layers, or the compositions of chemical compounds and the like. Those are the results obtained by polishing the cross section of a wire and measuring an intermediate layer formed at the interface of a core wire and a periphery using an Auger spectroscope or an EPMA. FIGS. 11 and 12 show the examples of the measurement results obtained by line scanning with Auger spectroscopy. The line scanning is performed from a periphery to a core wire including an intermediate layer in between and a distance from an arbitrary position is shown along the horizontal axis of the graph. FIG. 11 shows the Ag concentration in the diffusion layer between the core wire of Ag and the periphery of Au and the Pt concentration in the diffusion layer between the core wire of Pt and the periphery of Au, FIG. 12($a$) the transition of the Au and Cu concentrations in the intermetallic compound layer in the case of the core wire of Cu and the periphery of Au, and FIG. 12($b$) the transition of the Al and Au concentrations in the intermetallic compound layer in the case of the core wire of Al and the periphery of Au. In any of the above results, the diffusion layers and the intermetallic compound layers formed inside the wires can be confirmed and further the thickness of each layer can be measured. For example, it is observed that the main intermetallic compounds are AuCu and $AuCu_3$ phases in case of FIG. 12($a$) and $Au_5Al_2$ and AuAl phases in case of FIG. 12($b$). The thickness, composition, etc. measured by the similar methods are shown in Tables 8 to 11. The concentration of a diffusion layer shown in the tables is expressed by the average concentration in the diffusion layer even though the concentration in the diffusion layer may vary with gradient in some samples. For example, the range of the concentration in the diffusion layer is 45 to 55% for Ag in case of the example 54 and the same is 30 to 40% for Pd in case of the example 59. Major grown intermetallic compound phases are also shown in the tables and they are expressed in the form of averaged compositions when the composition ratio varies to some extent due to a stoichiometric imperfection. Furthermore, observed is a fact that a solute element concentrates in the vicinity of an intermediate layer such as a diffusion layer, an intermetallic compound layer and the like. For example, it is confirmed that, in the example 63, the elements of Pd, Pt, etc. concentrate by 10% or more compared with the original contents in the vicinity of an interface between the periphery of the Cu alloy and the intermetallic compound and, in the example 25, the elements of Cu, Pd, etc. concentrate by 20% or more compared with the original contents in the vicinity of an interface between the Au periphery and the intermetallic compound.

Looking at the mass productivity of wires in the first place, the conventional wires of double layer structure shown in Table 12 cause wire breakage during wire drawing and thus low yield, and show bad appearance such as surface defects when the wires are observed with an SEM. In contrast, intermediate-layered composite bonding wires shown in Tables 8 and 9 have the least wire breakage during processing and no problem in appearance.

It is determined that the bonding wires in which diffusion layers are formed as shown in Table 8 are excellent in strength, elastic modulus, flexural rigidity, etc. even comparing with the comparative examples 21 to 24 and suppress the wire deformation (resin deformation) during resin molding. In particular, it is considered that apparent increase of flexural rigidity caused by the formation of the diffusion layer yields an effect to suppress wire deformation.

When comparing the examples 51 to 54 (Sample Nos. a-1 to a-4) with the comparative example 21 (Sample No. a-5), which are identically composed of the core wire of Ag and the periphery of Au, as an example, it is confirmed that the mechanical properties improve as the thicknesses of the diffusion layers increase. For example, in the example 1, though the thickness of the diffusion layer L is as thin as 0.03 μm, improvements such as the enhancement of elastic modulus and flexural rigidity, the reduction of resin deformation, and the like are observed, comparing with the comparative example 21 (L=0). Further, in example 52 (L=0.06 μm), the improvement effect increases because it satisfies the condition of L>0.05 μm and the resin deformation rate can be suppressed to not more than 7% less which has been a target. The reason why 7% is chosen as the target is that several kinds of general-purpose products of high purity Au bonding wires which are currently mainly used were evaluated and it was confirmed that the resin deformation rate is always 7% or more and consequently the suppression of resin deformation rate to not more than 7% has been used as a standard to improve the properties of a wire. Furthermore, in the example 53 (L=0.2 μm), in addition to the above effects, pull strength also increases and thus it is expected to be effective in suppressing the bending failure at the neck portions.

Similar results are seen in Table 9, and it is confirmed that elastic modulus and flexural rigidity can increase and resin deformation can decrease by forming an intermetallic compound, comparing with the comparative examples 25 to 27 in Table 12. Further, comparing with the case of forming only a diffusion layer shown in Table 8, higher effects are obtained by forming an intermetallic compound layer in the case shown in Table 9. For example, it is confirmed that the resin deformation can be suppressed up to 4% or less.

Figure 13A:
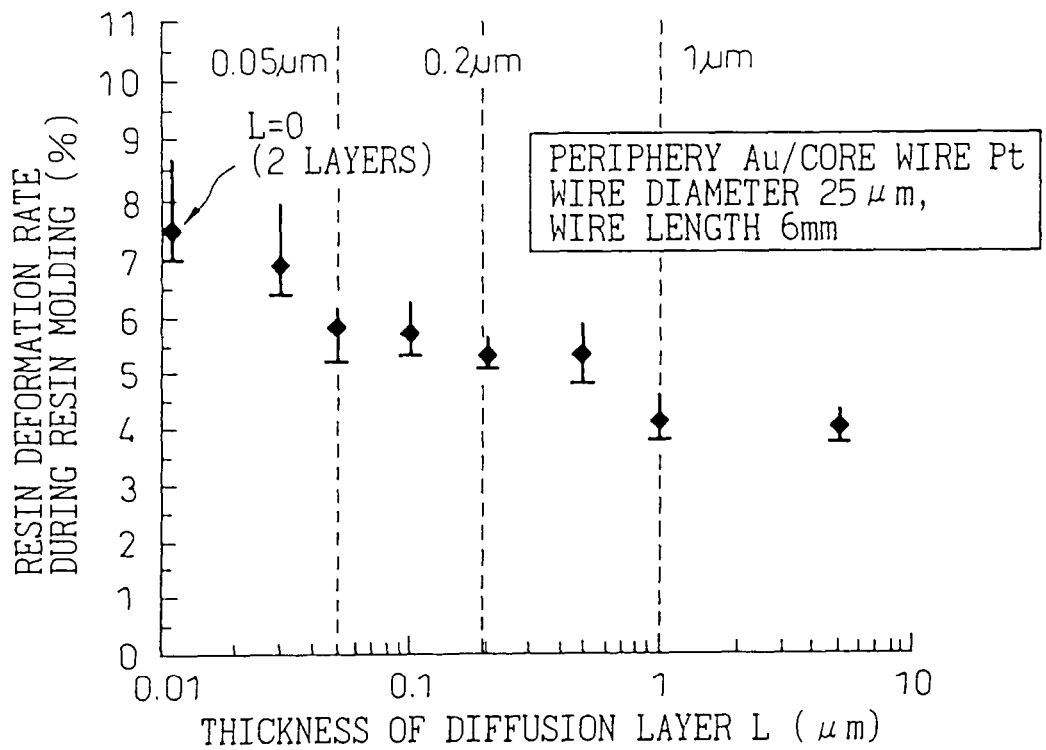
FIG. 13(a) is a graph showing wire deformation during resin molding in the case where an Au—Pt diffusion layer is formed in a wire, 25 μm in diameter, having a periphery of Au and a core wire of Pt.
Figure 13B:
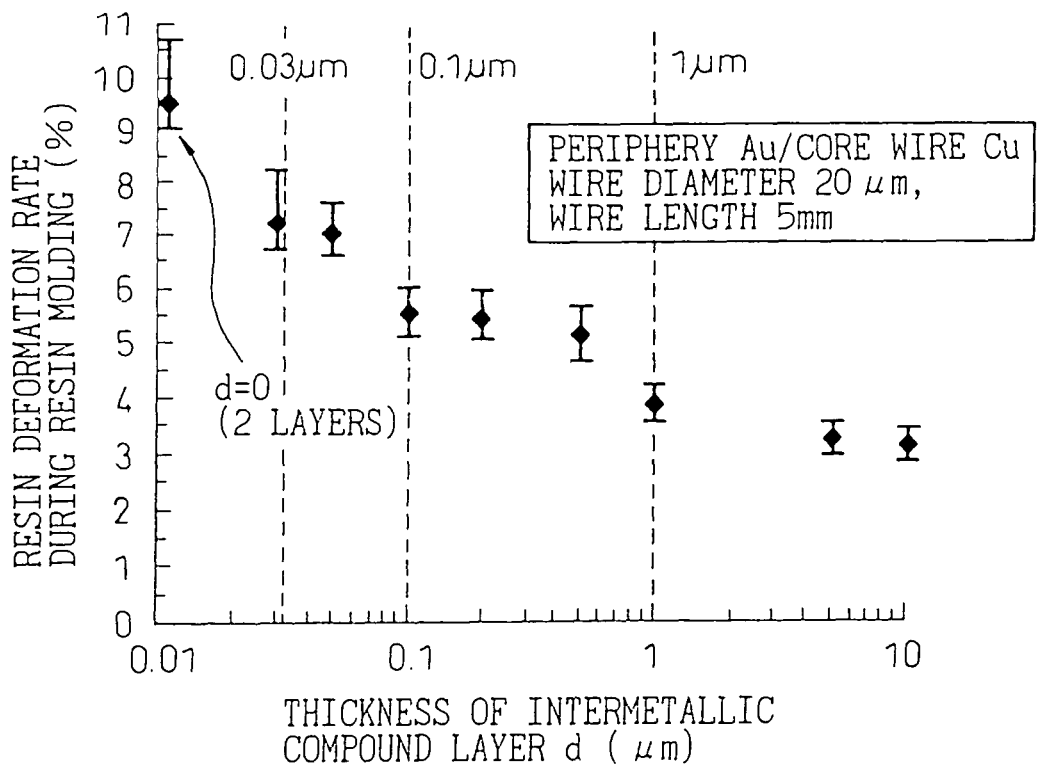
FIG. 13(b) is a graph showing wire deformation during the resin molding in the case where an intermetallic compound layer of an Au—Cu is formed in a wire, 20 μm in diameter, having a periphery of Au and a core wire of Cu.

FIG. 13 shows the relation between the thickness of the diffusion layer or the intermetallic compound layer and the resin deformation. FIG. 13($a$) represents the experimental result of the resin deformation rate in case of a wire 25 μm in diameter and 6 mm in length having a diffusion layer growing at the interface of the periphery of Au and the core wire of Pt, and FIG. 13($b$) represents the experimental result in case of a wire 20 μm in diameter and 5 mm in length having mainly an intermetallic compound layer growing at the interface of the periphery of Au and the core wire of Cu. It is clear that, in both cases, the resin deformation is more suppressed as the thickness of a diffusion layer or an intermetallic compound layer increases. For example, in FIG. 13(a) showing the relation with the diffusion layer thickness L, the effect of suppressing the resin deformation appears when the diffusion layer thickness L is 0.05 μm or more and the effect intensifies when the thickness is 1.0 μm or more. Further, in FIG. 13(b) showing the relation with the intermetallic compound layer thickness d, it is confirmed that the effect of suppressing the resin deformation is substantial when the intermetallic compound layer thickness d is 0.05 μm or more, the effect intensifies when the thickness is 0.1 μm or more, and the effect further intensifies when the thickness is 1.0 μm or more.

Looking at the properties other than the resin deformation, in case of not forming an intermediate layer as seen in a wire having a double layer structure of Table 12 and a wire having a triple layer structure of Table 13, the loop shape varies, the loop stability is inconsistent, and the defects such as peeling off frequently occur also in the wedge bonding compared with a current gold bonding wire but, in case of an intermediate-layered composite bonding wire of Tables 8 to 11, it is confirmed that both of the loop stability and the wedge joint shape are good.

The examples 79 to 82 in Table 10 are the samples produced by forming the outermost surface layer composed of a conductive metal on the surface of each of the intermediate-layered composite bonding wires of the examples 55, 63, 68 and 71 in Tables 8 and 9, and, it is confirmed that, by taking the above measures, the low temperature bondability at 180° C. improves. Further, it is confirmed that the effect of the outermost surface layer on suppressing oxidization is maintained in case of the examples 79 to 82 even though the wires are tested after exposed in the normal atmosphere for 6 months. From this result, it is also confirmed that no specific packaging is required and the aging is not a concern in case of the examples 79 to 82, though it has been believed that the packaging with gas substitution is required for reducing the oxidization at the time of delivery in case of the wires of examples 55, 63, 68, 71, etc.

When comparing the wires having the triple layer structure of a core wire, a middle layer and a periphery, in case of the comparative examples 28 to 30 in Table 13, the wire breakage occurs during wire drawing and thus the yield deteriorates, and, in the evaluation of usability, loop shape varies and the bad shape of the wedge bonding appears but, in case of the examples 83 to 87 shown in Table 11, by having the triple layer structure and forming the intermediate layer at their interface, the wire breakage during processing decreases to the least, the mass productivity improves, the loop shape and the shape of the wedge bonding are also good, moreover the strength, elastic modulus, flexural rigidity, etc. increase, and the effect on suppressing the resin deformation intensifies, and from those improvements, the effects by forming the intermediate layer is confirmed. Further, comparing with the results of the wires not containing middle layers as shown in Tables 8 and 9, the mechanical properties such as flexural rigidity, etc. improve and the resin deformation is suppressed to less than 3% in the examples 83 to 87.

Industrial Applicability

As explained above, the present invention can provide a bonding wire for a semiconductor device: having high strength and high flexural rigidity conforming to the trends of narrower pitches and thinner and longer wires, improved bondability at both the ball and wedge portions, and excellent industrial mass productivity; by forming an intermediate-layered composite structure having a core wire and a periphery consisting of a metal mainly composed of an element common to both and/or an alloy or alloys of said metal, and, between the core wire and the periphery, a diffusion layer or an intermetallic compound layer composed of the elements constituting the core wire and the periphery; or by forming an intermediate-layered composite structure having a core wire and a periphery each of which consists of a different conductive metal from the other, and a diffusion layer or an intermetallic compound layer at the interface between the core wire and the periphery.

EXPLANATION OF REFERENCE NUMERALS:

1: Core wire
2: Periphery
3: Diffusion layer
4: Intermetallic compound layer
5: Intermediate layer (collective denomination of diffusion layer and intermetallic compound layer)
6: Scanning line
7: Outermost surface layer
8: Middle layer
$d_1$: Diameter of core wire
$d_2$: Diameter of bonding wire
r: Thickness of intermediate layer

The invention claimed is:

1. A bonding wire for a semiconductor device characterized by said bonding wire having a longitudinal length and along the entire longitudinal length of said bonding wire, said bonding wire having a periphery comprising a conductive metal, a core wire comprising an alloy mainly composed of said metal and a diffusion layer formed by metal elements from said periphery and said core wire at the interface of the core wire and the periphery.

2. A bonding wire for a semiconductor device characterized by said bonding wire having a longitudinal length and along the entire longitudinal length of said bonding wire, said bonding wire having a core wire comprising a conductive metal, a periphery comprising an alloy mainly composed of said metal and a diffusion layer formed by metal elements from said periphery and said core wire at the interface of the core wire and the periphery.

3. A bonding wire for a semiconductor device characterized by said bonding wire having a longitudinal length and along the entire longitudinal length of said bonding wire, said bonding wire having: a core wire and a periphery comprising different alloys mainly composed of a conductive metal common to both, each of which alloys containing at least an alloy element not contained in the other and/or at least one of the alloy elements in a different concentration from the other; and a diffusion layer and/or an intermetallic compound layer formed by metal elements from said periphery and said core wire at the interface of the core wire and the periphery.

4. A bonding wire for a semiconductor device according to claim 2 or 3, characterized by having, on the outer surface of the periphery, an outermost surface layer comprising the same metal as the main element of the core wire and the periphery.

5. A bonding wire for a semiconductor device according to claim 2 or 3, characterized by having: on the outer surface of the periphery, an outermost surface layer comprising the same metal as the main element of the core wire and the periphery; and a diffusion layer between the periphery and the outermost surface layer.

6. A bonding wire for a semiconductor device according to claim 1, 2 or 3, characterized by having: on the outer surface of the periphery, an outermost surface layer comprising a metal different from the main element of the core wire or the periphery and less susceptible to oxidation than the main element of the periphery; and a diffusion layer and/or an intermetallic compound layer between the periphery and the outermost surface layer.

7. A bonding wire for a semiconductor device characterized by said bonding wire having a longitudinal length and along the entire longitudinal length of said bonding wire, said bonding wire having: a core wire comprising a first conductive metal selected from the group consisting of Pd, Cu, Ni, and Fe or an alloy mainly composed of the first conductive metal; a periphery comprising a second conductive metal different from the first conductive metal of the core wire selected from the group consisting of Au, Pt, Pd, Ag, and Al or an alloy mainly composed of the second conductive metal; and, at the interface of the core wire and the periphery, a diffusion layer formed by metal elements from said periphery and said core wire.

8. A bonding wire for a semiconductor device characterized by said bonding wire having a longitudinal length and along the entire longitudinal length of said bonding wire, said bonding wire having: a core wire comprising a first conductive metal selected from the group consisting of Pd, Cu, Ni, and Fe or an alloy mainly composed of the first conductive metal; a periphery comprising a second conductive metal different from the first conductive metal of the core wire selected from the group consisting of Au, Pt, Pd, Ag, and Al or an alloy mainly composed of the second conductive metal; and, at the interface of the core wire and the periphery, at least one intermetallic compound layer formed by metal elements from said periphery and said core wire.

9. A bonding wire for a semiconductor device characterized by said bonding wire having a longitudinal length and along the entire longitudinal length of said bonding wire, said bonding wire having: a core wire comprising a first conductive metal selected from the group consisting of Pd, Cu, Ni, and Fe or an alloy mainly composed of the first conductive metal; a periphery comprising a second conductive metal different from the first conductive metal of the core wire selected from the group consisting of Au, Pt, Pd, Ag, and Al or an alloy mainly composed of the second conductive metal; and, at the interface of the core wire and the periphery, a diffusion layer and an intermetallic compound layer formed by metal elements from said periphery and said core wire.

10. A bonding wire for a semiconductor device characterized by said bonding wire having a longitudinal length and along the entire longitudinal length of said bonding wire, said bonding wire having: a core wire comprising a first conductive metal or an alloy mainly composed of the first conductive metal; a middle layer comprising a second conductive metal different from the first conductive metal of the core wire or an alloy mainly composed of the second conductive metal; a periphery comprising another conductive metal different from the second conductive metal of the middle layer or an alloy of said conductive metal; and, at the interface of the core wire and the middle layer a diffusion layer and/or an intermetallic compound layer formed by metal elements from the core wire and the middle layer and/or at the interface of the middle layer and the periphery, a diffusion layer and/or an intermetallic compound layer formed by metal elements from the middle layer and the periphery.

11. A bonding wire for a semiconductor device according to claim 7, 8, 9 or 10, characterized by having, on the outer surface of the periphery, an outermost surface layer comprising a conductive metal different from the main component metal of the periphery or an alloy mainly composed of said metal.

12. A method to produce a bonding wire for a semiconductor device according to any one of claims 1,2,3,7,8,9 and 10, characterized by subjecting the bonding wire to a diffusion heat treatment to form the diffusion layer and/or the intermetallic compound layer at the interface between the core wire and the periphery.

13. A method to produce a bonding wire for a semiconductor device according to any one of claims 1,2,3,7,8,9 and 10, characterized by subjecting the bonding wire to a diffusion heat treatment to form the diffusion layer and/or the intermetallic compound layer at the interface between the core wire and the periphery and then drawing the bonding wire.

14. The bonding wire of any of claims 1-3 and 7-10, wherein said bonding wire has a diameter of 50 μm or less.

15. The bonding wire of any of claims 1-3 and 7-10, wherein said bonding wire has a diameter of 30 μm or less.

16. The bonding wire of any of claims 1-3 and 7-10, wherein said bonding wire has a diameter of 20 μm or less.

17. The bonding wire of any of claims 1-3 and 7-10, wherein said bonding wire has a diameter of 18 μm or less.

18. The bonding wire of any of claims 1-3 and 7-10, wherein said bonding wire has a diameter of 20-30 μm.

19. The bonding wire of any of claims 1-2 and 7, wherein said bonding wire consists essentially of (i) said core wire, said periphery, and said diffusion layer; and (ii) an optional outmost surface layer on the outer surface of the periphery.

20. The bonding wire of claim 3, wherein said bonding wire consists essentially of (i) said core wire, said periphery, and said diffusion layer and/or intermetallic compound layer; and (ii) an optional outmost surface layer on the outer surface of the periphery.

21. The bonding wire of claim 8, wherein said bonding wire consists essentially of (i) said core wire, said periphery, and said intermetallic compound layer; and (ii) an optional outmost surface layer on the outer surface of the periphery.

22. The bonding wire of claim 9, wherein said bonding wire consists essentially of (i) said core wire, said periphery, and said diffusion layer and intermetallic compound layer; and (ii) an optional outmost surface layer on the outer surface of the periphery.

23. The bonding wire of claim 10, wherein said bonding wire consists essentially of (i) said core wire, said middle layer, said periphery, said diffusion layer and/or intermetallic compound layer at the interface of said core wire and said middle layer, and said diffusion layer and/or intermetallic compound layer at the interface of said middle layer and said periphery; and (ii) an optional outmost surface layer on the outer surface of the periphery.

24. The bonding wire of any of claims 1-3 and 10, wherein said core wire comprising a metal element selected from the group consisting of Au, Pt, Pd, Cu, Ag, and Al; and wherein said periphery comprising a metal element selected from the group consisting of Au, Pt, Pd, Cu, Ag, and Al.

25. A bonding wire for a semiconductor device characterized by said bonding wire having a longitudinal length and along the entire longitudinal length of said bonding wire, said bonding wire having: a core wire comprising Cu or an alloy mainly composed of Cu; a periphery comprising Pd or an alloy mainly composed of Pd; and, at the interface of the core wire and the periphery, a diffusion layer formed by metal elements from said periphery and said core wire.

26. A bonding wire for a semiconductor device, comprising (i) a core wire, said core wire comprising a first conductive metal or an alloy comprising said first conductive metal; (ii) a periphery, said periphery comprising a second conductive metal or an alloy comprising said second conductive metal, wherein said first conductive metal and said second conductive metal are the same; and (iii) an intermediate layer between said core wire and said periphery along the entire length of said bonding wire; wherein said bonding wire has a diameter of 50 µm or less.

27. A bonding wire for a semiconductor device, comprising (i) a core wire, said core wire comprising a first conductive metal selected from the group consisting of Pd, Cu, Ni, and Fe or an alloy comprising said first conductive metal; (ii) a periphery, said periphery comprising a second conductive metal selected from the group consisting of Au, Pt, Pd, Ag, and Al or an alloy comprising said second conductive metal, wherein said first conductive metal and said second conductive metal are different; and (iii) an intermediate layer between said core wire and said periphery along the entire length of said bonding wire; wherein said bonding wire has a diameter of 50 µm or less.

28. The bonding wire of claim 26 or 27, wherein said intermediate layer comprises a diffusion layer and/or an intermetallic compound layer formed at the interface of said core wire and said periphery.

29. The bonding wire of claim 26 or 27, further comprising, on the outer surface of the periphery, an outermost surface layer.

30. The bonding wire of claim 26 or 27, wherein said bonding wire has a diameter of 30 µm or less.

31. The bonding wire of claim 26 or 27, wherein said bonding wire has a diameter of 20 µm or less.

32. The bonding wire of claim 26 or 27, wherein said bonding wire has a diameter of 18 µm or less.

33. The bonding wire of claim 26 or 27, wherein said bonding wire has a diameter of 20-30 µm.

34. A bonding wire for a semiconductor device, comprising (i) a core wire, said core wire comprising a first conductive metal or an alloy comprising said first conductive metal; (ii) a periphery, said periphery comprising a second conductive metal or an alloy comprising said second conductive metal, wherein said first conductive metal and said second conductive metal are the same or different; (iii) an intermediate layer between said core wire and said periphery; and (iv) a middle layer between said core and said periphery, wherein said middle layer comprises a third conductive metal or an alloy comprising said third conductive metal, wherein said third conductive metal is different from said first conductive metal and said second conductive metal, and wherein said intermediate layer comprises a diffusion layer and/or an intermetallic compound layer formed at (a) the interface of said core wire and said middle layer by metal elements from said core wire and said middle layer or (b) the interface of said middle layer and said periphery by metal elements from the middle layer and the periphery, wherein said bonding wire has a diameter of 50 µm or less.

35. The bonding wire of claim 34, further comprising an additional diffusion layer and/or an intermetallic compound layer formed at the interface of said core wire and said middle layer by metal elements from said core wire and said middle layer if (a) or at the interface of said middle layer and said periphery by metal elements from the middle layer and the periphery if (b).

* * * * *